(12) United States Patent
Kurumada et al.

(10) Patent No.: US 7,451,363 B2
(45) Date of Patent: Nov. 11, 2008

(54) SEMICONDUCTOR INTEGRATED CIRCUIT INCLUDING MEMORY MACRO

(75) Inventors: Marefusa Kurumada, Kyoto (JP); Hironori Akamatsu, Osaka (JP)

(73) Assignee: Panasonic Corporation, Osaka (JP)

( * ) Notice: Subject to any disclaimer, the term of this patent is extended or adjusted under 35 U.S.C. 154(b) by 638 days.

(21) Appl. No.: 10/300,227

(22) Filed: Nov. 19, 2002

(65) Prior Publication Data
US 2003/0106001 A1 Jun. 5, 2003

(30) Foreign Application Priority Data
Nov. 20, 2001 (JP) ............................. 2001-354432

(51) Int. Cl.
*G11C 29/00* (2006.01)
(52) U.S. Cl. ........................ 714/710; 714/711; 714/718
(58) Field of Classification Search ................. 714/710, 714/711, 718, 724; 365/200, 201
See application file for complete search history.

(56) References Cited

U.S. PATENT DOCUMENTS

| | | | | |
|---|---|---|---|---|
| 4,660,179 A | * | 4/1987 | Aoyama | 365/200 |
| 5,257,229 A | * | 10/1993 | McClure et al. | 365/200 |
| 5,297,085 A | * | 3/1994 | Choi et al. | 365/200 |
| 5,416,740 A | | 5/1995 | Fujita et al. | |
| 5,491,664 A | * | 2/1996 | Phelan | 365/200 |
| 5,699,307 A | * | 12/1997 | Greason et al. | 365/200 |
| 5,870,341 A | * | 2/1999 | Lin et al. | 365/200 |
| 5,946,246 A | * | 8/1999 | Jun et al. | 365/201 |
| 6,066,886 A | * | 5/2000 | Egawa | 257/620 |
| 6,430,094 B1 | * | 8/2002 | Waller | 365/201 |
| 6,445,627 B1 | * | 9/2002 | Nakahara et al. | 365/200 |
| 6,639,855 B2 | * | 10/2003 | Furumochi | 365/200 |
| 2001/0014030 A1 | | 8/2001 | Shimizu et al. | |

OTHER PUBLICATIONS

Sakurai, T. et al. "A low power 46 ns 256 kbit CMOS static RAM with dynamic double word line". IEEE Journal of Solid-State Circuits. vol. 19, Issue 5, Oct. 1984 pp. 578-585.*

* cited by examiner

*Primary Examiner*—Jacques Louis-Jacques
*Assistant Examiner*—Steve Nguyen
(74) *Attorney, Agent, or Firm*—Hamre, Schumann, Mueller & Larson, P.C.

(57) ABSTRACT

The present invention provides a semiconductor integrated circuit having area efficiency and repair efficiency improved by sharing a redundant memory macro among a plurality of SRAM macros. Each of the plurality of memory macros includes a memory cell array connected to word lines and bit lines and a redundant circuit that replaces a defective bit line of the memory cell array to a normal bit line and a redundant bit line and outputs defect information to a redundant signal line. The redundant memory macro includes a redundant memory cell array connected to redundant word lines and the redundant bit line, and a first word line connection circuit that connects a word line corresponding to a memory macro to be repaired and disconnects a word line corresponding to a normal memory macro from the redundant word line.

18 Claims, 33 Drawing Sheets

SEMICONDUCTOR INTEGRATED CIRCUIT INCLUDING MEMORY MACRO

BACKGROUND OF THE INVENTION

1. Field of the Invention

The present invention relates to a semiconductor integrated circuit on which memory macros are mounted. In particular, the present invention relates to a technique for improving the yield of semiconductor integrated circuits and reducing the area of a fuse part by letting a plurality of memory macros share a memory macro for repair when a large number of memory macros are mounted on a semiconductor integrated circuit.

2. Description of the Related Art

In recent years, it is common to form memories into a macro cell and mount the macro cell on a semiconductor integrated circuit such as a system LSI. When mounting memory macros, a memory cell for redundancy repair is stored inside a memory macro beforehand so that defects in a production stage are repaired at the time of probe inspection in order to improve the production yield of system LSIs.

When a memory cell for redundancy repair is stored inside a memory macro so as to perform redundancy repair, the area efficiency is poor, and a large number of redundancy repair cells are not used for repair, so that the repair efficiency is poor. Moreover, fuse parts for redundancy repair hinder wiring so that the wiring becomes complicated. When redundancy repair is introduced into a large number of mounted SRAM macros, the above-described problem is serious. Therefore, the number of circuits that can be produced per wafer is reduced, thus leading to a high production cost.

SUMMARY OF THE INVENTION

Therefore, with the foregoing in mind, it is an object of the present invention to provide a semiconductor integrated circuit that improves area efficiency and repair efficiency by letting a plurality of SRAM macros share a redundant memory macro and reduces the area of fuse parts by letting the plurality of SRAM macros also share a redundant fuse.

A first semiconductor integrated circuit of the present invention includes a plurality of memory macros and a redundant memory macro for repairing the plurality of memory macros. Each of the plurality of memory macros includes a memory cell array connected to word lines (WL1 to WL32) and bit lines (BLA12 to BLA64); and a first redundant circuit that has means (e.g. fuses, transistors, inverters) for replacing a defective bit line of the memory cell array by an adjacent normal bit line or a redundant bit line (BLA 65) and outputs defect information to a redundant signal line (RA). The redundant memory macro includes a redundant memory cell array connected to redundant word lines (WLA1 to WLA32) and the redundant bit line (BLA65); and a word line connection circuit that connects word lines corresponding to a memory macro to be repaired to the redundant word lines and disconnects word lines corresponding to a normal memory macro from the redundant word lines, in response to the defect information of the redundant signal line.

This configuration makes it possible to disconnect the redundant word lines and the redundant bit lines completely from the word lines and the bit lines of a normal memory macro, respectively, so that the redundant memory macro can be shared among a plurality of memory macros, regardless of whether the operation of the word lines or the bit lines is the same or different in the plurality of memory macros. Thus, the area efficiency and the repair efficiency can be improved.

A second semiconductor integrated circuit of the present invention includes a plurality of memory macros and a redundant memory macro for repairing the plurality of memory macros. Each of the plurality of memory macros includes a memory cell array connected to word lines (WL1 to WL32) and bit lines (BLA1 to BLA64); and a second redundant circuit that has means (fuses, transistors, and inverters) for replacing a defective bit line of the memory cell array by an adjacent normal bit line or a redundant bit line (BLA0) and outputs defect information to a redundant signal line (RA). The redundant memory macro includes a redundant memory cell array connected to redundant word lines (WLA1 to WLA32) and the redundant bit line (BLA0); and a second word line connection circuit that transmits a signal of a word line corresponding to a memory macro to be repaired to a corresponding one of the redundant word lines with timing adjustment via a gate circuit (NAND circuit), based on the defect information of the redundant signal line, so as to block a signal of a word line corresponding to a normal memory macro with the gate circuit (NAND circuit).

According to this configuration, in addition to the advantage of the first semiconductor integrated circuit, the second word line connection circuit of the redundant memory macro makes it possible to eliminate a connection delay of the word lines and the redundant word lines due to the on/off time of switching transistors with respect to a redundant signal in accordance with a memory macro to be repaired, and to adjust the operation timing (shape waveform or the like) of signals of the word lines transmitted to the redundant word line.

A third semiconductor integrated circuit of the present invention includes a plurality of memory macros and a redundant memory macro for repairing the plurality of memory macros. Each of the plurality of memory macros includes a memory cell array connected to word lines (WL1 to WL32 and bit lines (BLA1 to BLA64); a column decoder part that has a plurality of column decoders, each of which is connected to the memory cell array for every predetermined number of bit lines, and selects a specific bit line of the predetermined number of bit lines based on a signal of an internal column address line (CADR) generated from an externally input address signal and links input/output data to the selected bit line; and a third redundant/input and output circuit that couples input data to the column decoder part as the input/output data, based on a state of a write signal line (IR) or couples output data to the column decoder part as the input/output data, based on a state of a read-out signal line (OR), has means (e.g. fuses, transistors, and inverters) for replacing an input/output data line corresponding to a defective bit line of the memory cell array by an adjacent input/output data line or a redundant input/output data line, and outputs defect information to a redundant signal line (RA). The redundant memory macro includes a redundant memory cell array connected to redundant word lines (WLA1 to 32) and the predetermined number of redundant bit lines (BLA65 to BLA68); a column decoder that selects a specific redundant bit line of the predetermined number of redundant bit lines based on a signal of a redundant column address line (COLRA, COLRB), and links input or output data of the redundant input/output data line to the selected redundant bit line based on a state of a redundant write signal line (WRR) and a redundant read-out signal line (RER); and a command connection circuit that connects an internal column address line, a write signal line, and a read-out signal line corresponding to a memory macro to be repaired to the redundant column address line, the redundant write signal line and the redundant read-out signal line, respectively, and disconnects an internal column address line, a write signal line, and a read-out signal line corresponding to a normal memory macro from the redundant column address line, the redundant write signal line and the redundant read-out signal line, respectively, in response to the defect information of the redundant signal line; and a first word line connection circuit that connects word lines corresponding to the memory macro to be repaired to the redundant word lines and disconnects word lines corresponding to the normal memory macro from the redundant word line, in response to the defect information of the redundant signal line.

This configuration makes it possible to disconnect the redundant word lines, the redundant bit lines, and further the redundant column address lines, the redundant write signal lines, the redundant read-out signal lines, and the redundant input/output data lines completely from the word lines, the bit lines, the internal column address lines, the write signal lines, the read-out signal lines, and the input/output data lines of the normal memory macro, so that the redundant memory macro can be shared by a plurality of memory macros, although the operation timings of signals, in addition to those of the word lines and the bit lines, are different. Thus, the area efficiency and the repair efficiency can be improved.

A fourth semiconductor integrated circuit of the present invention includes a plurality of memory macros and a redundant memory macro for repairing the plurality of memory macros. Each of the plurality of memory macros includes a memory cell array connected to word lines (WL1 to WL32) and bit lines (BLA1 to BLA64); and a second redundant circuit that has means (e.g. fuses, transistors, and inverters) for replacing a defective bit line of the memory cell array by an adjacent normal bit line or a redundant bit line (BLA0) and outputs defect information to a redundant signal line (RA). The redundant memory macro includes a redundant memory cell array connected to redundant word lines (WLA1 to WLA32) and the redundant bit line (BLA0); a row decoder for selecting a specific redundant word line based on a signal of a redundant row address line; a peripheral circuit for generating a signal of the redundant row address line in response to a redundant address signal and a redundant command signal; and an external signal line connection circuit that outputs an externally input address signal and command signal corresponding to a memory macro to be repaired to the peripheral circuit with timing adjustment via a gate circuit (NAND circuit), based on the defect information of the redundant signal line, so as to block an externally input address signal and command signal corresponding to a normal memory macro with the gate circuit (NAND circuit).

This configuration makes it possible to reduce the number of lines (word lines) to be connected and control the redundant word line or the redundant bit lines by the redundant memory macro alone, so that the redundant memory macro can be shared among a plurality of memory macros, regardless whether the operation of the word lines or the bit lines is the same or different. Thus, the area efficiency and the repair efficiency can be improved. Furthermore, the external signal line connection circuit in the redundant memory macro makes it possible to eliminate a connection delay of the word lines and the redundant word lines due to the on/off time of switching transistors with respect to a redundant signal in accordance with a memory macro to be repaired and to adjust the operation timing (waveform shaping or the like) of signals of the word lines transmitted to the redundant word line.

In the first to fourth semiconductor integrated circuits, the plurality of memory macros have different operation timing from each other.

In the first to fourth semiconductor integrated circuits, the plurality of memory macros include both a synchronous memory macro and an asynchronous memory macro.

In the first to fourth semiconductor integrated circuits, each of the plurality of memory macros is connected to the word lines and includes a row decoder for selecting either one of the word lines in response to an internal row address signal generated from an externally input address signal.

In the first to fourth semiconductor integrated circuits, the redundant memory macro repairs either one of the plurality of memory macros or repairs some of the plurality of memory macros together.

It is preferable in the first to third semiconductor integrated circuits that the plurality of memory macros have a different number of word lines from each other, and a word line that is not used in the redundant memory macro is connected to a ground potential. Thus, even if the number of the word lines is different, the redundant memory macro can be shared among a plurality of memory macros.

It is preferable in the first to third semiconductor integrated circuits that the plurality of memory macros have a different number of word lines from each other, a word line that is not used in the redundant memory macro is connected to a ground potential, and the redundant memory macro includes a redundant bit line connection circuit that connects or disconnects a redundant bit line connected to some memory macros which the word lines of the redundant memory macro are divided for and assigned to, based on the defect information of the redundant signal line so as to repair the some memory macros together.

This configuration makes it possible to share the redundant memory macro among a plurality of memory macros, even if the number of the word lines is different and one or a plurality of the plurality of memory macros can be repaired.

It is preferable in the first to fourth semiconductor integrated circuits that the plurality of memory macros have a different number of bit lines in a redundancy unit, the redundant memory macro has the same number of redundant bit lines as that of the memory macro having the largest number of bit lines in a redundancy unit of the plurality of memory macros, and the number of redundant bit lines to be connected is changed depending on the memory macro.

This configuration makes it possible to share the redundant memory macro among a plurality of memory macros, even if the number of the bit lines to be redundant is different, and one of the plurality of memory macros can be repaired.

It is preferable in the first to third semiconductor integrated circuits that the redundant memory macro includes a second word line connection circuit that disconnects or connects the redundant word lines and divides or integrates the redundant memory cell array based on the defect information of the redundant signal line so as to repair all the memory macros that are connected.

This configuration makes it possible to divide the redundant word lines, so that the redundant memory macro can be shared among a plurality of memory macros, regardless of whether the operation of the word lines or the bit lines is the same or different. Thus, all of the plurality of memory macros can be repaired.

A fifth semiconductor integrated circuit of the present invention includes a plurality of memory macros and a redundant memory macro for repairing one of the plurality of memory macros. Each of the plurality of memory macros includes a memory cell array connected to word lines (WL1 to WL32) and bit lines (BLA1 to BLA64); and a fourth redundant circuit that switches from a defective bit line of the memory cell array to an adjacent normal bit line or a redundant bit line (BLA65) and outputs defect information to a redundant signal line (RA) in accordance with a redundancy control signal (SA1 to SA64, SB1 to SB64) from the redundant memory macro. The redundant memory macro includes a redundant memory cell array connected to redundant word lines (WLA1 to WLA32) and the redundant bit line (BLA65), and a first word line connection circuit that connects word lines corresponding to a memory macro to be repaired to the redundant word lines and disconnects word lines corresponding to a normal memory macro from the redundant word lines, in response to the defect information of the redundant signal line. A redundant control circuit includes a first fuse (macro select fuse) that is provided in accordance with the number of the plurality of memory macros and is to be broken corresponding to a defective memory macro and a second fuse (redundant fuse) that is to be broken corresponding to a defective bit line of the defective memory macro, and outputs information on breakage of the first and second fuses as the redundancy control signal.

In addition to the advantages of the first semiconductor integrated circuit, this configuration makes it possible to share fuses for redundancy repair among a plurality of memory macros. Thus, the number of fuses can be reduced and the area efficiency can be improved.

A sixth semiconductor integrated circuit of the present invention includes a plurality of memory macros and a redundant memory macro for repairing one of the plurality of memory macros. Each of the plurality of memory macros includes a memory cell array connected to word lines (WL1 to WL32) and bit lines (BLA1 to BLA64); and a fourth redundant circuit that switches from a defective bit line of the memory cell array to an adjacent normal bit line or a redundant bit line (BLA65) and outputs defect information to a redundant signal line (RA) in accordance with a redundancy control signal (SA1 to SA64, SB1 to SB64) from the redundant memory macro. The redundant memory macro includes a redundant memory cell array connected to redundant word lines (WLA1 to WLA32) and the redundant bit line (BLA65), and a first word line connection circuit that connects word lines corresponding to a memory macro to be repaired to the redundant word lines and disconnects word lines corresponding to a normal memory macro from the redundant word lines, in response to the defect information of the redundant signal line, and a redundant control circuit that is provided commonly to at least two of the plurality of memory macros and includes a first fuse (macro select fuse) that is to be broken or unbroken corresponding to a defective memory macro and a second fuse (redundant fuse) that is to be broken corresponding to a defective bit line of the defective memory macro, and outputs information on breakage of the first and second fuses as the redundancy control signal.

This configuration makes it possible to share fuses for redundancy repair among a plurality of memory macros and to reduce the number of the macro select fuses. Thus, the number of fuses can be reduced and the area efficiency can be improved.

A seventh semiconductor integrated circuit of the present invention includes a plurality of memory macros having different configurations and a redundant memory macro for repairing one of the plurality of memory macros. Each of the plurality of memory macros includes a memory cell array connected to word lines (WL1 to WL32) and bit lines (BLA1 to BLA64, BLA1 to BLA65); and a fourth redundant circuit that switches from a defective bit line of the memory cell array to an adjacent normal bit line or a redundant bit line (BLA65, BLA 66) and outputs defect information to a redundant signal line (RA) in accordance with a redundancy control signal (SA1 to SA64, SB1 to SB64) from the redundant memory macro. The redundant memory macro includes a redundant memory cell array connected to redundant word lines (WLA1 to WLA32) and the redundant bit line (BLA65, BLA 66), a first word line connection circuit that connects word lines corresponding to a memory macro to be repaired to the redundant word lines and disconnects word lines corresponding to a normal memory macro from the redundant word lines, in response to the defect information of the redundant signal line. A redundant control circuit includes a first fuse (macro select fuse) that is provided in accordance with the number of the plurality of memory macros and is to be broken corresponding to a defective memory macro and a second fuse (redundant fuse) that is provided in accordance with the largest number of bit lines of the plurality of memory macros and is to be broken corresponding to a defective bit line of the defective memory macro, and outputs information on breakage of the first and second fuses as the redundancy control signal.

This configuration makes it possible to share fuses for redundancy repair among a plurality of memory macros having a different number of bit lines. Thus, the number of fuses can be reduced and the area efficiency can be improved.

An eighth semiconductor integrated circuit of the present invention includes a plurality of memory macros having different configurations and a redundant memory macro for repairing one or some of the plurality of memory macros. Each of the plurality of memory macros includes a memory cell array connected to word lines (WL1 to WL32) and bit lines (BLA1 to BLA64, BLA1 to BLA58, BLA1 to BLA4), and a fourth redundant circuit that switches from a defective bit line of the memory cell array to an adjacent normal bit line or a redundant bit line (BLA65, BLA59, BLA5) and outputs defect information to a redundant signal line (RA) in accordance with a redundancy control signal (SF1 to SF64, SH1 to SH58, SI1 to SI4) from the redundant memory macro. The redundant memory macro includes a redundant memory cell array connected to redundant word lines (WLA1 to WLA32) and the redundant bit line, and a first word line connection circuit that connects word lines corresponding to a memory macro to be repaired to the redundant word lines and disconnects word lines corresponding to a normal memory macro from the redundant word lines, in response to the defect information of the redundant signal line. A redundant control circuit includes a first fuse (macro select fuse) that is provided in accordance with the number of the plurality of memory macros and is to be broken corresponding to a defective memory macro, a second fuse (redundant fuse) that is provided in accordance with the largest number of bit lines of the plurality of memory macros and is to be broken corresponding to a defective bit line of the defective memory macro, and a fuse connection circuit that divides or connects a configuration of the second fuse in accordance with the configuration of the memory macro to be repaired, and outputs information on breakage of the first and second fuses as the redundancy control signal.

This configuration makes it possible to share fuses for redundancy repair among a plurality of memory macros having different configurations and to repair a plurality of the plurality of memory macros having different configurations. Thus, the number of fuses can be reduced and the area efficiency can be improved.

DESCRIPTION OF THE PREFERRED EMBODIMENTS

Figure 1:
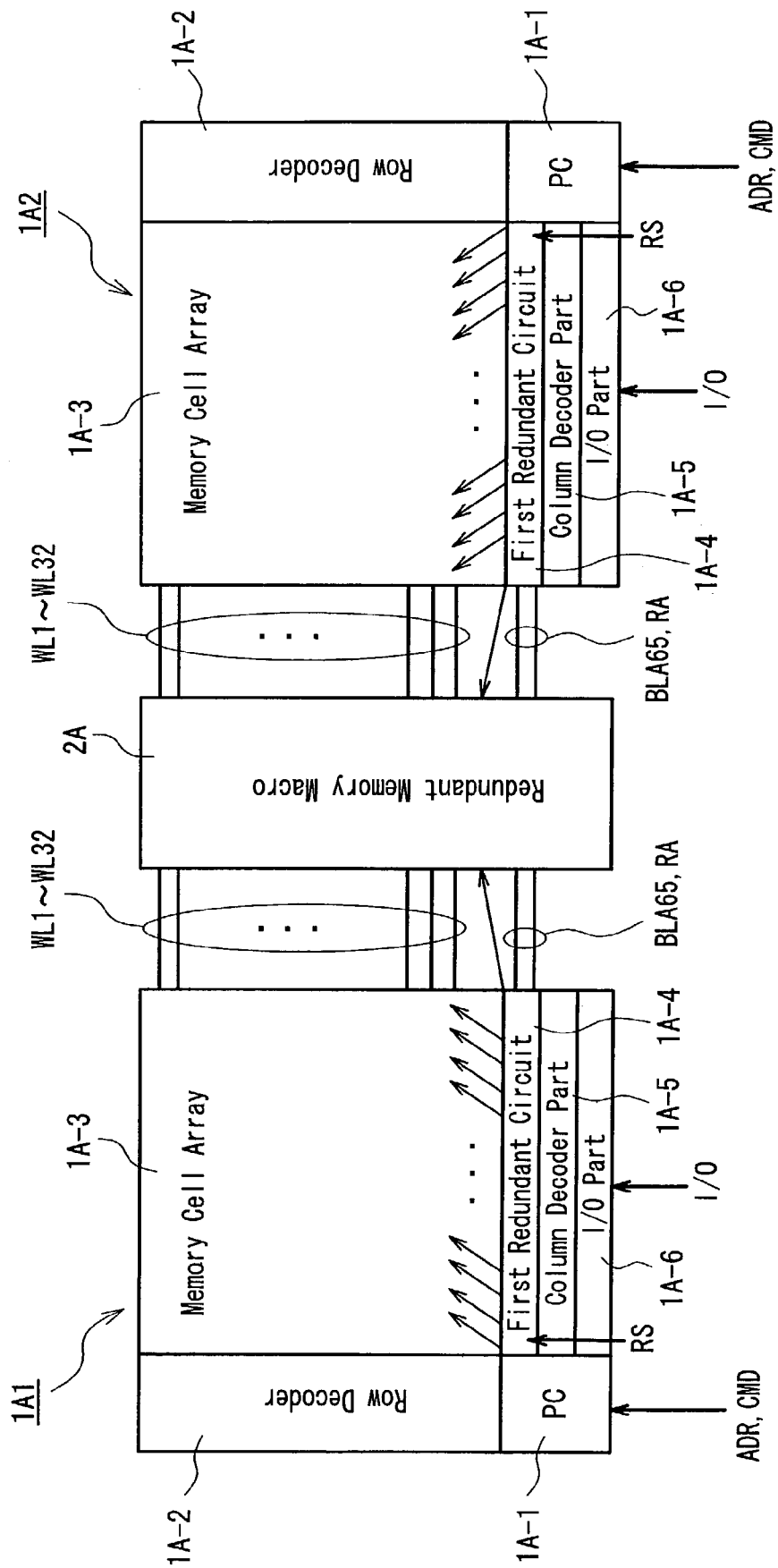
FIG. 1 is a block diagram showing an example of a configuration of a semiconductor integrated circuit according to Embodiment 1 of the present invention.

Hereinafter, embodiments of the present invention will be described more specifically with reference to the accompanying drawings. The same elements bear the same reference numerals in all the drawings, and duplicate description thereof is omitted.

Embodiment 1

FIG. 1 is a block diagram showing an example of a configuration of a semiconductor integrated circuit according to Embodiment 1 of the present invention.

In FIG. 1, a semiconductor integrated circuit of this embodiment includes a plurality of memory macros 1A1 and 1A2 and a redundant memory macro 2A for repairing the plurality of memory macros 1A1 and 1A2. In this embodiment, an example in which two memory macros are mounted is described, but the same is true for the cases in which three or more memory macros are mounted. A redundancy repair of this configuration may be present in a plurality of sites in a semiconductor integrated circuit. The numbers of word lines or bit lines and data input/output lines in the plurality of memory macros 1A1 and 1A2 and the redundant memory macro 2A are not limited to those in this embodiment.

The plurality of memory macros 1A1 and 1A2 are connected to an external circuit by address signal lines ADR, command signal lines CMD, data input/output lines I/O, and reset signal lines RS. The redundant memory macro 2A is connected to the plurality of memory macros 1A1 and 1A2 by respective word lines WL1 to WL32, redundant bit lines BLA65 and redundant signal lines RA.

Figure 2:
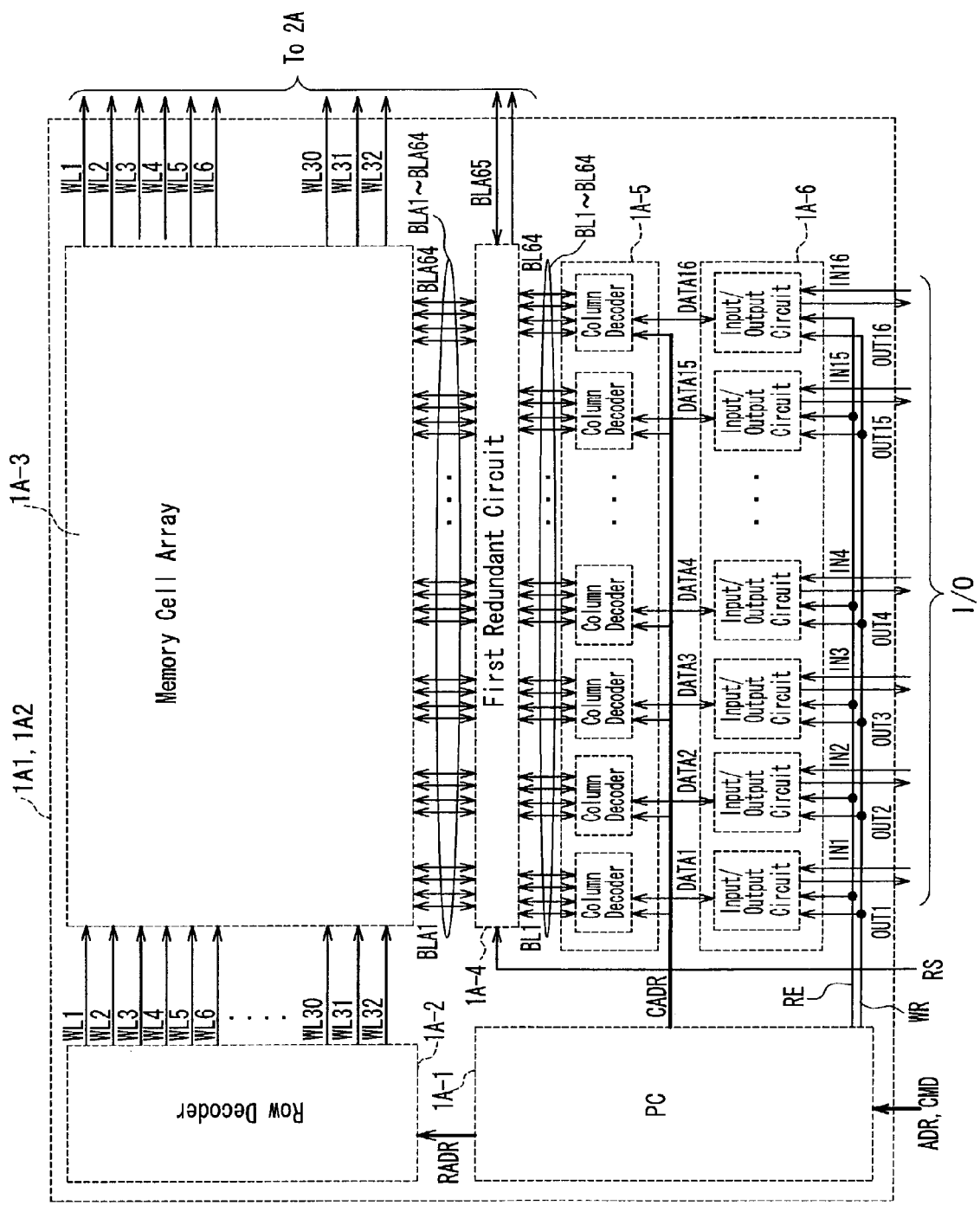
FIG. 2 is a block diagram showing the internal configuration of memory macros 1A1 and 1A2 of FIG. 1.

FIG. 2 is a block diagram showing the internal configuration of the plurality of memory macros 1A1 and 1A2. In FIG. 2, a peripheral circuit (PC) 1A-1 is connected to an external circuit by the address signal line ADR and the command signal line CMD. Input/output circuits of the I/O part 1A-6 are connected to an external circuit by the data input/output signal lines IN1 to IN16 and OUT1 to OUT16. Furthermore, a first redundant circuit 1A-4 is connected to an external circuit by the reset signal line RS. The peripheral circuit 1A-1 is connected to a row decoder 1A-2 by an internal row address signal line RADR, and the row decoder 1A-2 is connected to a memory cell array 1A-3 by the word lines WL1 to WL32. The peripheral circuit 1A-1 is connected to the input/output circuits of the I/O part 1A-6 by a read-out signal line RE and a write signal line WR. Furthermore, the peripheral circuit 1A-1 is connected to column decoders in a column decoder part 1A-5 by an internal column address signal line CADR, and the column decoders are connected to the input/output circuits by data lines DATA1 to DATA16 and are connected to the first redundant circuit 1A-4 by bit lines BL1 to BL64.

The first redundant circuit 1A-4 is connected to the memory cell array 1A-3 by second bit lines BLA1 to BLA64 and is connected to the external redundant memory macro 2A by the redundant bit line BLA65 and the redundant signal line RA. The memory cell array 1A-3 is connected to the external redundant memory macro 2A by the word lines WL1 to WL32.

Figure 3:
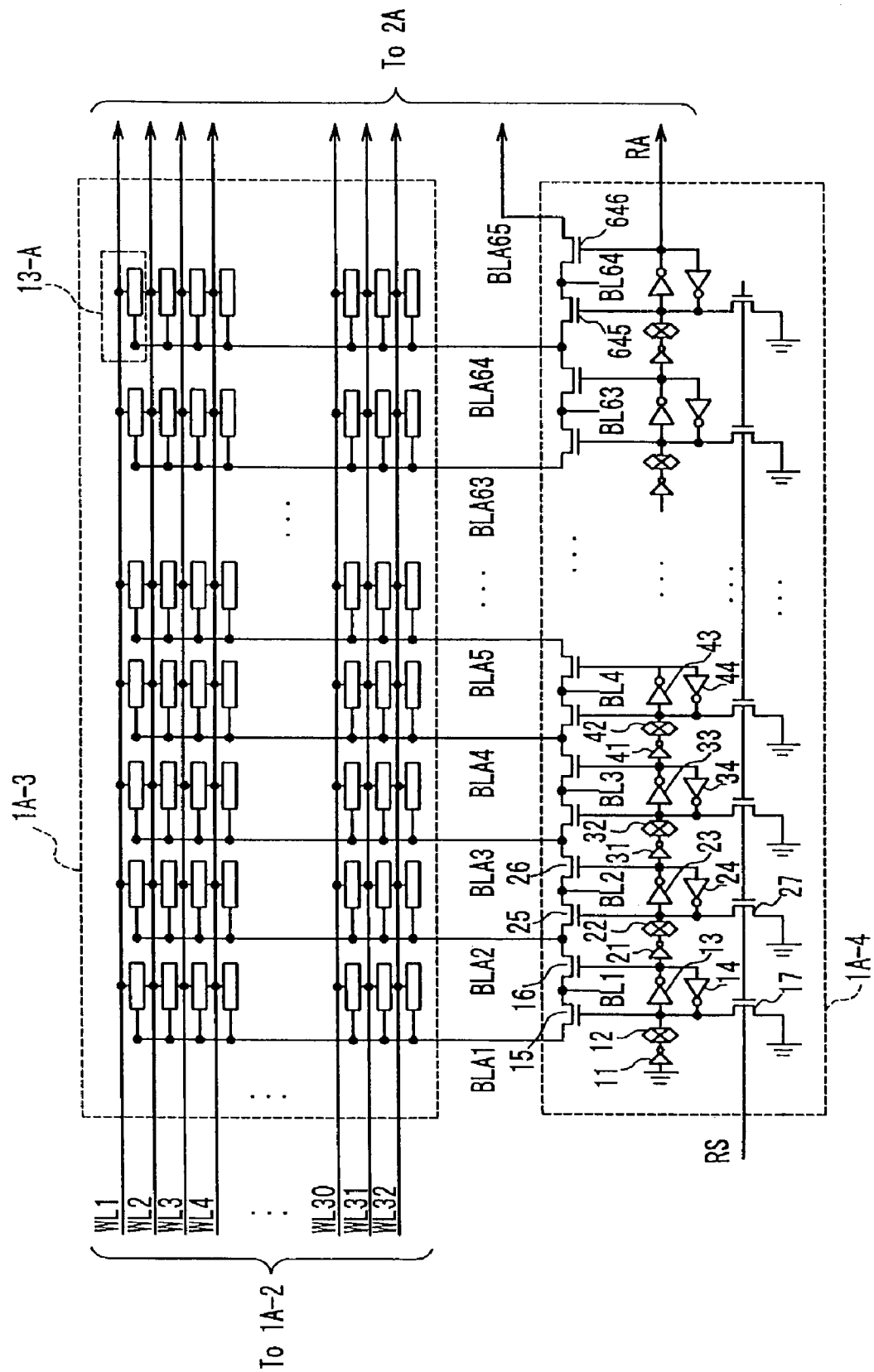
FIG. 3 is a circuit diagram showing a partial configuration of a memory cell array 1A-3 and a first redundant circuit 1A-4 of FIG. 2.

FIG. 3 is a circuit diagram showing a partial configuration of the memory cell array 1A-3 and a partial configuration of the first redundant circuit 1A-4. In FIG. 3, the memory cell array 1A-3 includes 64 second bit lines BLA1 to BLA64 and 32 word lines WL1 to WL32, and a plurality of memory cells 13-A that are arranged in a matrix. Each memory cell 13-A is connected to one of the 64 second bit lines BLA1 to BLA64 and one of the 32 word lines WL1 to WL32 that make the memory cell 13-A accessible.

Figure 4:
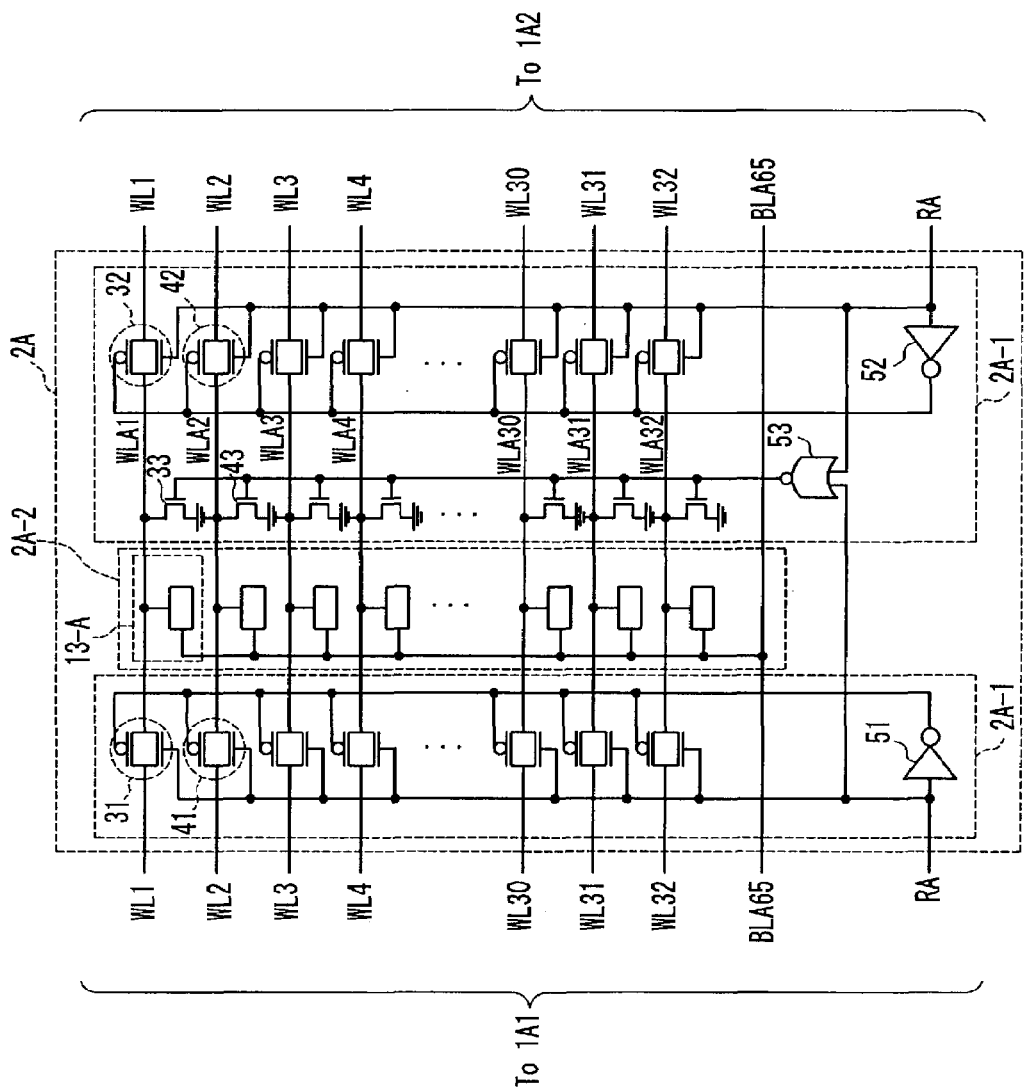
FIG. 4 is a circuit diagram showing a partial configuration of a redundant memory macro 2A of FIG. 1.

FIG. 4 is a circuit diagram showing a partial configuration of the redundant memory macro 2A. In FIG. 4, the redundant memory macro 2A includes first word line connection circuits 2A-1 and a redundant memory cell array 2A-2. The first word line connection circuits 2A-1 are connected to the memory macros 1A1 and 1A2 by the word lines WL1 to WL32 and are connected to the redundant memory cell array 2A-2 by redundant word lines WLA1 to WLA32. The redundant memory cell array 2A-2 is connected to the redundant circuit 1A-4 in the memory macros 1A1 and 1A2 by the redundant bit lines BLA65 and the redundant signal lines RA.

Hereinafter, the operation of a semiconductor integrated circuit having such a configuration will be described.

First, the case where there is no defect in the plurality of memory macros 1A1 and 1A2 and the redundant memory macro 2A is not used will be described.

First, a reset signal is input to the first redundant circuit 1A-4 in FIG. 3 from an external circuit via a reset signal line RS. At this point, when there is no defect anywhere in the memory macros 1A1 and 1A2, fuses (12, 22, 32, 42, . . . ) in the first redundant circuit 1A-4 are not broken, so that an output signal of logic "H" level is applied to the gate of an NMOS transistor 15 from an inverter 11 in FIG. 3. Thus, the NMOS transistor 15 is turned on. Then, an output signal of logic "L" level is applied to the gate of an NMOS transistor 16 from an inverter 13, and the NMOS transistor 15 is turned on and the NMOS transistor 16 is turned off, and the bit line BL1 is connected to the second bit line BLA1. Thereafter, an NMOS transistor 25 is turned on, and an NMOS transistor 26 is turned off, so that a bit line BL2 is connected to a second bit line BLA2. Finally, an NMOS transistor 645 is turned on, and an NMOS transistor 646 is turned off, so that a bit line BL64 is connected to a second bit line BLA64. At this point, the redundant signal line RA connected to the redundant memory macro 2A is turned to the logic "L" level, and the NMOS transistor 646 is off, so that a signal is not transmitted to the redundant bit line BLA65. In response to the logic "L" level of the redundant signal line RA, an output signal from a NOR circuit 53 in the redundant memory macro 2A in FIG. 4 is turned to the logic "H" level, so that transistors 33 and 43 are turned on, and all the redundant word lines WLA1 to WLA32 are fixed at the logic "L" level.

In response to the logic "L" level of the redundant signal line RA and an output signal of the logic "H" level from inverters 51 and 52, switching transistors 31, 32, 41, and 42 are turned off, so that the word lines WL1 to WL32 connected to each of the memory macros 1A1 and 1A2 are disconnected from the redundant word lines WLA1 to WLA32.

Then, an address signal is input from an external circuit, and an internal row address signal (RADR) and an internal column address signal (CADR) are generated by the peripheral circuit 1A-1. In response to this internal row address signal, one of the 32 word lines WL1 to WL32 is selected by the row decoder 1A-2. In response to the internal column address signal, one of the four bit lines is selected by a column decoder in the column decoder part 1A-5.

Then, a command signal (CMD) is input from an external circuit, and a read-out signal (RE) or a write signal (WR) is generated by the peripheral circuit 1A-1. In response to the read-out signal or the write signal, data transfer between the input/output circuits in the I/O part 1A-6 and the column decoders is performed via the data lines DATA1 to DATA16. Furthermore, data is written or read out with respect to a desired memory cell in the memory cell array 1A-3 via the bit line selected by the column decoder part 1A-5 and the second bit line selected by the first redundant circuit 1A-4.

Next, this embodiment will be described by taking as an example the case where the second bit line BLA1 of the memory macro 1A1 is defective and there is no defect in the memory macro 1A2.

When the second bit line BLA1 in the memory macro 1A1 is defective, the fuse 12 in the first redundant circuit 1A-4 in the memory macro 1A1 is broken by a laser trimming device beforehand. Then, a reset signal is input from an external circuit to the first redundant circuit 1A-4 in the memory macro 1A1, but since the fuse 12 is broken, an output signal of logic "H" level is not transmitted from the inverter 11 of FIG. 3. Therefore, the logic "L" level is input to the inverter 13 via an NMOS transistor 17, and this is latched in an inverter 14. Thus, the NMOS transistor 15 is turned off, and the NMOS transistor 16 is turned on, so that the bit line BL1 is connected to the second bit line BLA2. Thereafter, an NMOS transistor 25 is turned off, and an NMOS transistor 26 is turned on, so that a bit line BL2 is connected to a second bit line BLA3. Finally, an NMOS transistor 645 is turned off, and an NMOS transistor 646 is turned on, so that a bit line BL64 is connected to a redundant bit line BLA65.

On the other hand, there is no defect and no fuse is broken in the memory macro 1A2, so that an output signal of logic "H" level is transmitted from the inverter 11 in FIG. 3, and the bit line BL1 is connected to the second bit line BLA1. Thereafter, a bit line BL2 is connected to a second bit line BLA2. Finally, a bit line BL64 is connected to a second bit line BLA64.

At this time, in the redundant memory macro 2A, the redundant signal line RA on the side of the memory macro 1A1 is in the logic "H" level, and a signal of the bit line BL64 is transmitted to the redundant bit line BLA65. However, the redundant signal line RA on the side of the memory macro 1A2 is in the logic "L" level, so that a signal of the bit line BL64 is not transmitted to the redundant bit line BLA65. Furthermore, in response to the logic "H" level of the redundant signal line RA on the side of the memory macro 1A1, an output signal of the NOR circuit 53 of the redundant memory macro 2A is turned to be in the logic "L" level, so that the NMOS transistors 33 and 43 are turned off and the redundant word lines WLA1 to WLA32 are not fixed at the logic "L" level.

In response to the logic "H" level of the redundant signal line RA on the side of the memory macro 1A1 and an output signal of the logic "L" level from inverter 51, switching transistors 31 and 41 are turned on, and the word lines WL1 to WL32 on the side of the memory macro 1A1 are connected to the redundant word lines WLA1 to WLA32, so that a signal is transmitted. At the same time, in response to the logic "L" level of the redundant signal line RA on the side of the memory macro 1A2 and an output signal of the logic "H" level from inverter 52, switching transistors 32 and 42 are turned off, and the word lines WL1 to WL32 on the side of the memory macro 1A2 are disconnected from the redundant word lines WLA1 to WLA32, so that a signal is not transmitted.

Then, an address signal is input from an external circuit and an internal row address signal (RADR) and an internal column address signal (CADR) are generated by the peripheral circuit 1A-1. In response to this internal row address signal, one of the 32 word lines is selected by the row decoder 1A-2. In response to the internal column address signal, one of the four bit lines is selected by a column decoder in the column decoder part 1A-5.

Then, a command signal (CMD) is input from an external circuit to the memory macro 1A1, and a read-out signal (RE) or a write signal (WR) is generated by the peripheral circuit 1A-1. In response to the read-out signal or the write signal, data transfer between the input/output circuits in the I/O part 1A-6 and the column decoders is performed via the data lines DATA1 to DATA16. Furthermore, data is written or read out with respect to a desired memory cell in the memory cell array 1A-3 via the bit line previously selected by the column decoder part 1A-5, the second bit line BLA2 to BLA64 selected by the first redundant circuit 1A-4 and the redundant bit line BLA65.

This configuration makes it possible to disconnect the redundant word lines and the redundant bit line completely from the word lines and the bit lines of a normal memory macro, so that the redundant memory macro can be shared among a plurality of memory macros, regardless of whether the operation of the word lines or the bit lines is the same or different in the plurality of memory macros. Thus, the area efficiency and the repair efficiency can be improved.

Embodiment 2

Figure 5:
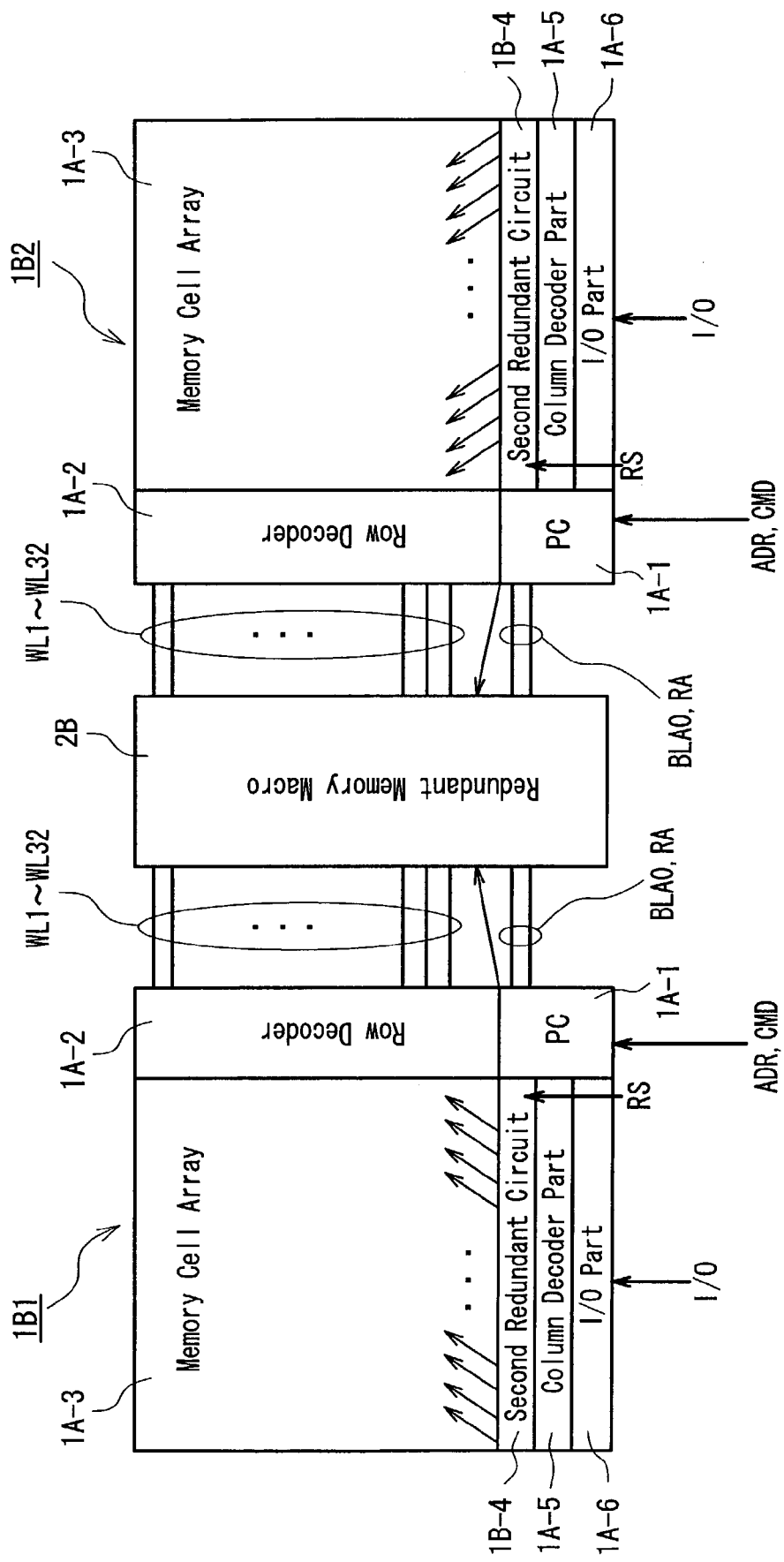
FIG. 5 is a block diagram showing an example of a configuration of a semiconductor integrated circuit according to Embodiment 2 of the present invention.

FIG. 5 is a block diagram showing an example of a configuration of a semiconductor integrated circuit according to Embodiment 2 of the present invention.

In FIG. 5, a semiconductor integrated circuit of this embodiment includes a plurality of memory macros 1B1 and 1B2 and a redundant memory macro 2B for repairing the plurality of memory macros 1B1 and 1B2. In this embodiment, an example in which two memory macros are mounted is described, but the same is true for the cases in which three or more memory macros are mounted. A redundancy repair of this configuration may be present in a plurality of sites in a semiconductor integrated circuit. The numbers of word lines or bit lines and data input/output lines in the plurality of memory macros 1B1 and 1B2 and the redundant memory macro 2B are not limited to those in this embodiment.

The plurality of memory macros 1B1 and 1B2 are connected to an external circuit by address signal lines ADR, command signal lines CMD, data input/output lines I/O, and reset signal lines RS. The redundant memory macro 2B is connected to the memory macros 1B1 and 1B2 by respective word lines WL1 to WL32, a redundant bit line BLA0 and a redundant signal line RA.

Figure 6:
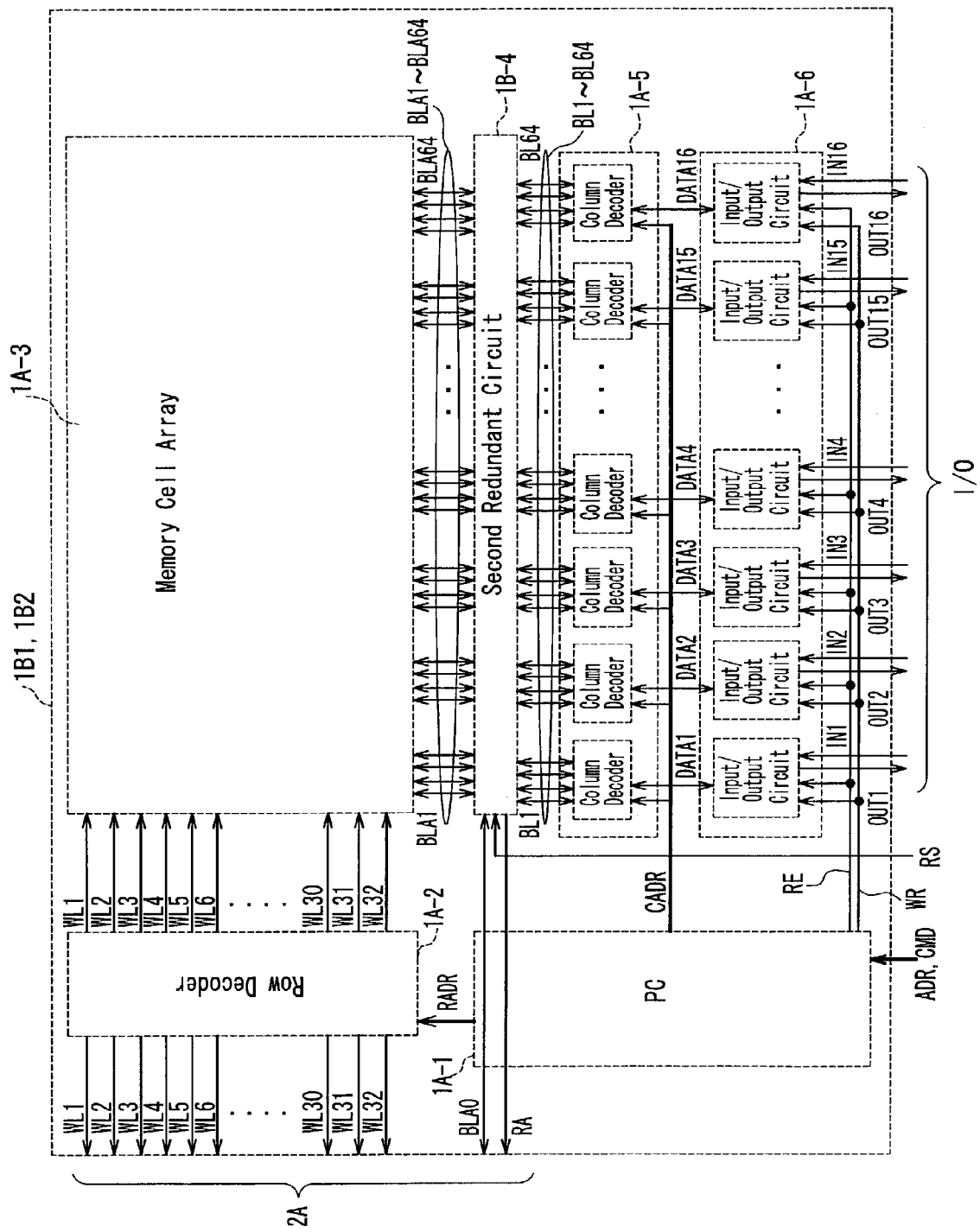
FIG. 6 is a block diagram showing the internal configuration of memory macros 1B1 and 1B2 of FIG. 5.

FIG. 6 is a block diagram showing the internal configuration of the memory macros 1B1 and 1B2. In FIG. 6, a peripheral circuit (PC) 1A-1 in the memory macros 1B1 and 1B2 is connected to an external circuit by the address signal line ADR and the command signal line CMD. Input/output circuits in the I/O part 1A-6 are connected to an external circuit by the data input/output signal lines IN1 to IN16 and OUT1 to OUT16. Furthermore, a second redundant circuit 1B-4 is connected to an external circuit by the reset signal line RS. The peripheral circuit 1A-1 is connected to a row decoder 1A-2 by an internal row address signal line RADR, and the row decoder 1A-2 is connected to a memory cell array 1A-3 by the word lines WL1 to WL32. The peripheral circuit 1A-1 is connected to the input/output circuits in the I/O part 1A-6 by a read-out signal line RE and a write signal line WR. Furthermore, the peripheral circuit 1A-1 is connected to column decoders in a column decoder part 1A-5 by an internal column address signal line CADR, and the column decoders are connected to the input/output circuits by data lines DATA1 to DATA16 and are connected to the second redundant circuit 1B-4 by bit lines BL1 to BL64.

The second redundant circuit 1B-4 is connected to the memory cell array 1A-3 by second bit lines BLA1 to BLA64 and is connected to the redundant memory macro 2B by the redundant bit line BLA0 and the redundant signal line RA. The row decoder 1A-2 is connected to the external redundant memory macro 2B by the word lines WL1 to WL32.

Figure 7:
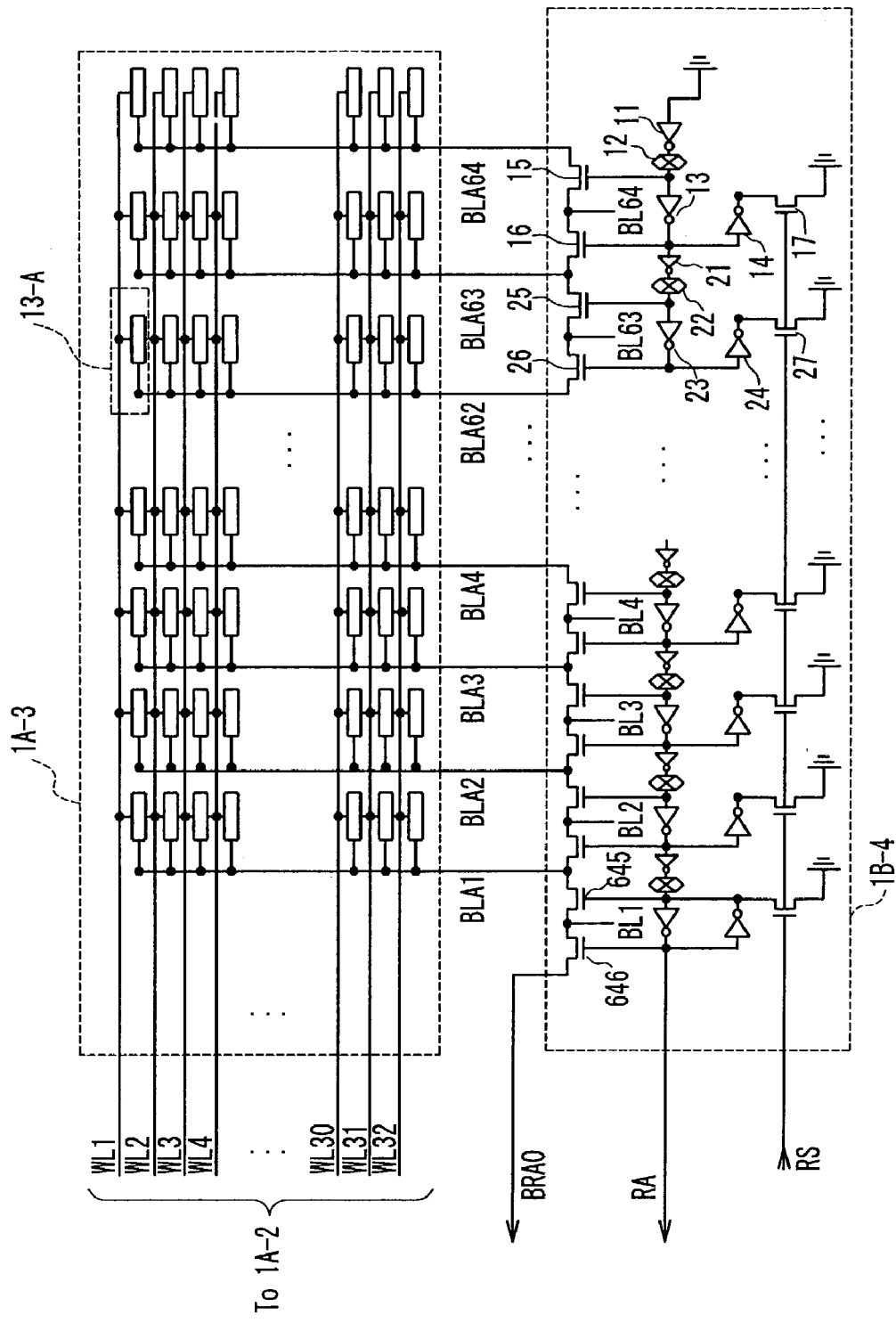
FIG. 7 is a circuit diagram showing a partial configuration of a memory cell array 1A-3 and a second redundant circuit 1B-4 of FIG. 6.

FIG. 7 is a circuit diagram showing a partial configuration of the memory cell array 1A-3 and a partial configuration of the second redundant circuit 1B-4. In FIG. 7, the memory cell array 1A-3 includes 64 second bit lines BLA1 to BLA64 and 32 word lines WL1 to WL32, and a plurality of memory cells 13-A that are arranged in a matrix. Each memory cell 13-A is connected to one of the 64 second bit lines BLA1 to BLA64 and one of the 32 word lines WL1 to WL32 that make the memory cell 13-A accessible.

Figure 8:
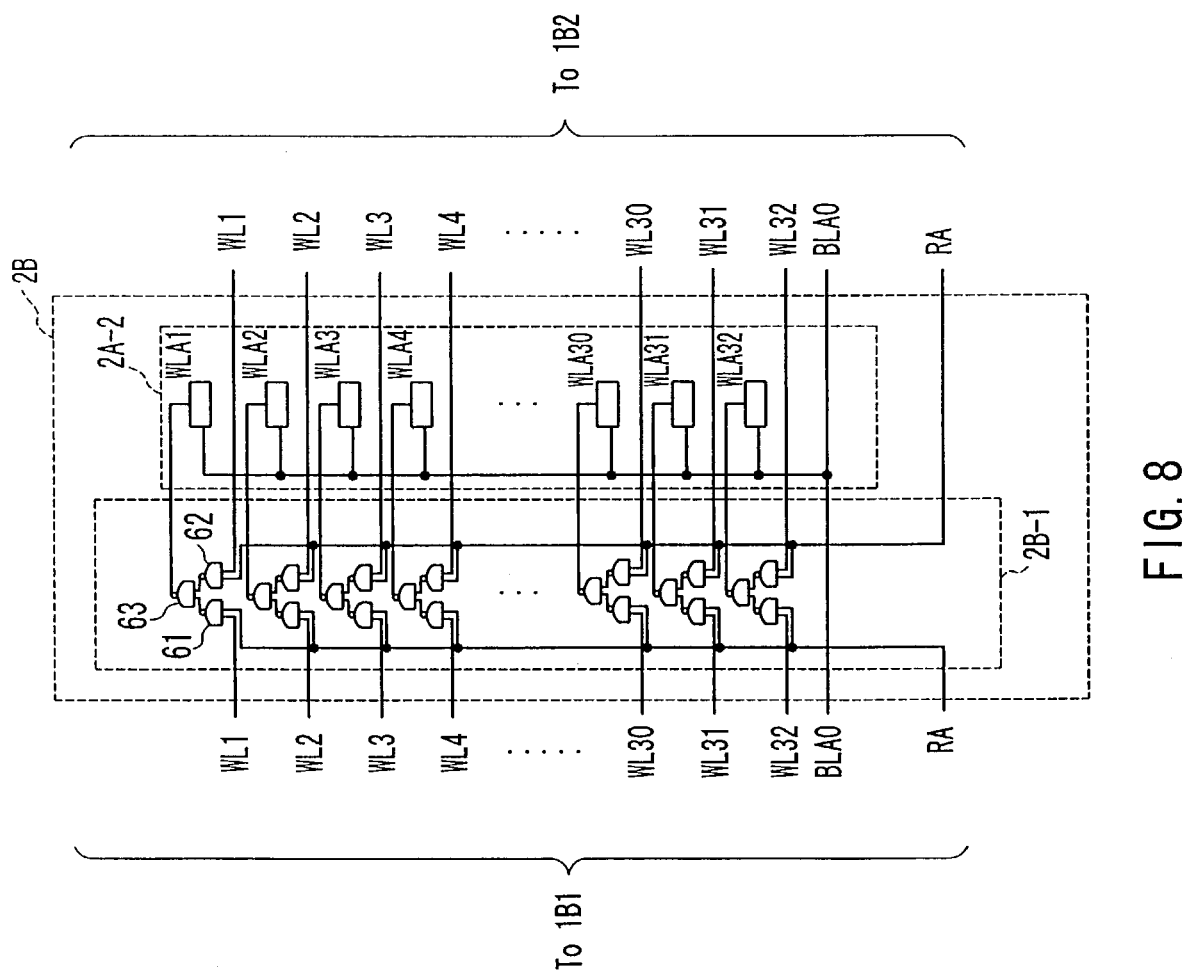
FIG. 8 is a circuit diagram showing a partial configuration of a redundant memory macro 2B of FIG. 5.

FIG. 8 is a circuit diagram showing a partial configuration of the redundant memory macro 2B. In FIG. 8, the redundant memory macro 2B includes a second word line connection circuit 2B-1 and a redundant memory cell array 2A-2. The second word line connection circuit 2B-1 is connected to the memory macros 1B1 and 1B2 by the respective word lines WL1 to WL32 and is connected to the redundant memory cell array 2A-2 by redundant word lines WLA1 to WLA32. The redundant memory cell array 2A-2 is connected to the second redundant circuit 1B-4 in each of the memory macros 1B1 and 1B2 by the redundant bit line BLA0 and the redundant signal line RA.

Hereinafter, the operation of a semiconductor integrated circuit having such a configuration will be described.

First, the case where there is no defect in the plurality of memory macros 1B1 and 1B2 and the redundant memory macro 2B is not used will be described.

First, a reset signal (RS) is input to the second redundant circuit 1B-4 from an external circuit. At this point, when there is no defect anywhere in the memory macros 1B1 and 1B2, fuses are not broken, so that an output signal of the logic "H" level is applied to the gate of an NMOS transistor 15 from an inverter 11 in FIG. 7, and an output signal of the logic "L" level is applied to the gate of an NMOS transistor 16 from an inverter 13, and thus the NMOS transistor 15 is turned on and the NMOS transistor 16 is turned off. Thus, the bit line BL64 is connected to the second bit line BLA64. Thereafter, an NMOS transistor 25 is turned on, and an NMOS transistor 26 is turned off, so that a bit line BL63 is connected to a second bit line BLA63. Finally, an NMOS transistor 645 is turned on, and an NMOS transistor 646 is turned off, so that a bit line BL1 is connected to a second bit line BLA1.

At this time, the redundant signal line RA connected to the redundant memory macro 2B is turned to the logic "L" level, and the NMOS transistor 646 is off, so that a signal is not transmitted to the redundant bit line BLA0. In response to the logic "L" level of the redundant signal line RA, an output signal from a NAND circuit 61 in FIG. 8 is turned to the logic "H" level, and an output signal from a NAND circuit 62 is also turned to the logic "H" level, so that all the redundant word lines WLA1 to WLA32 connected to the output of the NAND circuit 63 are fixed at the logic "L" level.

Then, an address signal (ADR) is input from an external circuit, and an internal row address signal (RADR) and an internal column address signal (CADR) are generated by the peripheral circuit 1A-1. In response to this internal row address signal, one of the 32 word lines is selected by the row decoder 1A-2. In response to the internal column address signal, one of the four bit lines is selected by a column decoder in the column decoder part 1A-5.

Then, a command signal (CMD) is input from an external circuit, and a read-out signal (RE) or a write signal (WR) is generated by the peripheral circuit 1A-1. In response to the read-out signal or the write signal, data transfer between the input/output circuits in the I/O part 1A-6 and the column decoders is performed via the data lines DATA1 to DATA16. Furthermore, data is written or read in a desired memory cell in the memory cell array 1A-3 via the bit line selected by the column decoder part 1A-5 and the second bit line selected by the second redundant circuit 1B-4.

Next, this embodiment will be described by taking as an example the case where the second bit line BLA64 of the memory macro 1B1 is defective and there is no defect in the memory macro 1B2.

When the second bit line BLA64 in the memory macro 1B1 is defective, the fuse 12 in the second redundant circuit 1B-4 in the memory macro 1B1 is broken by a laser trimming device beforehand.

Then, a reset signal (RS) is input from an external circuit to the second redundant circuit 1B-4 in the memory macro 1B1, but since the fuse 12 is broken, an output signal of the logic "H" level is not transmitted from the inverter 11 in FIG. 7. Therefore, the logic "L" level is input to the inverter 13 via an NMOS transistor 17, and this is latched in an inverter 14. Thus, the NMOS transistor 15 is turned off, and the NMOS transistor 16 is turned on, so that the bit line BL64 is connected to the second bit line BLA63. Thereafter, an NMOS transistor 25 is turned off, and an NMOS transistor 26 is turned on, so that a bit line BL63 is connected to a second bit line BLA62. Finally, an NMOS transistor 645 is turned off, and an NMOS transistor 646 is turned on, so that a bit line BL1 is connected to the redundant bit line BLA0.

On the other hand, there is no defect and no fuse is broken in the memory macro 1B2, so that an output signal of the logic "H" level is transmitted from the inverter 11, an NMOS transistor 15 is turned on, and an NMOS transistor 16 is turned off, and thus the bit line BL64 is connected to the second bit line BLA64. Thereafter, an NMOS transistor 25 is turned on, an NMOS transistor 26 is turned off, and a bit line BL63 is connected to a second bit line BLA63. Finally, an NMOS transistor 645 is turned on, an NMOS transistor 646 is turned off, and a bit line BL1 is connected to a bit line BLA1.

At this time, in the redundant memory macro 2B, the redundant signal line RA on the side of the memory macro 1B1 is turned to the logic "H" level, and a signal of the bit line BL1 is transmitted to the redundant bit line BLA0. However, the redundant signal line RA on the side of the memory macro 1B2 is turned to the logic "L" level, so that a signal of the bit line BL1 is not transmitted to the redundant bit line BLA0. Furthermore, in response to the logic "H" level of the redundant signal line RA on the side of the memory macro 1B1, the NAND circuit 61 in FIG. 8 outputs an inverse signal of the word line WL1. Furthermore, in response to the logic "L" level of the redundant signal line RA on the side of the memory macro 1B2, the NAND circuit 62 outputs a logic "H" level. In response to the output signals of the two NAND circuits 61 and 62, the NAND circuit 63 outputs a signal having the same phase of that of the word line WL1.

Then, an address signal (ADR) is input from an external circuit, and an internal row address signal (RADR) and an internal column address signal (CADR) are generated by the peripheral circuit 1A-1. In response to this internal row address signal, one of the 32 word lines is selected by the row decoder 1A-2. In response to the internal column address signal, one of the four bit lines is selected by a column decoder in the column decoder part 1A-5.

Then, a command signal (CMD) is input to the memory macro 1B1 from an external circuit, and a read-out signal (RE) or a write signal (WR) is generated by the peripheral circuit 1A-1. In response to the read-out signal or the write signal, data transfer between the input/output circuits in the I/O part 1A-6 and the column decoders is performed via the data lines DATA1 to DATA16. Furthermore, data is written or read out with respect to a desired memory cell in the memory cell array 1A-3 via the bit line selected previously by the column decoder part 1A-5, the second bit lines BLA63 to BLA1 selected by the second redundant circuit 1B-4, and the redundant bit line BLA0.

This configuration makes it possible to disconnect the redundant word lines and the redundant bit line completely from the word lines and the bit lines of a normal memory macro, so that the redundant memory macro can be shared among a plurality of memory macros, regardless of whether the operation of the word lines or the bit lines is the same or different in the plurality of memory macros. Thus, the area efficiency and the repair efficiency can be improved.

Furthermore, the second word line connection circuit 2B-1 in the redundant memory macro 2B makes it possible to eliminate a connection delay of the word lines and the redundant word lines due to the on/off time of the switching transistors of Embodiment 1 with respect to a redundant signal in accordance with a memory macro to be repaired and to adjust the operation timing (shape waveform or do the like) of a signal of the word line transmitted to the redundant word line.

Embodiment 3

Figure 9:
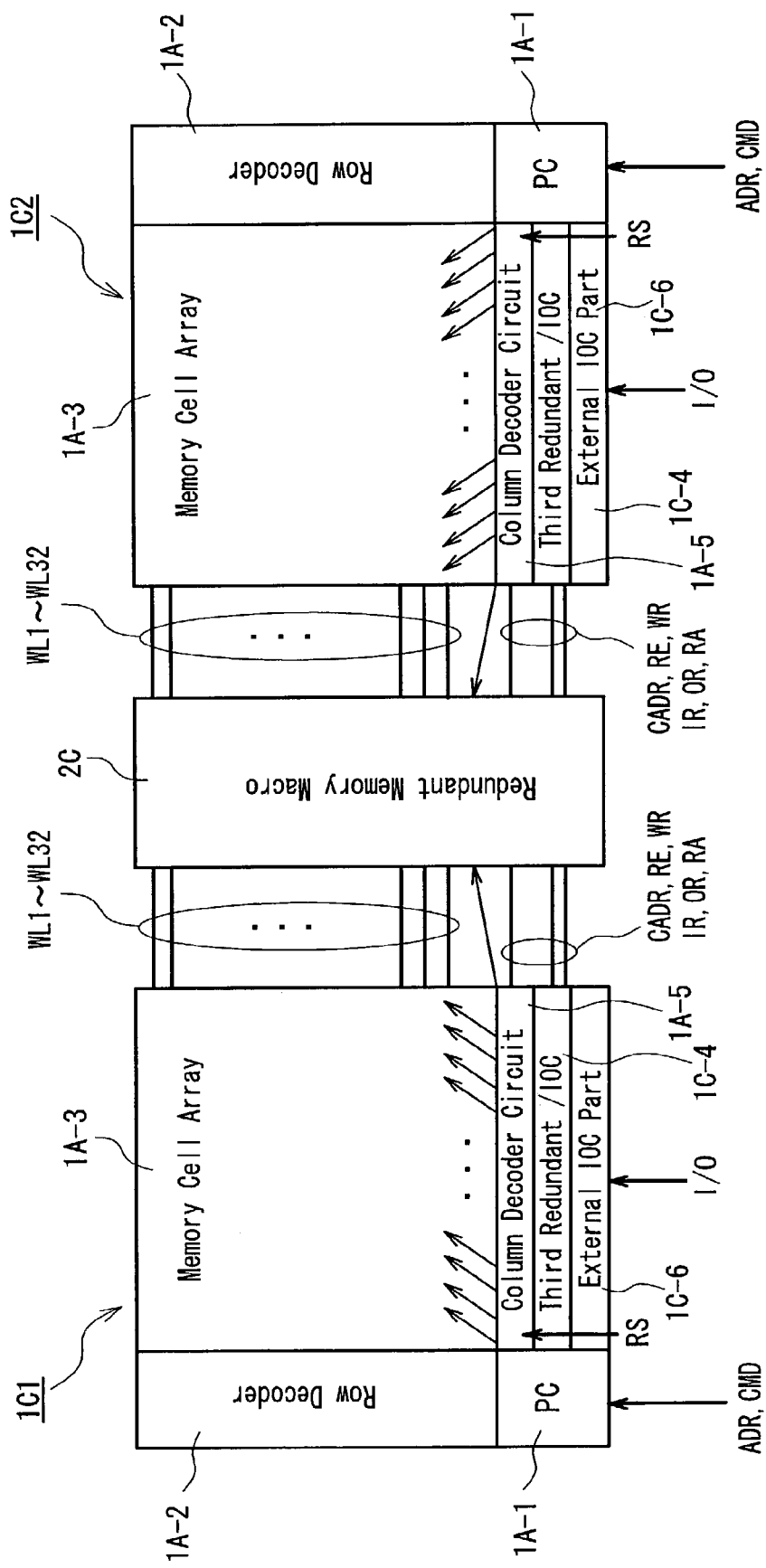
FIG. 9 is a block diagram showing an example of a configuration of a semiconductor integrated circuit according to Embodiment 3 of the present invention.

FIG. 9 is a block diagram showing an example of a configuration of a semiconductor integrated circuit according to Embodiment 3 of the present invention.

In FIG. 9, a semiconductor integrated circuit of this embodiment includes a plurality of memory macros 1C1 and 1C2 and a redundant memory macro 2C for repairing the plurality of memory macros 1C1 and 1C2. In this embodiment, an example in which two memory macros are mounted is described, but the same is true for the cases in which three or more memory macros are mounted. A redundancy repair of this configuration may be present in a plurality of sites in a semiconductor integrated circuit. The numbers of word lines or bit lines and data input/output lines in the plurality of memory macros 1C1 and 1C2 and the redundant memory macro 2C are not limited to those in this embodiment.

The plurality of memory macros 1C1 and 1C2 are connected to an external circuit by address signal lines ADR, command signal lines CMD, data input/output signal lines I/O, and reset signal lines RS. The redundant memory macro 2C is connected to the memory macros 1C1 and 1C2 by respective word lines WL1 to WL32, internal column address signal lines CADR, read-out signal lines RE, write signal lines WR, redundant input data lines IR, redundant output data lines OR, and redundant signal lines RA.

Figure 10:
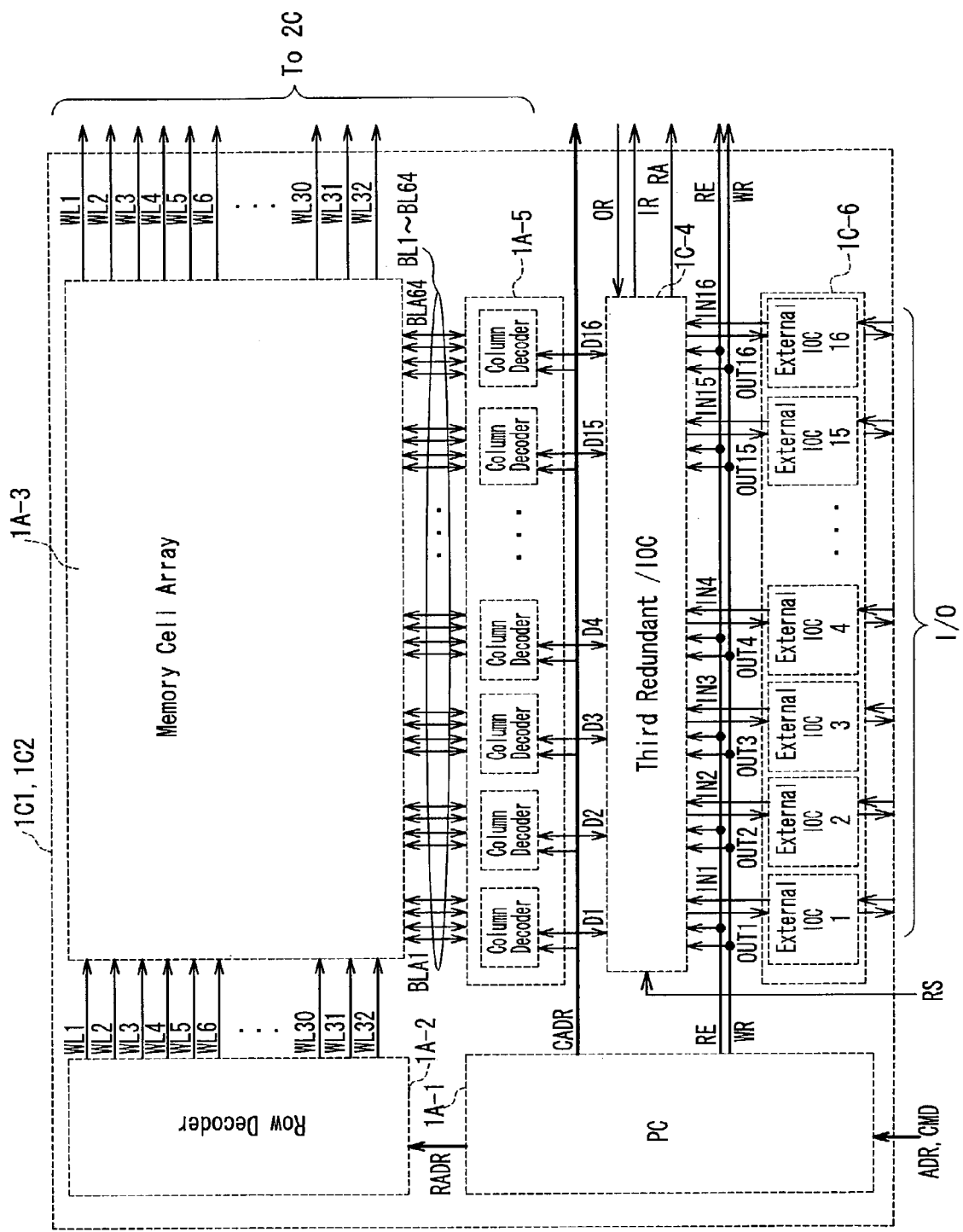
FIG. 10 is a block diagram showing the internal configuration of memory macros 1C1 and 1C2 of FIG. 9.

FIG. 10 is a block diagram showing the internal configuration of the plurality of memory macros 1C1 and 1C2.

Figure 11:
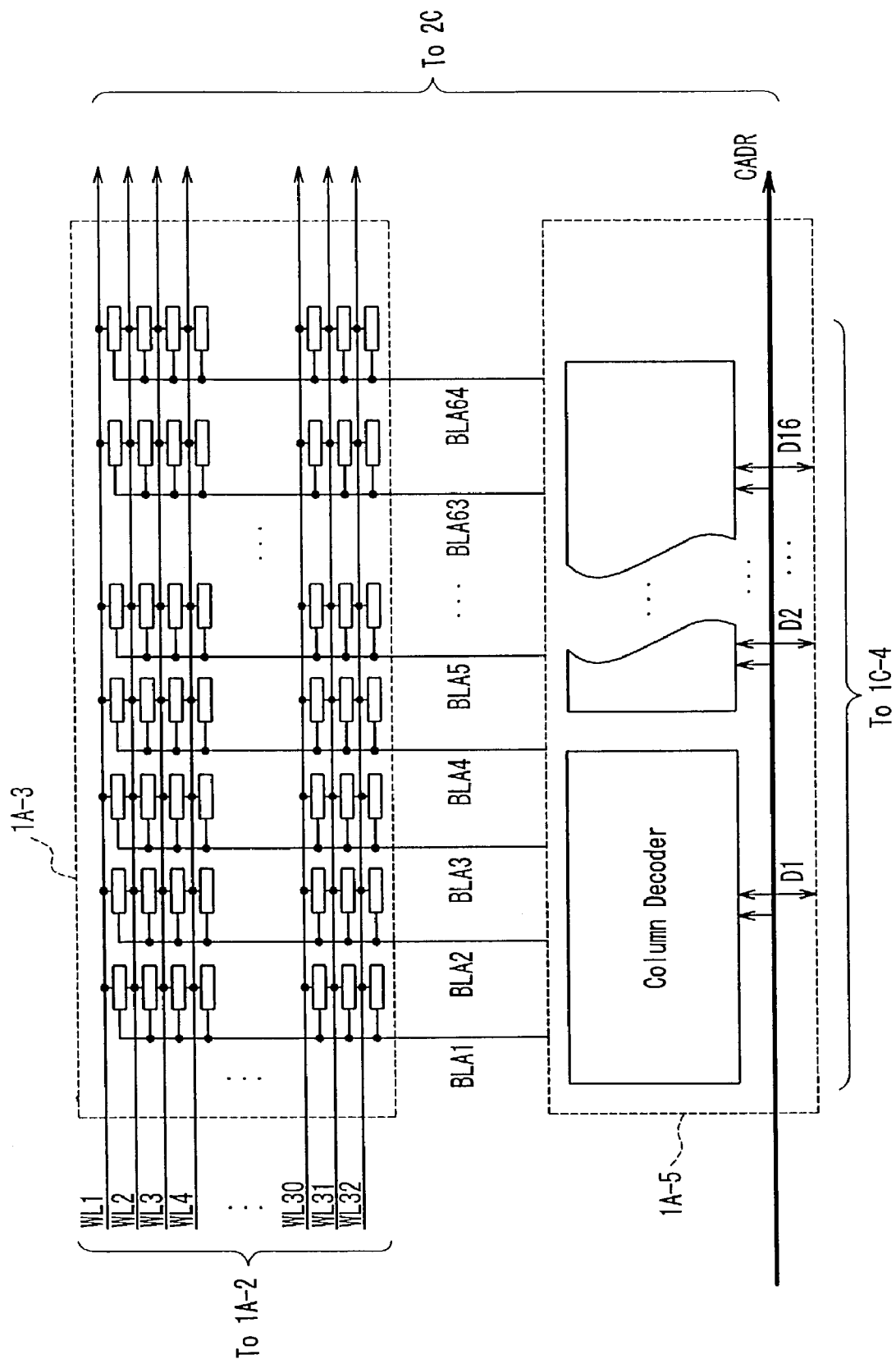
FIG. 11 is a circuit diagram showing a partial configuration of a memory cell array 1A-3 and a column decoder part 1A-5 of FIG. 10.

FIG. 11 is a circuit diagram showing a partial configuration of a memory cell array 1A-3 and a partial configuration of a column decoder part 1A-5.

Figure 12:
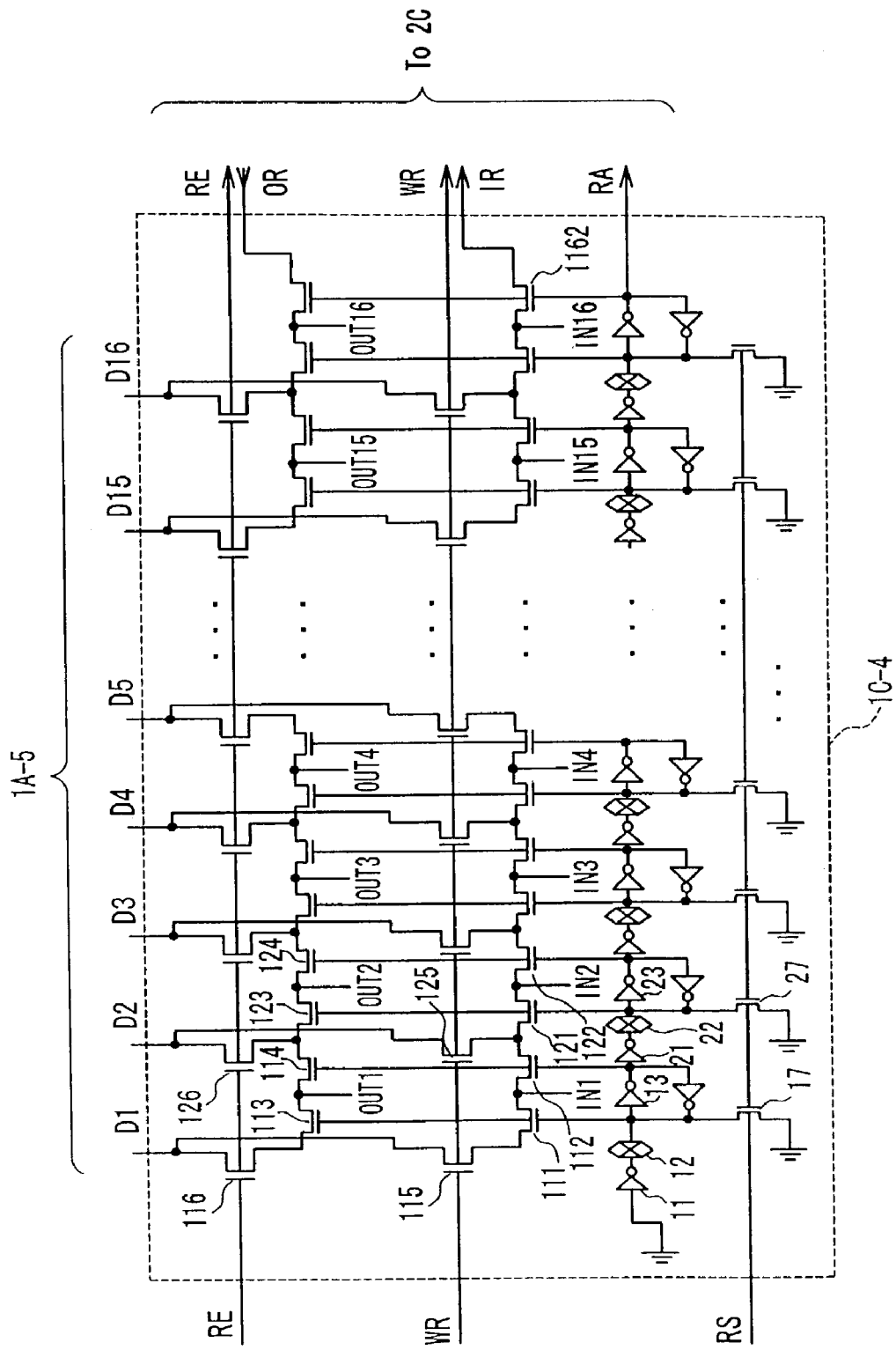
FIG. 12 is a circuit diagram showing a partial configuration of a third redundant/input and output circuit 1C-4 of FIG. 10.

FIG. 12 is a circuit diagram showing a partial configuration of a third redundant/input and output circuit 1C-4.

As shown in FIGS. 10, 11 and 12, a peripheral circuit (PC) 1A-1 in the plurality of memory macros 1C1 and 1C2 is connected to an external circuit by the address signal line ADR and the command signal line CMD. An external input/output circuit (IOC) part 1C-6 is connected to an external circuit by the data input/output signal line I/O and is connected to the third redundant/input and output circuit (IOC) 1C-4 by input data lines IN1 to IN16 and output data lines OUT1 to OUT16. Furthermore, the third redundant/input and output circuit 1C-4 is connected to an external circuit by the reset signal line RS.

The peripheral circuit 1A-1 is connected to a row decoder 1A-2 by an internal row address signal line RADR, and the row decoder 1A-2 is connected to a memory cell array 1A-3 by the word lines WL1 to WL32. The peripheral circuit 1A-1 is connected to the third redundant/input and output circuits 1C-4 by the read-out signal line RE and the write signal line WR. Furthermore, the peripheral circuit 1A-1 is connected to column decoders in a column decoder part 1A-5 and a command connection circuit 2C-3 (FIG. 13) in the redundant memory macro 2C by an internal column address signal line CADR. The column decoders are connected to the memory cell array 1A-3 by the bit lines BL1 to BL64. The memory cell array 1A-3 is connected to a first word line connection circuit 2A-1 (FIG. 13) in the redundant memory macro 2C by the word lines WL1 to WL32. The third redundant/input and output circuit 1C-4 is connected to a column decoder in the column decoder part 1A-5 by input/output data lines D1 to D16, is connected to the command connection circuit 2C-3 in the redundant memory macro 2C by the read-out signal line RE, the write signal line WR, the redundant input data line IR and the redundant output data line OR, and is connected to the first word line connection circuit 2A-1 in the redundant memory macro 2C by the redundant signal line RA.

Figure 13:
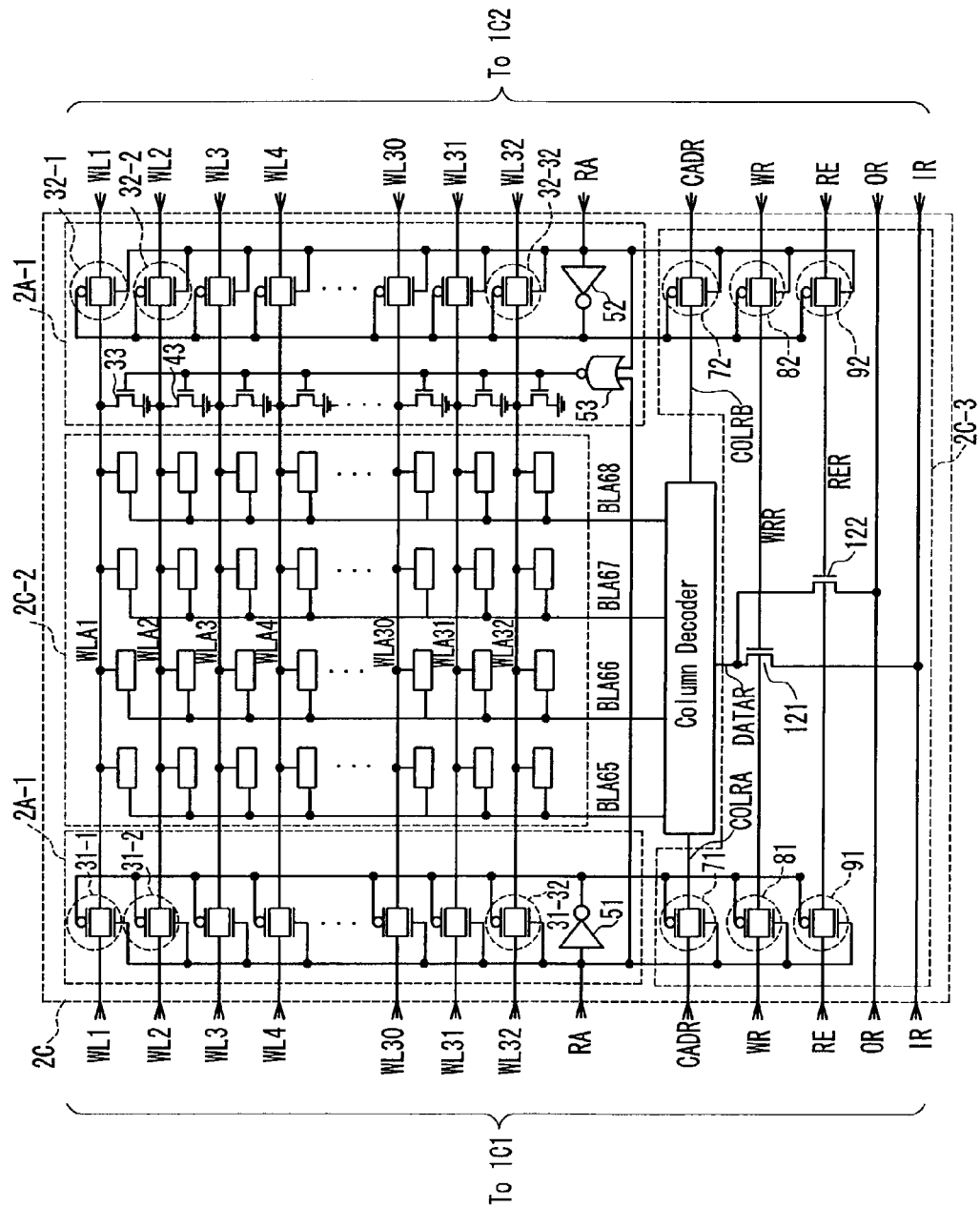
FIG. 13 is a circuit diagram showing a partial configuration of a redundant memory macro 2C of FIG. 9.

FIG. 13 is a circuit diagram showing a partial configuration of the redundant memory macro 2C. The redundant memory macro 2C includes first word line connection circuits 2A-1, a redundant memory cell array 2C-2 and a command connection circuit 2C-3. The first word line connection circuits 2A-1 are connected to the memory macros 1C1 and 1C2 by the respective word lines WL1 to WL32 and the redundant signal line RA, and are connected to the redundant memory cell array 2C-2 by redundant word lines WLA1 to WLA32. The redundant memory cell array 2C-2 is connected to column decoders in the redundant memory macro 2C by the redundant bit lines BLA65 to BLA68. The command connection circuit 2C-3 and the column decoders are connected by a redundant column address line COLRA and COLRB and a redundant data line DATAR.

Hereinafter, the operation of a semiconductor integrated circuit having such a configuration will be described.

First, the case where there is no defect in the plurality of memory macros 1C1 and 1C2 and the redundant memory macro 2C is not used will be described.

First, a reset signal (RS) is input to the third redundant/input and output circuit 1C-4 from an external circuit. At this point, when there is no detect anywhere in the memory macros 1C1 and 1C2, fuses are not broken, so that an output signal of the logic "H" level is transmitted from an inverter 11 in FIG. 12. Thus, the NMOS transistors 111 and 113 are turned on and the NMOS transistors 112 and 114 are turned off. Therefore, when the state of the write signal line WR is in the logic "H" level, the input data line IN1 is connected to the input/output data line D1 via the NMOS transistor 111 and an input transistor 115. On the other hand, when the state of the read-out signal line RE is in the logic "H" level, the output data line OUT1 is connected to the input/output data line D1 via the NMOS transistor 113 and an output transistor 116.

Thereafter, when the state of the write signal line WR is in the logic "H" level, the input data line IN2 is connected to the input/output data line D2 via an NMOS transistor 121 and an input transistor 125. On the other hand, when the state of the read-out signal line RE is in the logic "H" level, the output data line OUT2 is connected to the input/output data line D2 via an NMOS transistor 123 and an output transistor 126. Finally, an input data line IN16 or an output data line OUT16 is connected to an input/output data line D16 when the state of the write signal line WR or the read-out signal line RE is in the logic "H" level.

At this time, the redundant signal line RA connected to the redundant memory macro 2C is in the logic "L" level, and an NMOS transistor 1162 is off, so that a signal is not transmitted to the redundant input data line IR and the redundant output data line OR. In the redundant memory macro 2C, in response to the logic "L" level of the redundant signal line RA, an output signal from a NOR circuit 53 in FIG. 13 is in the logic "H" level, so that NMOS transistors 33 and 43 are turned on, and the redundant word lines WLA1 to WLA32 are fixed at the logic "L" level.

In response to the logic "L" level of the redundant signal line RA and an output signal of the logic "H" level from inverters 51 and 52, switching transistors 31-1 to 31-32 and 32-1 to 32-32 are turned off, so that the word lines WL1 to WL32 connected to each of the memory macros 1C1 and 1C2 are disconnected from the redundant word lines WLA1 to WLA32.

Then, as shown in FIG. 10, an address signal (ADR) is input from an external circuit, and an internal row address signal (RADR) and an internal column address signal (CADR) are generated by the peripheral circuit 1A-1. In response to this internal row address signal, one of the 32 word lines WL1 to WL32 is selected by the row decoder 1A-2. In response to the internal column address signal, one of the four bit lines BL1 to BL4, . . . , BL61 to BL64 is selected by the column decoders in the column decoder part 1A-5.

Then, in response to a command signal (CMD) input from an external circuit, a read-out signal (RE) or a write signal (WR) is generated by the peripheral circuit 1A-1. In response to the read-out signal or the write signal, the third redundant/input and output circuit 1C-4 receives and delivers data from/to the column decoders via the selected input/output data lines D1 to D16, and also receives and delivers data from/to an external input/output circuit 1C-6 via the input data lines IN1 to IN16 or the output data lines OUT1 to OUT16.

Furthermore, data is written or read out with respect to a desired memory cell in the memory cell array 1A-3 via the bit line selected previously by the column decoder part 1A-5.

Then, this embodiment will be described by taking an example the case where the bit line BLA1 of the memory macro 1C1 is defective and there is no defect in the memory macro 1C2.

When the bit line BLA1 in the memory macro 1C1 is defective, the fuse 12 in the third redundant/input and output circuit 1C-4 shown in FIG. 12 is broken by a laser trimming device beforehand. Then, a reset signal (RS) is input from an external circuit to the third redundant/input and output circuit 1C-4, but since the fuse 12 is broken, an output signal of the logic "H" level is not transmitted from the inverter 11. Therefore, the logic "L" level is input to the inverter 13 via an NMOS transistor 17, and this is latched in an inverter 14. Thus, the input data line IN1 or the output data line OUT1 is connected to the input/output data line D2 in accordance with the state of the write signal (WR) or the read-out signal (RE), and accessed by the normal bit line BLA5 instead of the defective bit line BLA1. Thereafter, the input data line IN2 or the output data line OUT2 is connected to the input/output data line D3, and finally the input data line IN16 or the output data line OUT16 is connected to the data line DATAR in the redundant memory macro 2C shown in FIG. 13.

On the other hand, there is no defect and no fuse is broken in the memory macro 1C2, so that an output signal of logic "H" level is transmitted from the inverter 11, and the input data line IN1 or the output data line OUT1 is connected to the input/output data line D1. Thereafter, the input data line IN2 or the output data line OUT2 is connected to the input/output data line D2, and finally the input data line IN16 or the output data line OUT16 is connected to the input/output data line D16.

At this time, in the redundant memory macro 2C, the redundant signal line RA on the side of the memory macro 1C1 is in the logic "H" level, so that the redundant input data line IR or the redundant output date line OR is connected to the redundant input/output data line DATAR via an NMOS transistor 121 or 122. The internal column address signal line CADR, the write signal line WR, the read-out signal line RE, and the word lines WL1 to WL32 on the side of the memory macro 1C1 are connected to the redundant column address line COLRA, the redundant write signal line WRR, the redundant read-out signal line RER, and the redundant word lines WLA1 to WLA32 via switching transistors 71, 81, 91, and 31-1 to 31-32, respectively.

On the other hand, since the redundant signal line RA on the side of the memory macro 1C2 is in the logic "L" level, switching transistors 72, 82, 92, and 32-1 to 32-32 are off, so that the internal column address signal line CADR, the write signal line WR, the read-out signal line RE, and the word lines WL1 to WL32 on the side of the memory macro 1C2 are disconnected from the redundant column address line COLRB, the redundant write signal line WRR, the redundant read-out signal line RER, and the redundant word lines WLA1 to WLA32, respectively.

Then, an address signal (ADR) is input from an external circuit and an internal row address signal (RADR) and an internal column address signal (CADR) are generated by the peripheral circuit 1A-1. In response to this internal row address signal, one of the 32 word lines is selected by the row decoder 1A-2. In response to the internal column address signal, one of the four bit lines is selected by a column decoder in the column decoder part 1A-5.

Then, in response to a command signal (CMD) input from an external circuit, a read-out signal (RE) or a write signal (WR) is generated by the peripheral circuit 1A-1. In response to the read-out signal or the write signal, data transfer between the third redundant/input and output circuit 1C-4 and the column decoders is performed via the input/output data lines D1 to D16, and data transfer between the third redundant/input and output circuit 1C-4 and the external input/output signals is performed via the input data lines IN1 to IN16 or the output data lines OUT1 to OUT16. Furthermore, data is written or read out with respect to a desired memory cell in the memory cell array 1A-3 via the bit line previously selected by the column decoder part 1A-5.

Figure 14:
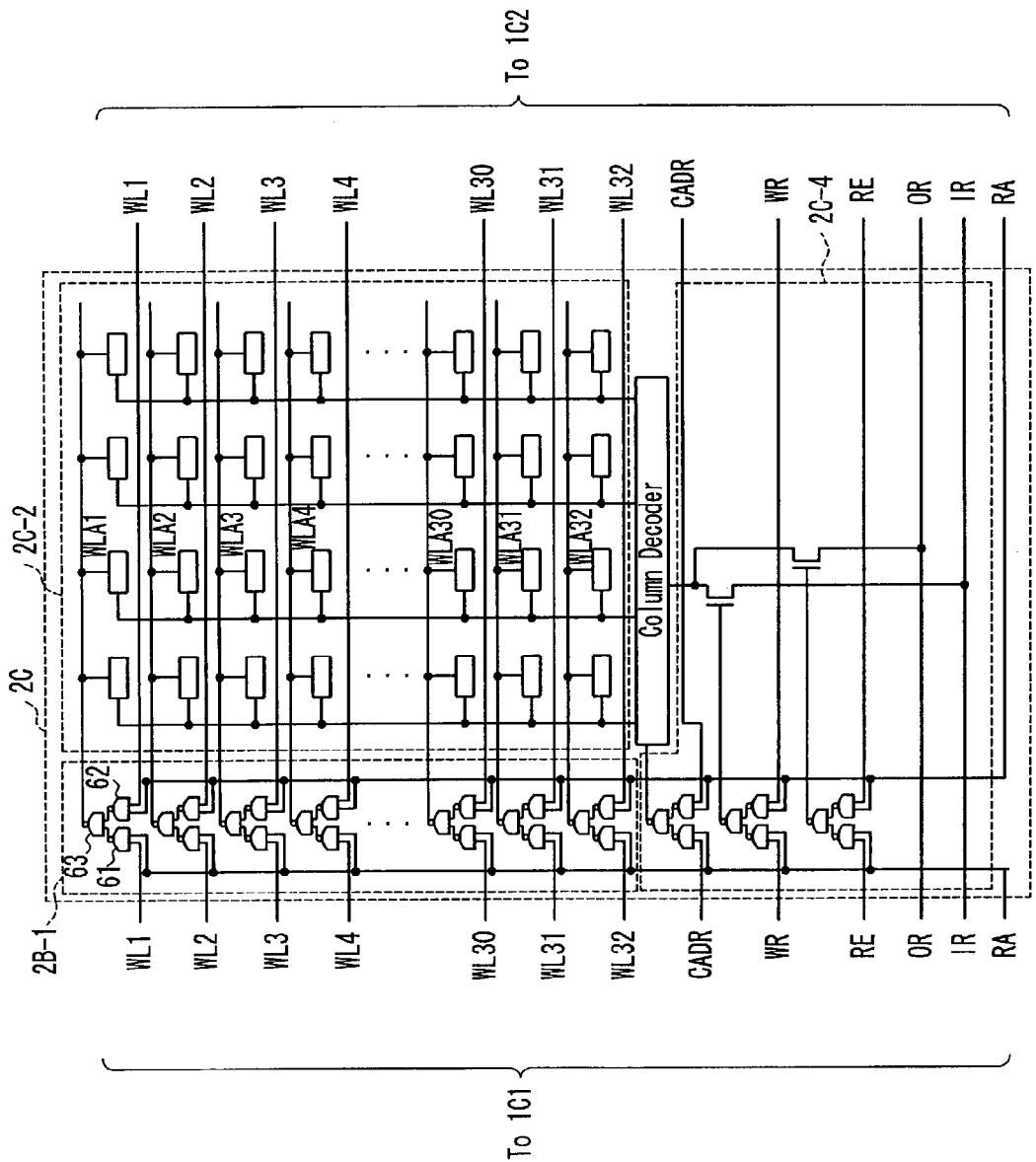
FIG. 14 is a circuit diagram showing a variation of the redundant memory macro 2C of FIG. 9.

FIG. 14 shows a variation of the redundant memory macro and shows a configuration in which the first word line connection circuit 2A-1 configured with switching transistors is replaced by the second word line connection circuit 2B-1 configured with NAND circuits, and the first command connection circuit 2C-3 configured with switching transistors is replaced by the second command connection circuit 2C-4 configured with NAND circuits.

This configuration makes it possible to disconnect the redundant word lines, the redundant bit lines, and further the redundant column address lines, the redundant write signal lines, the redundant read-out signal lines, and the redundant input/output data lines completely from the word lines, the bit lines, the internal column address lines, the write signal lines, the read-out signal lines, and the input/output data lines of a normal memory macro, so that the redundant memory macro can be shared by a plurality of memory macros, although the operation timings of signals, in addition to those of the word lines and the bit lines, are different. Thus, the area efficiency and the repair efficiency can be improved.

Embodiment 4

Figure 15:
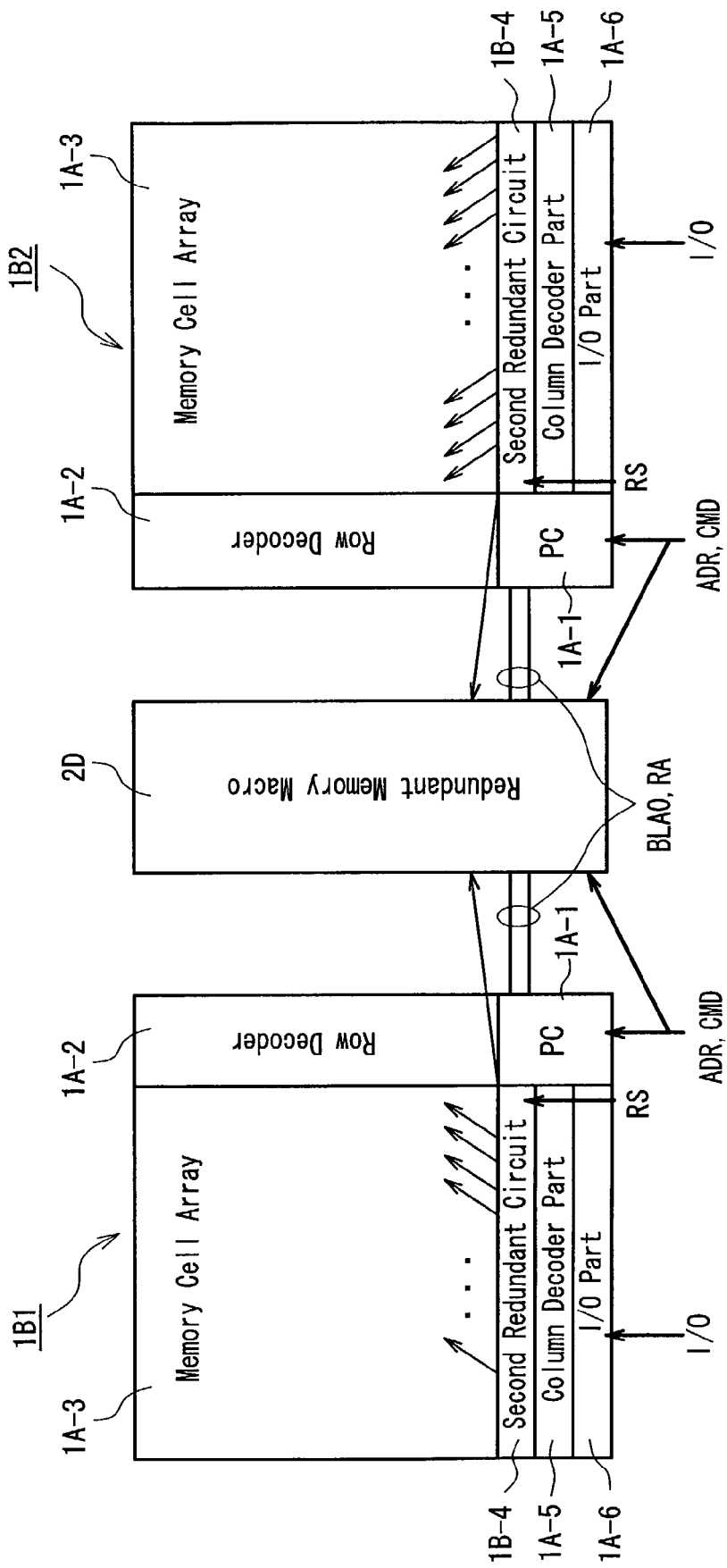
FIG. 15 is a block diagram showing an example of a configuration of a semiconductor integrated circuit according to Embodiment 4 of the present invention.

FIG. 15 is a block diagram showing an example of a configuration of a semiconductor integrated circuit according to Embodiment 4 of the present invention. In this embodiment, the configuration of a plurality of memory macros (1B1 and 1B2) is the same as that of Embodiment 2, except that the word lines are not connected to the redundant memory macro (2D), and this embodiment is different from Embodiment 2 primarily in the configuration of the redundant memory macro. This difference is the focus of the following description.

Figure 16:
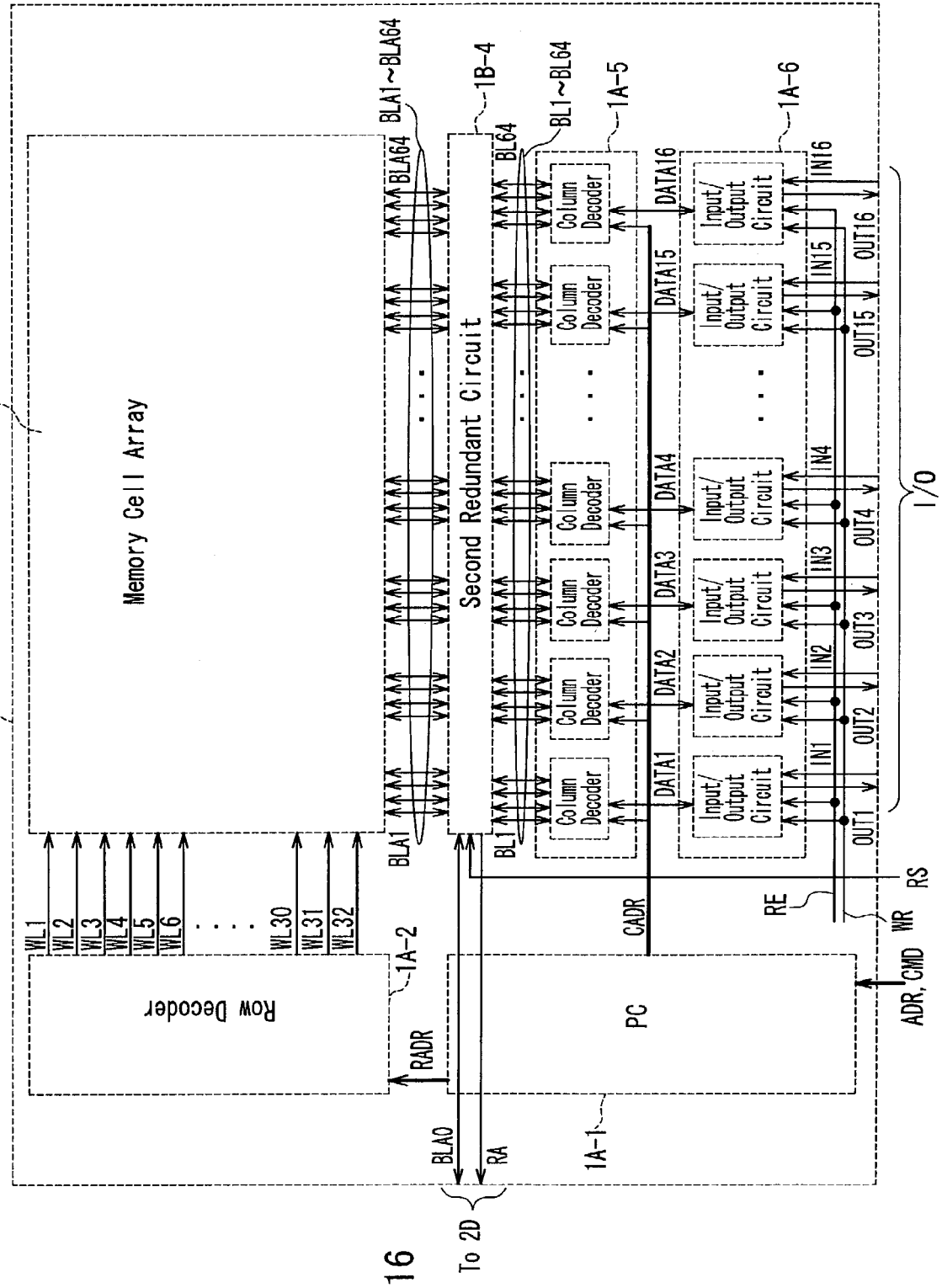
FIG. 16 is a block diagram showing the internal configuration of memory macros 1B1 and 1B2 of FIG. 15.

FIG. 16 is a block diagram showing the internal configuration of the memory macros 1B1 and 1B2. The configuration in FIG. 16 is different from that of Embodiment 2 in FIG. 6 in that the word lines connected to the redundant memory macro are deleted.

Figure 17:
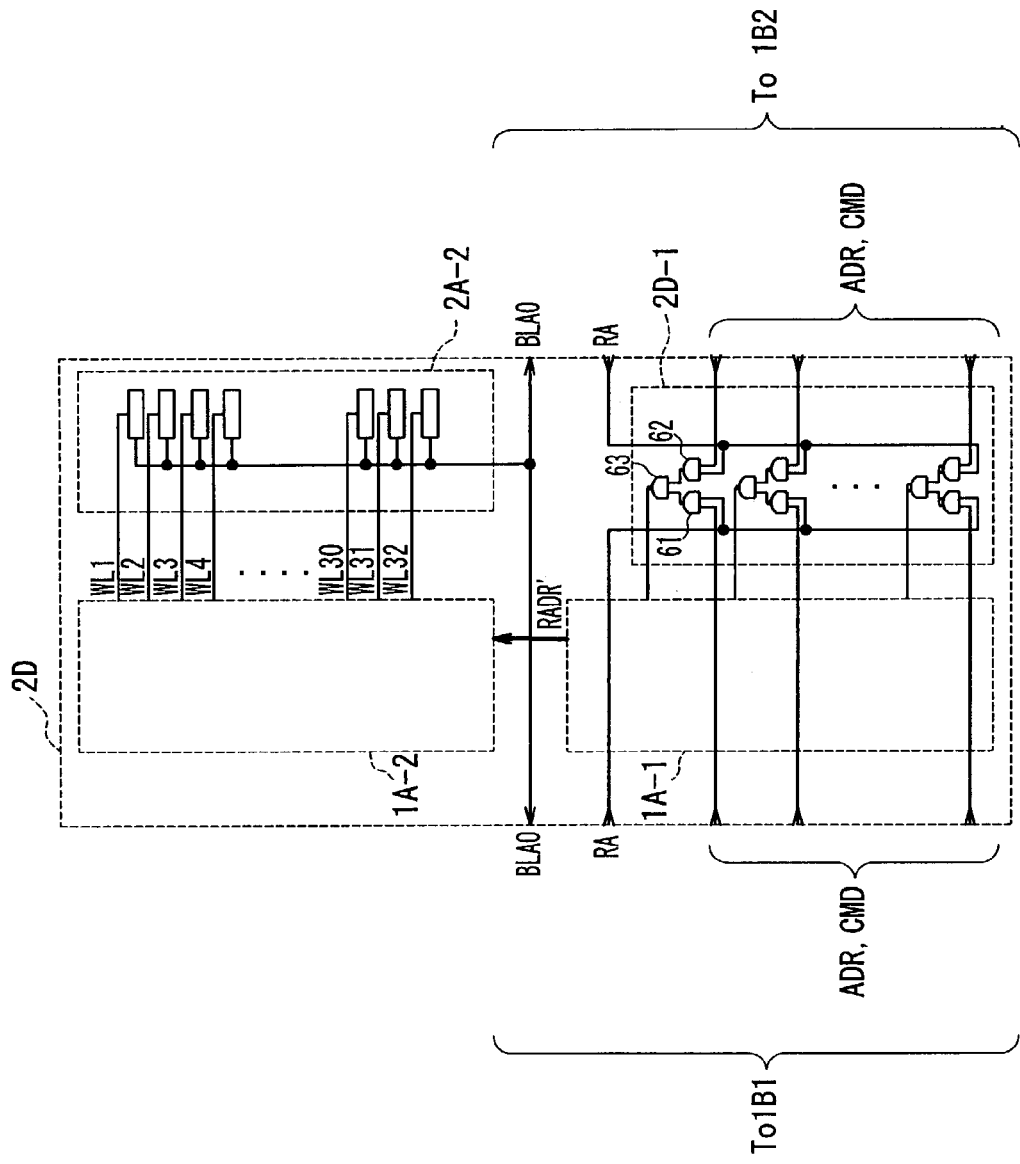
FIG. 17 is a circuit diagram showing a partial configuration of a redundant memory macro 2D of FIG. 15.

FIG. 17 is a circuit diagram showing a partial configuration of a redundant memory macro 2D. In FIG. 17, the redundant memory macro 2D includes a peripheral circuit 1A-1, a row decoder 1A-2, an external signal connection circuit 2D-1, and a redundant memory cell array 2A-2. The external signal connection circuit 2D-1 is connected to the plurality of memory macros 1B1 and 1B2 by respective address signal lines ADR, command signal lines CMD and the redundant signal lines RA. The redundant memory cell array 2A-2 is connected to the row decoder 1A-2 by the word lines WL1 to WL32, and the row decoder 1A-2 is connected to the peripheral circuit 1A-1 by an internal row address signal line RADR' and is connected to the plurality of memory macros 1B1 and 1B2 by a redundant bit line BLA0.

Hereinafter, the operation of a semiconductor integrated circuit having such a configuration will be described.

First, the case where there is no defect in the plurality of memory macros 1B1 and 1B2 and the redundant memory macro 2D is not used will be described.

First, in FIG. 16, a reset signal (RS) is input to the second redundant circuit 1B-4 from an external circuit. At this point, when there is no defect anywhere in the memory macros 1B1 and 1B2, fuses are not broken, so that an output signal of the logic "H" level is transmitted from an inverter 11 (see FIG. 7), and thus the bit line BL64 is connected to the second bit line BLA64. Thereafter, a bit line BL63 is connected to a second bit line BLA63, and finally, a bit line BL1 is connected to a second bit line BLA1.

At this time, the redundant signal line RA connected to the redundant memory macro 2D is turned to the logic "L" level, and a signal is not transmitted to the redundant bit line BLA0. In response to the logic "L" level of the redundant signal line RA, an output signal from a NAND circuit 61 in FIG. 17 is turned to the logic "H" level, and an output signal from a NAND circuit 62 is also turned to the logic "H" level, and a command signal and an address signal input to the peripheral circuit 1A-1, which are output signals from a NAND circuit 63, are all in the logic "L" level.

Then, in FIG. 16, an address signal (ADR) is input from an external circuit, and an internal row address signal RADR and an internal column address signal CADR are generated by the peripheral circuit 1A-1 in the memory macros 1B1 and 1B2. In response to this internal row address signal, one of the 32 word lines is selected by the row decoder 1A-2 in the memory macros 1B1 and 1B2. In response to the internal column address signal, one of the four bit lines is selected by a column decoder in the column decoder part 1A-5.

Then, in response to a command signal (CMD) input from an external circuit, a read-out signal (RE) or a write signal (WR) is generated by the peripheral circuit 1A-1 in the memory macros 1B1 and 1B2. In response to the read-out signal or the write signal, data transfer between the input/output circuits in the I/O part 1A-6 and the column decoders is performed via the input/output data lines DATA1 to DATA16.

Furthermore, data is written or read out with respect to a desired memory cell in the memory cell array 1A-3 via the bit line selected previously by the column decoder part 1A-5 and the second bit line selected by the second redundant circuit 1B-4.

Next, this embodiment will be described by taking as an example the case where the second bit line BLA64 of the memory macro 1B1 is defective and there is no defect in the memory macro 1B2.

When the second bit line BLA64 in the memory macro 1B1 is defective, the fuse 12 in the second redundant circuit 1B-4 thereof is broken by a laser trimming device beforehand. Then, a reset signal (RS) is input from an external circuit to the second redundant circuit 1B-4 in the memory macro 1B1, but since the fuse 12 is broken, an output signal of the logic "H" level is not transmitted from the inverter 11 (see FIG. 7). Therefore, the logic "L" level is input to the inverter 13 via an NMOS transistor 17, and this is latched in an inverter 14. Thus, the bit line BL64 is connected to the second bit line BLA63. Thereafter, a bit line BL63 is connected to a second bit line BLA62. Finally, a bit line BL1 is connected to a redundant bit line BLA0.

On the other hand, there is no defect and no fuse is broken in the memory macro 1B2, so that an output signal of the logic "H" level is transmitted from the inverter 11, and thus the bit line BL64 is connected to the second bit line BLA64. Thereafter, a bit line BL63 is connected to a second bit line BLA63. Finally, a bit line BL1 is connected to a second bit line BLA1.

At this time, in the redundant memory macro 2D, the redundant signal line RA on the side of the memory macro 1B1 is in the logic "H" level, so that a signal of the bit line BL1 is transmitted to the redundant bit line BLA0. The redundant signal line RA on the side of the memory macro 1B2 is in the logic "L" level, so that a signal of the bit line BL1 is not transmitted to the redundant bit line BLA0. Furthermore, in response to the logic "H" level of the redundant signal line RA on the side of the memory macro 1B1, the NAND circuit 61 outputs inverse signals of the address signal (ADR) and the command signal (CMD). Furthermore, in response to the logic "L" level of the redundant signal line RA on the side of the memory macro 1B2, the NAND circuit 62 outputs a logic "H" level. In response to the output signals of the two NAND circuits 61 and 62, the NAND circuit 63 outputs a signal having the same phase of that of the address signal and the command signal of the memory macro 1B1.

Then, an address signal (ADR) is input from an external circuit, and an internal row address signal (RADR) and a redundant row address signal (RADR') are generated by the peripheral circuits 1A-1 of the memory macro 1B1 and the redundant memory macro 2D, respectively. In response to the internal row address signal and the redundant row address signal, one of the 32 word lines is selected by the row decoder 1A-2 of the memory macro 1B1 and the redundant memory macro 2D. In response to the internal column address signal (RADR), one of the four bit lines is selected by a column decoder in the column decoder part 1A-5.

Then, in FIG. 16, in response to a command signal (CMD) input from an external circuit, a read-out signal (RE) or a write signal (WR) is generated by the peripheral circuit 1A-1. In response to the read-out signal or the write signal, data transfer between the input/output circuits in the I/O part 1A-6 and the column decoders is performed via the input/output data lines DATA1 to DATA16.

Furthermore, data is written or read out with respect to a desired memory cell in the memory cell array 1A-3 via the bit line selected previously by the column decoder part 1A-5, the second bit line BLA61 to BLA1 selected by the second redundant circuit 1B-4, and the redundant bit line BLA0.

This configuration makes it possible to reduce the number of lines (word lines) to be connected and control the redundant word line or the redundant bit lines by the redundant memory macro alone, so that the redundant memory macro can be shared among a plurality of memory macros, regardless of whether the operation of the word lines or the bit lines is the same or different. Thus, the area efficiency and the repair efficiency can be improved.

Furthermore, the external signal connection circuit 2D-1 in the redundant memory macro 2D makes it possible to eliminate a connection delay of the word lines and the redundant word lines due to the on/off time of the switching transistors of Embodiment 1 with respect to a redundant signal in accordance with a memory macro to be repaired and to adjust the operation timing (shape waveform or do the like) of a signal of the word line transmitted to the redundant word line.

Embodiment 5

Figure 18:
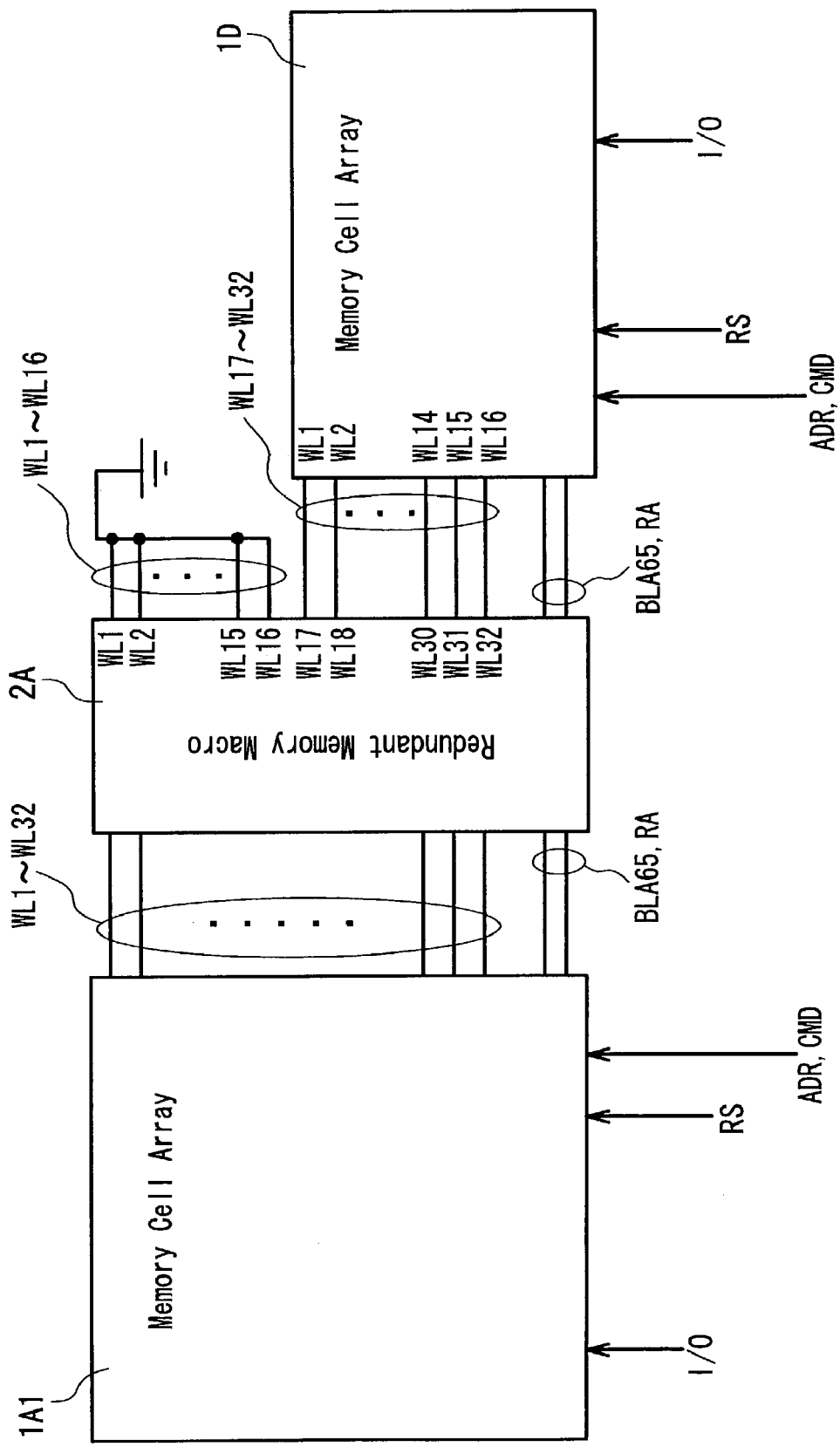
FIG. 18 is a block diagram showing an example of a configuration of a semiconductor integrated circuit according to Embodiment 5 of the present invention.

FIG. 18 is a block diagram showing an example of a configuration of a semiconductor integrated circuit according to Embodiment 5 of the present invention. This embodiment is different from Embodiment 1 in that one memory macro (1D) has the smaller number of word lines than that of the redundant memory macro. The configuration of the memory macro 1A1 and the internal configuration of the redundant memory macro 2A are the same as in Embodiment 1, so that different aspects primarily are described in the following description.

In FIG. 18, the memory macro 1A1 and the redundant memory macro 2A have 32 word lines, whereas the memory macro 1D has 16 word lines. Therefore, in the redundant memory macro 2A, word lines on the side of the memory macro 1D that are not used are fixed to a ground potential (VSS).

Figure 19:
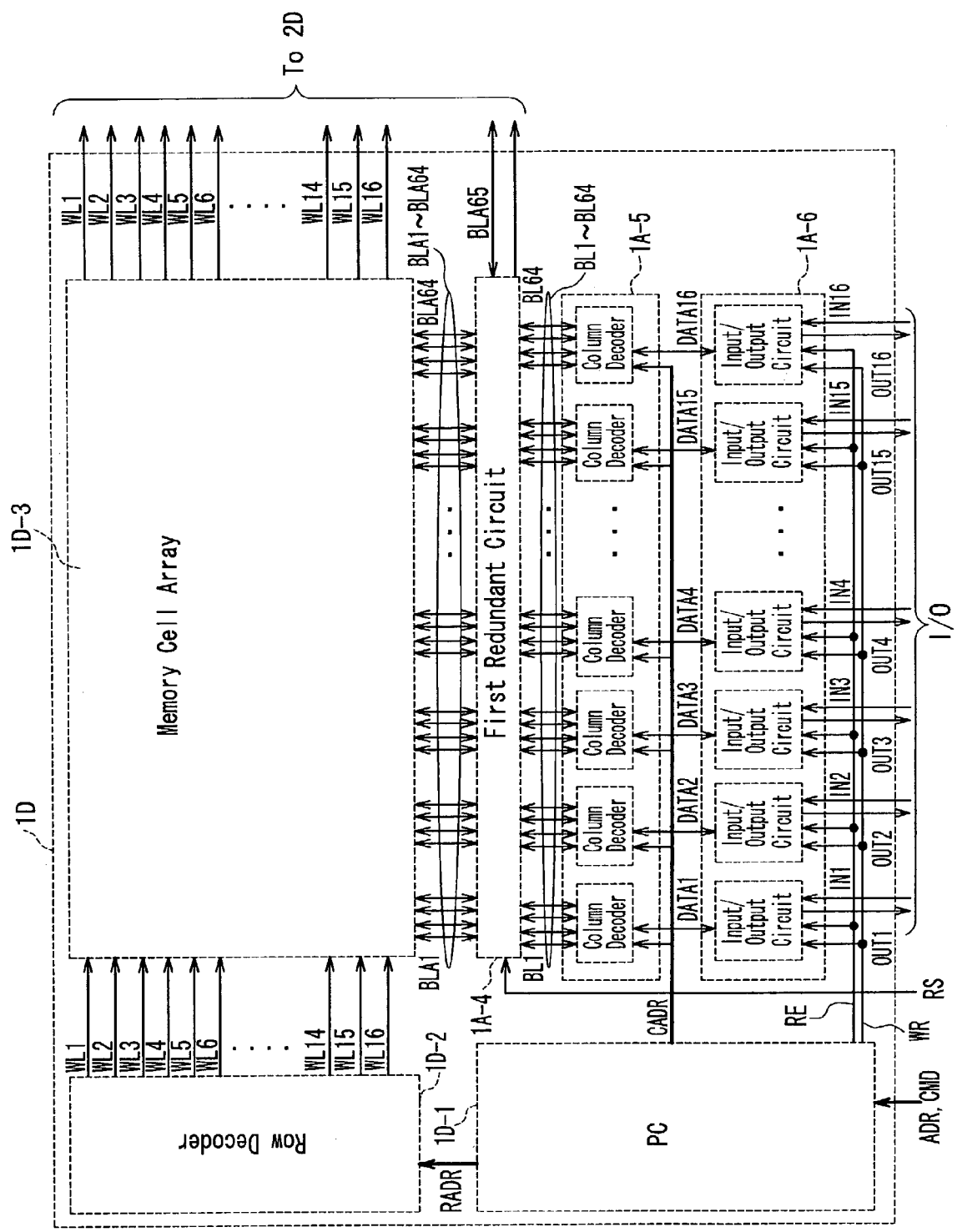
FIG. 19 is a block diagram showing the internal configuration of a memory macro 1D of FIG. 18.

FIG. 19 is a block diagram showing the internal configuration of the memory macro 1D. In FIG. 19, the memory macro 1D includes a peripheral circuit (PC) 1D-1, a row decoder 1D-2, a memory cell array 1D-3 connected to 16 word lines WL1 to WL16 and 64 second bit lines BLA1 to BLA64, a first redundant circuit 1A-4, a column decoder part 1A-5, and an I/O part 1A-6.

Hereinafter, the operation of a semiconductor integrated circuit having such a configuration will be described. The operation is the same as that in Embodiment 1, in the case where there is no defect in either of the memory macro 1A1 and 1D and the case where the second bit line BLA1 in the memory macro 1A1 is defective and there is no defect in the memory macro 1D. Therefore, the case where the second bit line BLA1 in the memory macro 1D is defective and there is no defect in the memory macro 1A1 will be described.

When the second bit line BLA1 in the memory macro 1D is defective, the fuse 12 in the first redundant circuit 1A-4 thereof is broken by a laser trimming device beforehand. Then, a reset signal (RS) is input from an external circuit to the first redundant circuit 1A-4, but since the fuse 12 is broken, an output signal of the logic "H" level is not transmitted from the inverter 11 (see FIG. 3). Therefore, the logic "L" level is input to the inverter 13 via an NMOS transistor 17, and this is latched in an inverter 14. Thus, the bit line BL1 is connected to the second bit line BLA2. Thereafter, a bit line BL2 is connected to a second bit line BLA3. Finally, a bit line BL64 is connected to a redundant bit line BLA65.

On the other hand, there is no defect and no fuse is broken in the memory macro 1A1, so that an output signal of the logic "H" level is transmitted from the inverter 11, and thus the bit line BL1 is connected to the second bit line BLA1. Thereafter, a bit line BL2 is connected to a second bit line BLA2. Finally, a bit line BL64 is connected to a second bit line BLA64.

At this time, in the redundant memory macro 2A, the redundant signal line RA on the side of the memory macro 1D is in the logic "H" level, so that a signal of the bit line BL64 is transmitted to the redundant bit line BLA65. The redundant signal line RA on the side of the memory macro 1A1 is in the logic "L" level, so that a signal of the bit line BL64 is not transmitted to the redundant bit line BLA65. Furthermore, in the redundant memory macro 2A, in response to the logic "H" level of the redundant signal line RA on the side of the memory macro 1D, an output signal from the NOR circuit 53 (see FIG. 4) is turned to the logic "L" level, and the redundant word lines WLA1 to WLA32 are not fixed at the logic "L" level.

In response to the logic "H" level of the redundant signal line RA on the side of the memory macro ID and an output signal of the logic "L" level from an inverter 52, switching transistors 32 and 42 are turned on, so that the redundant word lines (WLA1 to WLA16) that are not used are fixed at VSS, and the word lines WL1 to WL16 in the memory macro ID are connected to the redundant word lines WLA17 to WLA32, so that a signal is transmitted. At the same time, in response to the logic "L" level of the redundant signal line RA on the side of the memory macro 1A1 and an output signal of the logic "H" level from an inverter 51, switching transistors 31 and 41 are turned off, so that the word lines WL1 to WL32 in the memory macro 1A1 are not connected to the redundant word lines WLA1 to WLA32, so that a signal is not transmitted.

Then, in the memory macro 1A1, an address signal (ADR) is input from an external circuit and an internal row address signal (RADR) and an internal column address signal (CADR) are generated by the peripheral circuit 1A-1. In response to the internal row address signal, one of the 32 word lines is selected by the row decoder 1A-2. In response to the internal column address signal, one of the four bit lines is selected by a column decoder in the column decoder part 1A-5.

Then, in response to a command signal (CMD) input from an external circuit, a read-out signal (RE) or a write signal (WR) is generated by the peripheral circuit 1A-1. In response to the read-out signal or the write signal, data transfer between the input/output circuits in the I/O part 1A-6 and the column decoders is performed via the data lines DATA1 to DATA16. Furthermore, data is written or read out with respect to a desired memory cell in the memory cell array 1A-3 via the bit line selected previously by the column decoder part 1A-5 and the second bit line BLA1 to BLA64 selected by the first redundant circuit 1A-4.

Then, in the memory macro ID, an address signal (ADR) is input from an external circuit, and an internal row address signal (RADR) and an internal column address signal (CADR) are generated by the peripheral circuit 1D-1. In response to this internal row address signal, one of the 16 word lines is selected by the row decoder 1D-2. In response to the internal column address signal, one of the four bit lines is selected by a column decoder in the column decoder part 1A-5.

Then, in response to a command signal (CMD) input from an external circuit, a read-out signal (RE) or a write signal (WR) is generated by the peripheral circuit 1D-1. In response to the read-out signal or the write signal, data transfer between the input/output circuits in the I/O part 1A-6 and the column decoders is performed via the data lines DATA1 to DATA16. Furthermore, data is written or read out with respect to a desired memory cell in the memory cell array 1A-3 and the redundant memory cell array 1D-3 via the bit line selected by the column decoder part 1A-5, the second bit line BLA2 to BLA64 selected by the first redundant circuit 1A-4, and the redundant bit line BLA65.

This configuration makes it possible to disconnect the redundant word lines and the redundant bit lines completely from the word lines and the bit lines of a normal memory macro, so that the redundant memory macro can be shared among a plurality of memory macros, regardless of whether the operation timing of the word lines and the bit lines is the same or different or even if the number of the word lines is different in the plurality of memory macros. Thus, the area efficiency and the repair efficiency can be improved.

Embodiment 6

Figure 20:
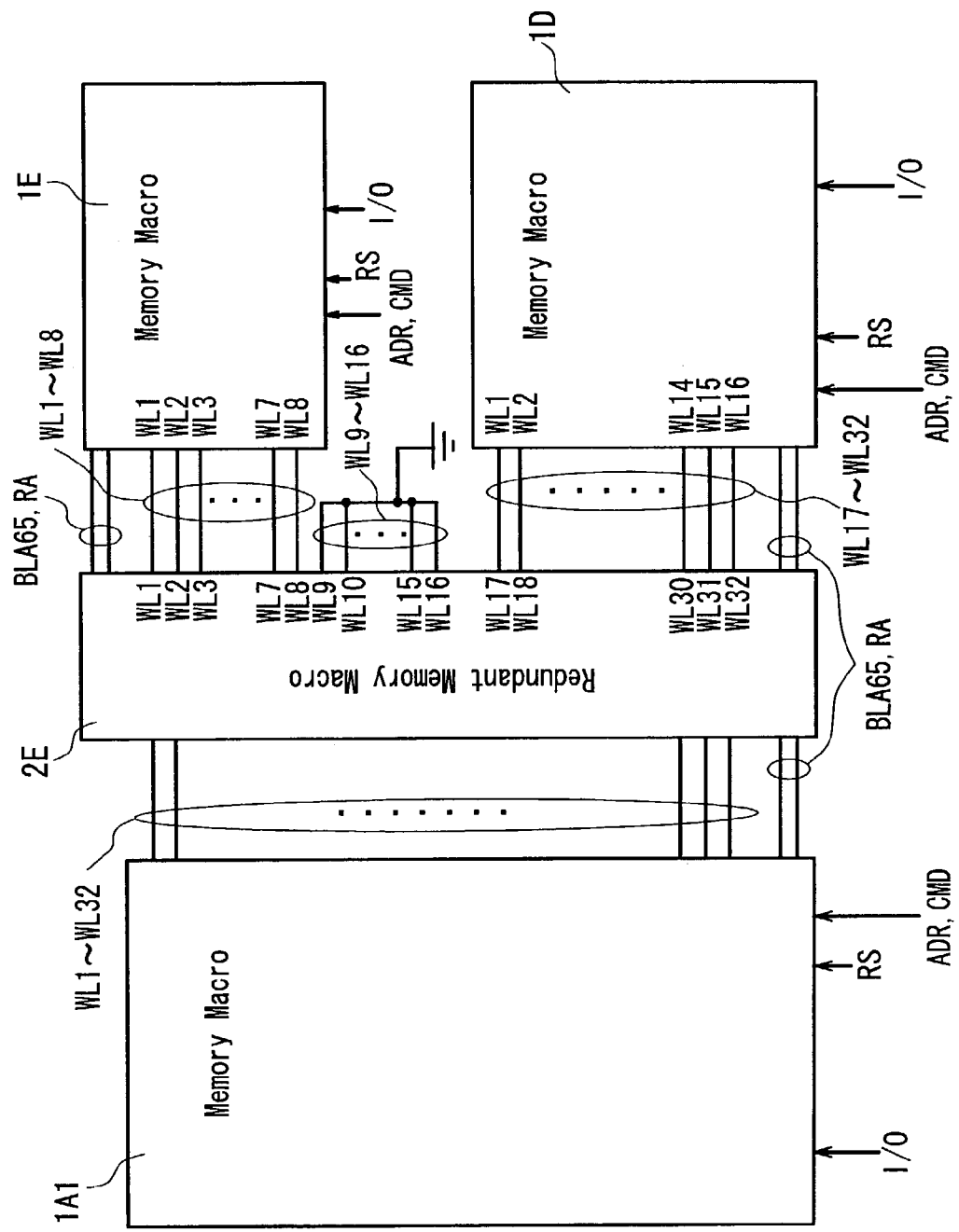
FIG. 20 is a block diagram showing an example of a configuration of a semiconductor integrated circuit according to Embodiment 6 of the present invention.

FIG. 20 is a block diagram showing an example of a configuration of a semiconductor integrated circuit according to Embodiment 6 of the present invention. The semiconductor integrated circuit of this embodiment includes three memory macros having a different number of word lines and a redundant memory macro for repairing these three memory macros. In FIG. 20, the memory macro 1A1 has the same configuration as that of Embodiment 1 (32 word lines), and the memory macro 1D has the same configuration as that of Embodiment 5 (16 word lines). The memory macro 1E has 8 word lines. In this embodiment, an example in which three memory macros are mounted is described, but the same is true for the cases in which four or more memory macros are mounted. A redundancy repair of this configuration may be present in a plurality of sites in a semiconductor integrated circuit. The numbers of word lines, bit lines and input/output data lines in the memory macros 1A1, 1D, and 1E and the redundant memory macro 2E are not limited to those in this embodiment.

In FIG. 20, the redundant memory macro 2E is connected to the memory macro 1E via 8 word lines WL1 to WL8, a redundant bit line BLA65, and a redundant signal line RA. In the redundant memory macro 2E, word lines (WL9 to WL16) on the side of the memory macro 1D and the memory macro 1E that are not used are connected to a ground potential (VSS).

Figure 21:
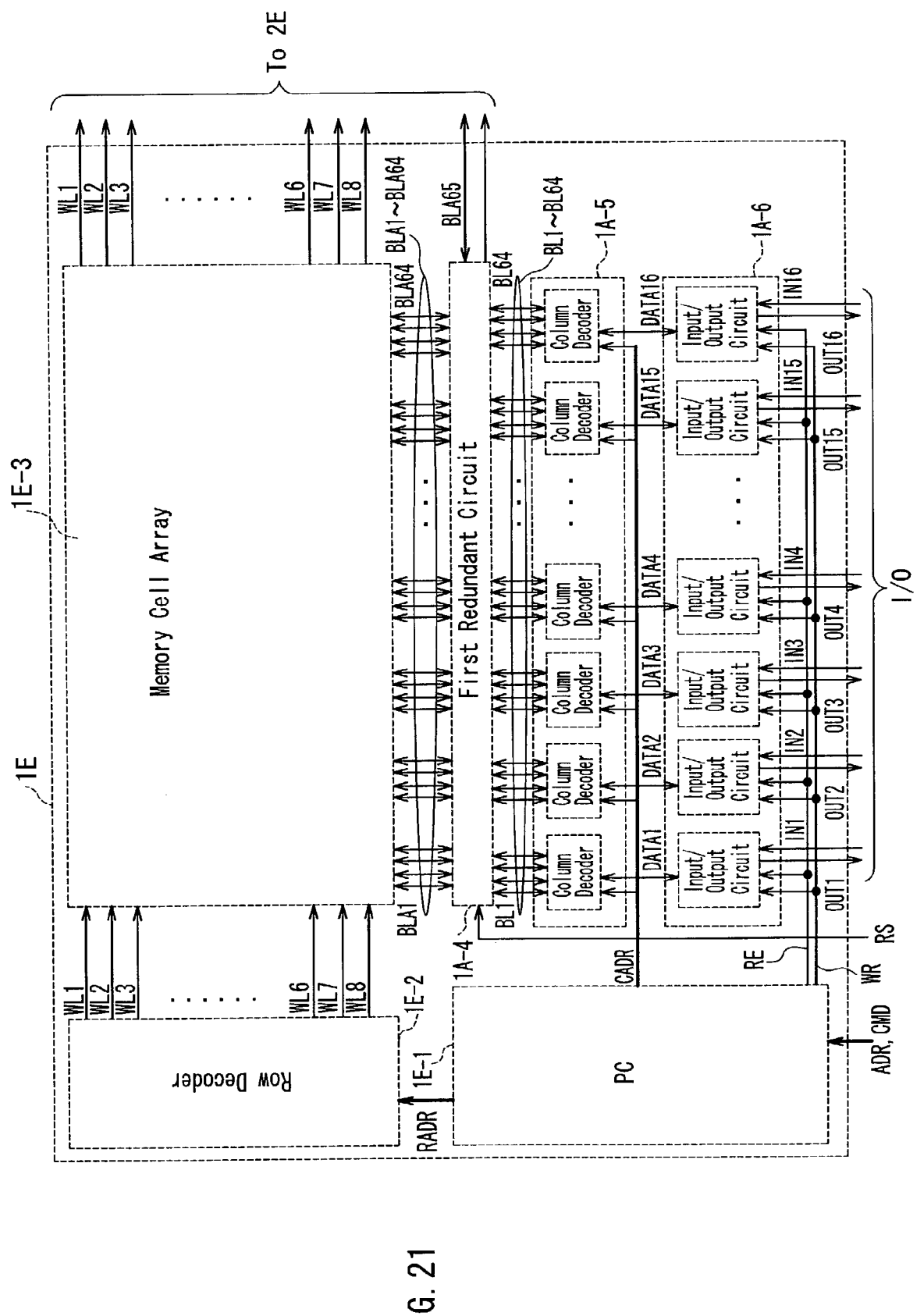
FIG. 21 is a block diagram showing the internal configuration of a memory macro 1E of FIG. 20.

FIG. 21 is a block diagram showing the internal configuration of the memory macro 1E. In FIG. 21, the memory macro 1E includes a peripheral circuit (PC) 1E-1, a row decoder 1E-2, a memory cell array 1E-3 connected to 8 word lines WL1 to WL8 and 64 second bit lines BLA1 to BLA64, a first redundant circuit 1A-4, a column decoder part 1A-5, and an I/O part 1A-6.

Figure 22:
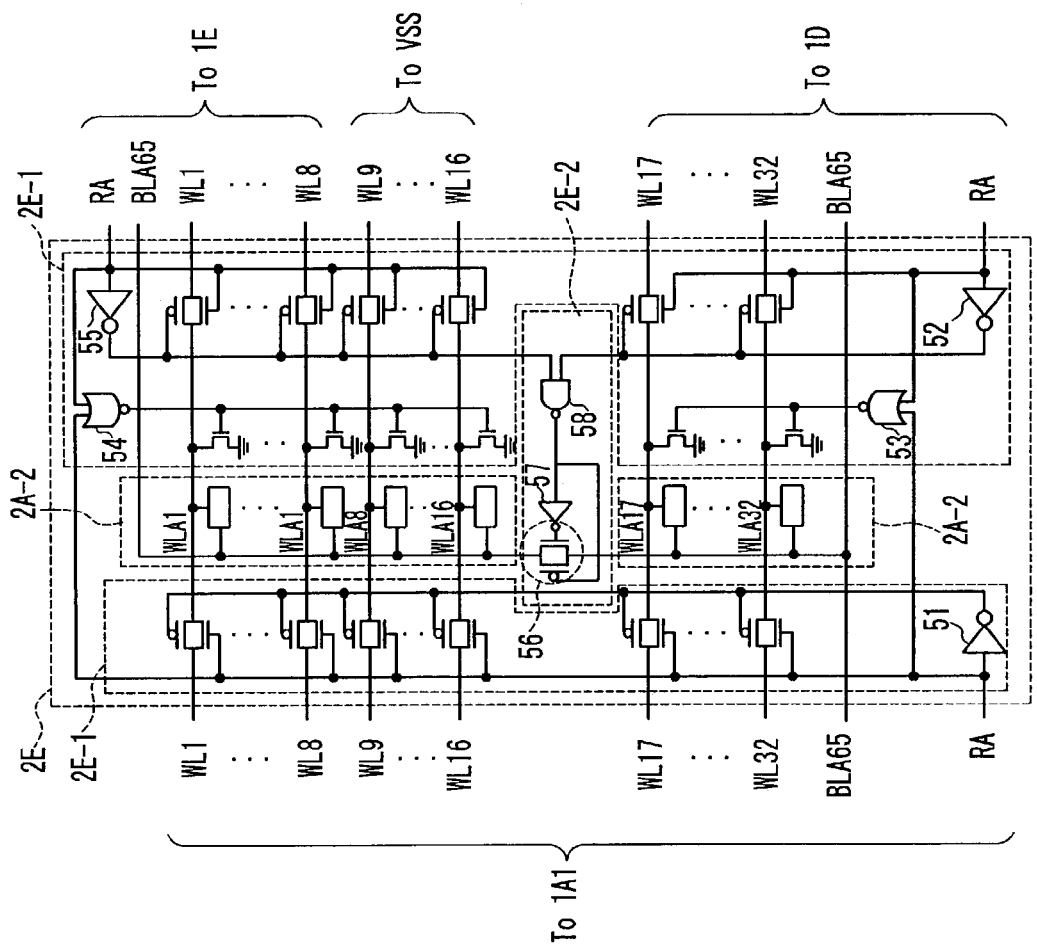
FIG. 22 is a circuit diagram showing a partial configuration of a redundant memory macro 2E of FIG. 20.

FIG. 22 is a circuit diagram showing a partial configuration of the redundant memory macro 2E. In FIG. 22, the redundant memory macro 2E includes word line connection circuits 2E-1, a redundant bit line connection circuit 2E-2 and a redundant memory cell array 2A-2. The word line connection circuits 2E-1 are connected to the redundant memory cell array 2A-2 by the redundant word lines WLA1 to WLA32, and the word line connection circuits 2E-1 are connected to the redundant bit line connection circuit 2E-2 by an inverse signal of the redundant signal line RA from the memory macro 1D and an inverse signal of the redundant signal line RA from the memory macro 1E. The redundant bit line connection circuit 2E-2 is connected to the redundant memory cell array 2A-2 by the redundant bit line BLA65.

Hereinafter, the operation of a semiconductor integrated circuit having such a configuration will be described.

First, the case where there is no defect in the plurality of memory macros 1A1, 1D and 1E and the redundant memory macro 2E is not used will be described.

First, a reset signal (RS) is input to the first redundant circuits 1A-4 of all the memory macros from an external circuit. At this time, when there is no defect anywhere in the memory macros 1A1, 1D and 1E, fuses are not broken, so that an output signal of logic "H" level is transmitted from an inverter 11 (see FIG. 3), and the bit line BL1 is connected to the second bit line BLA1. Thereafter, a bit line BL2 is connected to a second bit line BLA2. Finally, a bit line BL64 is connected to a second bit line BLA64.

At this time, all the redundant signal lines RA connected to the redundant memory macro 2E are in the logic "L" level, and a signal is not transmitted to the redundant bit line BLA65. In response to the logic "L" level of the redundant signal lines RA, an output signal from a NOR circuit 53 and an output signal from a NOR circuit 54 in the redundant memory macro 2E are both in the logic "H" level, so that the redundant word lines WLA1 to WLA32 are fixed at the logic "L" level. In response to the logic "L" level of the redundant signal line RA and an output signal of the logic "H" level from inverters 51, 52 and 55, switching transistors in the word line connection circuits 2E-1 are turned off, so that the word lines WL1 to WL32 in the memory macro 1A1, the word lines WL1 to WL16 in the memory macro 1D and the word lines WL1 to WL8 in the memory macro 1E are disconnected from the redundant word lines WLA1 to WLA32.

Then, an address signal (ADR) is input from an external circuit, and an internal row address signal (RADR) and an internal column address signal (CADR) are generated by the peripheral circuit 1A-1 in the memory macro 1A1. In response to this internal row address signal, one of the 32 word lines is selected by the row decoder 1A-2. In response to the internal column address signal, one of the four bit lines is selected by a column decoder in the column decoder part 1A-5.

Then, in response to a command signal (CMD) input from an external circuit, a read-out signal (RE) or a write signal (WR) is generated by the peripheral circuit 1A-1. In response to the read-out signal or the write signal, data transfer between the input/output circuits in the I/O part 1A-6 and the column decoders is performed via the input/output data lines DATA1 to DATA16. Furthermore, data is written or read out with respect to a desired memory cell in the memory cell array 1A-3 via the bit line selected previously by the column decoder part 1A-5 and the second bit line selected by the first redundant circuit 1A-4.

Similarly, an internal row address signal (RADR) and an internal column address signal (CADR) are generated by the peripheral circuit 1D-1 in the memory macro 1D. In response to this internal row address signal, one of the 16 word lines is selected by the row decoder 1D-2. In response to the internal column address signal, one of the four bit lines is selected by a column decoder in the column decoder part 1A-5.

Then, in response to a command signal (CMD) from an external circuit, a read-out signal (RE) or a write signal (WR) is generated by the peripheral circuit 1D-1. In response to the read-out signal or the write signal, data transfer between the input/output circuits in the I/O part 1A-6 and the column decoders is performed via the input/output data lines DATA1 to DATA16. Furthermore, data is written or read out with respect to a desired memory cell in the memory cell array 1A-3 via the bit line selected previously by the column decoder part 1A-5 and the second bit line selected by the first redundant circuit 1A-4.

Similarly, an internal row address signal (RADR) and an internal column address signal (CADR) are generated by the peripheral circuit 1E-1 in the memory macro 1E. In response to this internal row address signal, one of the 8 word lines is selected by the row decoder 1E-2. In response to the internal column address signal, one of the four bit lines is selected by a column decoder in the column decoder part 1A-5.

Then, in response to a command signal (CMD) from an external circuit, a read-out signal (RE) or a write signal (WR) is generated by the peripheral circuit 1E-1. In response to the read-out signal or the write signal, data transfer between the input/output circuits in the I/O part 1A-6 and the column decoders is performed via the input/output data lines DATA1 to DATA16. Furthermore, data is written or read out with respect to a desired memory cell in the memory cell array 1A-3 via the bit line selected by the column decoder part 1A-5 and the second bit line selected by the first redundant circuit 1A-4.

Then, a case where the second bit line BLA1 of the memory macro 1A1 is defective and there is no defect in the memory macros 1D and 1E will be described.

When the second bit line BLA1 in the memory macro 1A1 is defective, the fuse 12 (see FIG. 3) in the first redundant circuit 1A-4 in the memory macro 1A1 is broken by a laser trimming device beforehand. Then, a reset signal (RS) is input from an external circuit to the first redundant circuit 1A-4 in the memory macro 1A1, but since the fuse 12 is broken, an output signal of logic "H" level is not transmitted from the inverter 11. Therefore, the logic "L" level is input to the inverter 13 via an NMOS transistor 17, and this is latched in an inverter 14. Thus, the bit line BL1 is connected to the second bit line BLA2. Thereafter, a bit line BL2 is connected to a second bit line BLA3. Finally, a bit line BL64 is connected to the redundant bit line BLA65.

On the other hand, there is no defect and no fuse is broken in the memory macro 1D and 1E, so that an output signal of logic "H" level is transmitted from the inverter 11, and the bit line BL1 is connected to the second bit line BLA1. Thereafter, a bit line BL2 is connected to a second bit line BLA2. Finally, a bit line BL64 is connected to a second bit line BLA64.

At this time, in the redundant memory macro 2E, the redundant signal line RA on the side of the memory macro 1A1 is in the logic "H" level, and a signal of the bit line BL64 is transmitted to the redundant bit line BLA65. The redundant signal lines RA on the side of the memory macros 1D and 1E are in the logic "L" level, so that a signal of the bit line BL64 is not transmitted to the redundant bit line BLA65. Furthermore, in response to the logic "H" level of the redundant signal line RA on the side of the memory macro 1A1, output signals of the NOR circuits 53 and 54 in FIG. 22 are turned to be in the logic "L" level, so that the redundant word lines WLA1 to WLA32 are not fixed to the logic "L" level. In response to the logic "H" level of the redundant signal line RA on the side of the memory macro 1A1 and an output signal of the logic "L" level from inverter 51, switching transistors connected to the word lines WL1 to WL32 on the side of the memory macro 1A1 are turned on, and the word lines WL1 to WL32 in the memory macro 1A1 are connected to the redundant word lines WLA1 to WLA32, so that a signal is transmitted.

At the same time, in response to the logic "L" level of the redundant signal lines RA connected to the memory macros 1D and 1E and an output signal of the logic "H" level from inverters 52 and 55, switching transistors connected to the word lines WL1 to WL8 on the memory macro 1D, the word lines WL17 to WL32 on the side of the memory macro 1E and the word lines WL9 to WL16 fixed to a ground potential (VSS) are turned off, and the word lines WL1 to WL8 in the memory macro 1E, the word lines WL9 to WL16 that are not used and fixed to the VSS level, and the word lines WL1 to WL16 in the memory macro 1D are disconnected from the redundant word lines WLA1 to WLA32, so that a signal is not transmitted.

Then, in the memory macro 1A1, an address signal (ADR) is input from an external circuit, and an internal row address signal (RADR) and an internal column address signal (CADR) are generated by the peripheral circuit 1A-1. In response to this internal row address signal, one of the 32 word lines is selected by the row decoder 1A-2. In response to the internal column address signal, one of the four bit lines is selected by a column decoder in the column decoder part 1A-5.

Then, in response to a command signal (CMD) input from an external circuit, a read-out signal (RE) or a write signal (WR) is generated by the peripheral circuit 1A-1. In response to the read-out signal or the write signal, data transfer between the input/output circuits in the I/O part 1A-6 and the column decoders is performed via the input/output data lines DATA1 to DATA16. Furthermore, data is written or read out with respect to desired memory cells in the memory cell array 1A-3 and the redundant memory cell array 2A-2 via the bit line selected previously by the column decoder part 1A-5, the second bit lines BLA2 to BLA64 selected by the first redundant circuit 1A-4 and the redundant bit line BLA65.

Similarly, in the memory macro 1D, an address signal (ADR) is input from an external circuit, and an internal row address signal (RADR) and an internal column address signal (CADR) are generated by the peripheral circuit 1D-1. In response to this internal row address signal, one of the 16 word lines is selected by the row decoder 1D-2. In response to the internal column address signal, one of the four bit lines is selected by a column decoder in the column decoder part 1A-5.

Then, in response to a command signal (CMD) from an external circuit, a read-out signal (RE) or a write signal (WR) is generated by the peripheral circuit ID-1. In response to the read-out signal or the write signal, data transfer between the input/output circuits in the I/O part 1A-6 and the column decoders is performed via the input/output data lines DATA1 to DATA16. Furthermore, data is written or read out with respect to a desired memory cell in the memory cell array 1A-3 via the bit line selected previously by the column decoder part 1A-5 and the second bit line selected by the first redundant circuit 1A-4.

Similarly, in the memory macro 1E, an address signal (ADR) is input from an external circuit, an internal row address signal (RADR) and an internal column address signal (CADR) are generated by the peripheral circuit 1E-1. In response to this internal row address signal, one of the 8 word lines is selected by the row decoder 1E-2. In response to the internal column address signal, one of the four bit lines is selected by a column decoder in the column decoder part 1A-5.

Then, in response to a command signal (CMD) from an external circuit, a read-out signal (RE) or a write signal (WR) is generated by the peripheral circuit 1E-1. In response to the read-out signal or the write signal, data transfer between the input/output circuits in the I/O part 1A-6 and the column decoders is performed via the input/output data lines DATA1 to DATA16. Furthermore, data is written or read out with respect to a desired memory cell in the memory cell array 1A-3 via the bit line selected previously by the column decoder part 1A-5 and the second bit line selected by the first redundant circuit 1A-4.

Next, a case where the second bit line BLA1 of the memory macro 1D is defective and there is no defect in the memory macros 1A1 and 1E will be described.

When the second bit line BLA1 in the memory macro 1D is defective, the fuse 12 in the first redundant circuit 1A-4 in the memory macro 1D is broken by a laser trimming device beforehand. Then, a reset signal (RS) is input from an external circuit to the first redundant circuit 1A-4 in the memory macro 1D, but since the fuse 12 is broken, an output signal of logic "H" level is not transmitted from the inverter 11. Therefore, the logic "L" level is input to the inverter 13 via an NMOS transistor 17, and this is latched in an inverter 14. Thus, the bit line BL1 is connected to the second bit line BLA2. Thereafter, a bit line BL2 is connected to a second bit line BLA3. Finally, a bit line BL64 is connected to the redundant bit line BLA65.

On the other hand, there is no defect and no fuse is broken in the memory macro 1A1, so that an output signal of logic "H" level is transmitted from the inverter 11, and the bit line BL1 is connected to the second bit line BLA1. Thereafter, a bit line BL2 is connected to a second bit line BLA2. Finally, a bit line BL64 is connected to a second bit line BLA64.

At this time, in the redundant memory macro 2A, the redundant signal line RA connected to the memory macro 1D is turned to the logic "H" level, and a signal of the bit line BL64 is transmitted to the redundant bit line BLA65. The redundant signal lines RA connected to the memory macro 1A1 is turned to the logic "L" level, so that a signal of the bit line BL64 in the memory macro 1A1 is not transmitted to the redundant bit line BLA65. Also, the redundant signal lines RA connected to the memory macro 1E are turned to the logic "L" level, so that a signal of the bit line BL64 in the memory macro 1E is not transmitted to the redundant bit line BLA65.

Furthermore, in response to the logic "H" level of the redundant signal line RA connected to the memory macro 1D, an output signal of the NOR circuit 53 in FIG. 22 is turned to be in the logic "L" level, so that the redundant word lines WLA17 to WLA32 are not fixed at the logic "L" level. In response to the logic "L" level of the redundant signal lines RA connected to the memory macros 1A1 and 1E, an output signal of the NOR circuit 54 in FIG. 22 is turned to be in the logic "H" level, so that the redundant word lines WLA1 to WLA16 are fixed at the logic "L" level.

Furthermore, in response to the logic "H" level of the redundant signal lines RA connected to the memory macro 1D and an output signal of the logic "L" level from inverter 52, switching transistors connected to the word lines WL17 to WL32 on the side of the memory macro 1D are turned on, so that the word lines WL1 to WL16 in the memory macro 1D are connected to the redundant word lines WLA17 to WLA32, so that a signal is transmitted.

At the same time, in response to the logic "L" level of the redundant signal lines RA connected to the memory macro 1A1 and an output signal of the logic "H" level from inverter 51, switching transistors connected to the word lines WL1 to WL32 on the side of the memory macro 1A1 are turned off, so that the word lines WL1 to WL32 in the memory macro 1A1 are disconnected from the redundant word lines WLA1 to WLA32, and a signal is not transmitted.

Furthermore, in response to the logic "L" level of the redundant signal lines RA connected to the memory macro 1E and an output signal of the logic "H" level from inverter 55, switching transistors connected to the word lines WL1 to WL8 on the side of the memory macro 1E are turned off, so that the word lines WL1 to WL8 in the memory macro 1E are disconnected from the redundant word lines WLA1 to WLA8, and a signal is not transmitted.

Then, in the memory macro 1A1, an address signal (ADR) is input from an external circuit, and an internal row address signal (RADR) and an internal column address signal (CADR) are generated by the peripheral circuit 1A-1. In response to this internal row address signal, one of the 32 word lines is selected by the row decoder 1A-2. In response to the internal column address signal, one of the four bit lines is selected by a column decoder in the column decoder part 1A-5.

Then, a command signal (CMD) is input from an external circuit, and a read-out signal (RE) or a write signal (WR) is generated by the peripheral circuit 1A-1. In response to the read-out signal or the write signal, data transfer between the input/output circuits in the I/O part 1A-6 and the column decoders is performed via the input/output data lines DATA1 to DATA16. Furthermore, data is written or read out with respect to desired memory cells in the memory cell array 1A-3 via the bit line selected by the column decoder part 1A-5 and the second bit line selected by the first redundant circuit 1A-4.

Similarly, in the memory macro 1D, an address signal (ADR) is input from an external circuit, and an internal row address signal (RADR) and an internal column address signal (CADR) are generated by the peripheral circuit 1D-1. In response to this internal row address signal, one of the 16 word lines is selected by the row decoder 1D-2. In response to the internal column address signal, one of the four bit lines is selected by a column decoder in the column decoder part 1A-5.

Then, in response to a command signal (CMD) from an external circuit, a read-out signal (RE) or a write signal (WR) is generated by the peripheral circuit 1D-1. In response to the read-out signal or the write signal, data transfer between the input/output circuits in the I/O part 1A-6 and the column decoders is performed via the input/output data lines DATA1 to DATA16. Furthermore, data is written or read out with respect to a desired memory cell in the memory cell array 1A-3 and the redundant memory cell array 2A-2 via the bit line selected by the column decoder part 1A-5, the second bit lines BLA2 to BLA64 selected by the first redundant circuit 1A-4 and the redundant bit line BLA65.

Similarly, in the memory macro 1E, an address signal (ADR) is input from an external circuit, an internal row address signal (RADR) and an internal column address signal (CADR) are generated by the peripheral circuit 1E-1. In response to this internal row address signal, one of the 8 word lines is selected by the row decoder 1E-2. In response to the internal column address signal, one of the four bit lines is selected by a column decoder in the column decoder part 1A-5.

Then, in response to a command signal (CMD) from an external circuit, a read-out signal (RE) or a write signal (WR) is generated by the peripheral circuit 1E-1. In response to the read-out signal or the write signal, data transfer between the input/output circuits in the I/O part 1A-6 and the column decoders is performed via the input/output data lines DATA1 to DATA16. Furthermore, data is written or read out with respect to a desired memory cell in the memory cell array 1A-3 via the bit line selected by the column decoder part 1A-5 and the second bit line selected by the first redundant circuit 1A-4.

Then, a case where the second bit lines BLA1 of the memory macros 1D and 1E are both defective and there is no defect in the memory macro 1A1 will be described.

When the second bit line BLA1 in the memory macro 1D is defective, the fuse 12 in the first redundant circuit 1A-4 in the memory macro 1D is broken by a laser trimming device beforehand. Then, a reset signal (RS) is input from an external circuit to the first redundant circuit 1A-4 in the memory macro 1D, but since the fuse 12 is broken, an output signal of logic "H" level is not transmitted from the inverter 11. Therefore, the logic "L" level is input to the inverter 13 via an NMOS transistor 17, and this is latched in an inverter 14. Thus, the bit line BL1 is connected to the second bit line BLA2. Thereafter, a bit line BL2 is connected to a second bit line BLA3. Finally, a bit line BL64 is connected to the redundant bit line BLA65.

When the second bit line BLA1 in the memory macro 1E is defective, the fuse 12 in the first redundant circuit 1A-4 in the memory macro 1E is broken by a laser trimming device beforehand. Then, a reset signal (RS) is input from an external circuit to the first redundant circuit 1A-4 in the memory macro 1E, but since the fuse 12 is broken, an output signal of logic "H" level is not transmitted from the inverter 11. Therefore, the logic "L" level is input to the inverter 13 via an NMOS transistor 17, and this is latched in an inverter 14. Thus, the bit line BL1 is connected to the second bit line BLA2. Thereafter, a bit line BL2 is connected to a second bit line BLA3. Finally, a bit line BL64 is connected to the redundant bit line BLA65.

On the other hand, there is no defect and no fuse is broken in the memory macro 1A1, so that an output signal of logic "H" level is transmitted from the inverter 11, and the bit line BL1 is connected to the second bit line BLA1. Thereafter, a bit line BL2 is connected to a second bit line BLA2. Finally, a bit line BL64 is connected to a second bit line BLA64.

At this time, in the redundant memory macro 2E, the redundant signal line RA connected to the memory macro 1D is in the logic "H" level, and a signal of the bit line BL64 in the memory macro 1D is transmitted to the redundant bit line BLA65. The redundant signal lines RA connected to the memory macro 1E is also in the logic "H" level, and a signal of the bit line BL64 in the memory macro 1E is transmitted to the redundant bit line BLA65. However, the redundant signal lines RA connected to the memory macro 1A1 is in the logic "L" level, so that a signal of the bit line BL64 in the memory macro 1A1 is not transmitted to the redundant bit line BLA65.

At this time, in response to the logic "H" level of the redundant signal line RA connected to the memory macro 1D, an output signal of an inverter 52 in FIG. 22 is turned to be in the logic "L" level. At the same time, in response to the logic "H" level of the redundant signal line RA connected to the memory macro 1E, an output signal of an inverter 55 in FIG. 22 also is turned to be in the logic "L" level. In response to these output signals of the inverters 52 and 55, an NAND circuit 58 in the redundant bit line connection circuit 2E-2 outputs a logic "H" level. This NAND circuit 58 outputs a logic "H" level only when repairing both the memory macros 1D and 1E. In response to the logic "H" level from the NAND circuit 58, an inverter 57 outputs a logic "L" level, and a switching transistor 56 is turned off. Thus, the redundant bit line BLA65 is divided electrically from the redundant bit line in the memory macro 1D and the redundant bit line in the memory macro 1E by the redundant bit line connection circuit 2E-2.

Then, in the memory macro 1A1, an address signal (ADR) is input from an external circuit, and an internal row address signal (RADR) and an internal column address signal are generated by the peripheral circuit 1A-1. In response to this internal row address signal, one of the 32 word lines is selected by the row decoder 1A-2. In response to the internal column address signal, one of the four bit lines is selected by a column decoder in the column decoder part 1A-5.

Then, in response to a command signal (CMD) input from an external circuit, a read-out signal (RE) or a write signal (WR) is generated by the peripheral circuit 1A-1. In response to the read-out signal or the write signal, data transfer between the input/output circuits in the I/O part 1A-6 and the column decoders is performed via the input/output data lines DATA1 to DATA16. Furthermore, data is written or read out with respect to a desired memory cell in the memory cell array 1A-3 via the bit line selected previously by the column decoder part 1A-5 and the second bit line selected by the first redundant circuit 1A-4.

Similarly, in the memory macro 1D, an address signal (ADR) is input from an external circuit, and an internal row address signal (RADR) and an internal column address signal (CADR) are generated by the peripheral circuit 1D-1. In response to this internal row address signal, one of the 16 word lines is selected by the row decoder 1D-2. In response to the internal column address signal, one of the four bit lines is selected by a column decoder in the column decoder part 1A-5.

Then, in response to a command signal (CMD) from an external circuit, a read-out signal (RE) or a write signal (WR) is generated by the peripheral circuit 1D-1. In response to the read-out signal or the write signal, data transfer between the input/output circuits in the I/O part 1A-6 and the column decoders is performed via the input/output data lines DATA1 to DATA16. Furthermore, data is written or read out with respect to desired memory cells in the memory cell array 1A-3 and the redundant memory cell array 2A-2 via the bit line selected by the column decoder part 1A-5, the second bit lines BLA2 to BLA64 selected by the first redundant circuit 1A-4 and the redundant bit line BLA65.

Similarly, in the memory macro 1E, an address signal (ADR) is input from an external circuit, and an internal row address signal (RADR) and an internal column address signal (CADR) are generated by the peripheral circuit 1E-1. In response to this internal row address signal, one of the 8 word lines is selected by the row decoder 1E-2. In response to the internal column address signal, one of the four bit lines is selected by a column decoder in the column decoder part 1A-5.

Then, in response to a command signal (CMD) from an external circuit, a read-out signal (RE) or a write signal (WR) is generated by the peripheral circuit 1E-1. In response to the read-out signal or the write signal, data transfer between the input/output circuits in the I/O part 1A-6 and the column decoders is performed via the input/output data lines DATA1 to DATA16. Furthermore, data is written or read out with respect to desired memory cells in the memory cell array 1A-3 and the redundant memory cell array 2A-2 via the bit line selected by the column decoder part 1A-5, the second bit lines BLA2 to BLA64 selected by the first redundant circuit 1A-4 and the redundant bit line BLA65.

This configuration makes it possible to disconnect the redundant word lines and the redundant bit lines completely from the word lines and the bit lines of a normal memory macro, so that the redundant memory macro can be shared among a plurality of memory macros, regardless whether the operation timing of the word lines and the bit lines is the same or different, or even if the number of the word lines is different in the plurality of memory macros. Thus, one or a plurality of the plurality of memory macros can be repaired. Consequently, the area efficiency and the repair efficiency can be improved.

Embodiment 7

Figure 23:
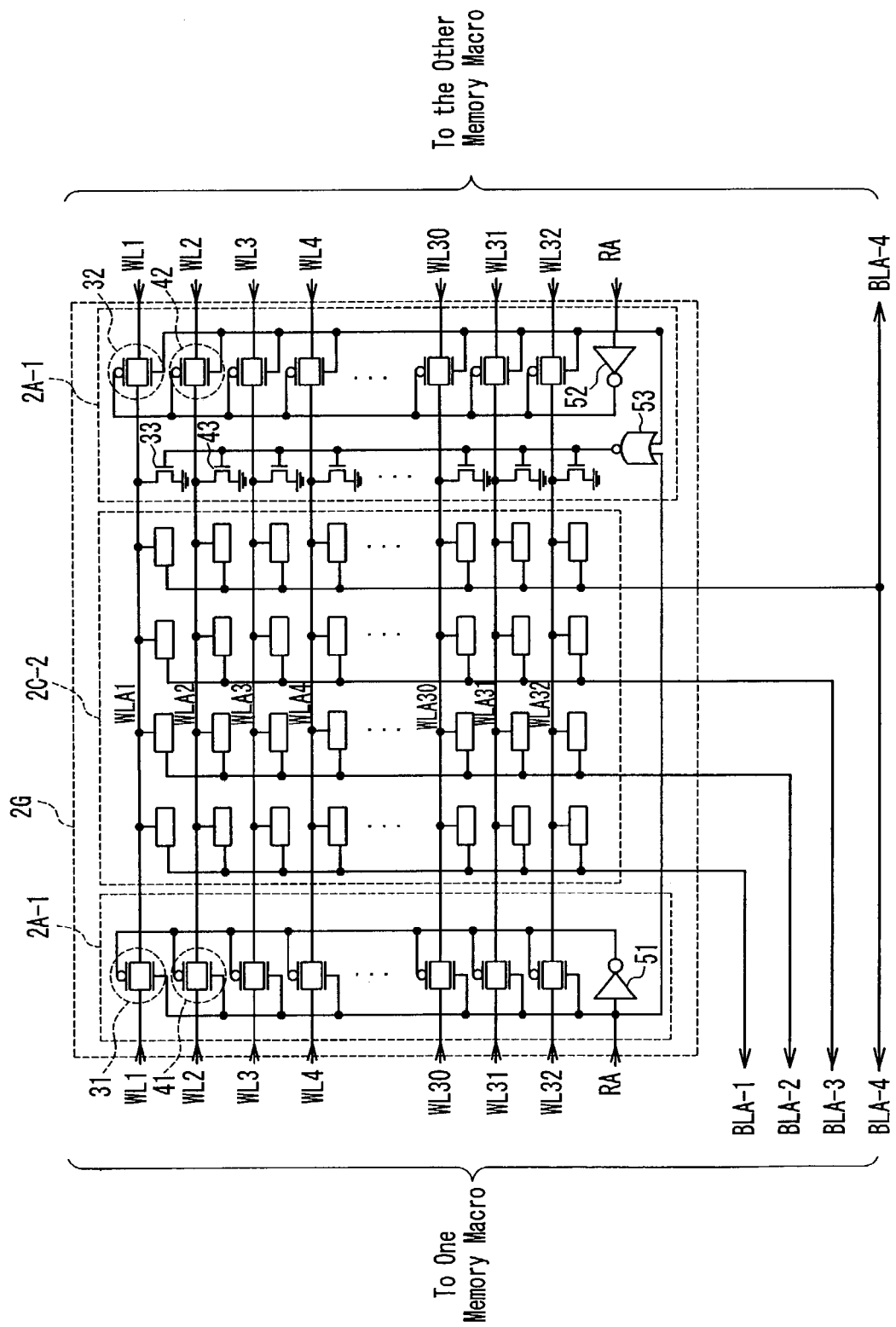
FIG. 23 is a circuit diagram showing a partial configuration of a redundant memory macro 2G of a semiconductor integrated circuit according to Embodiment 7 of the present invention.

FIG. 23 is a circuit diagram showing a partial configuration of a redundant memory macro of a semiconductor integrated circuit according to Embodiment 7 of the present invention. In the semiconductor integrated circuit device of this embodiment, a redundancy repair of this configuration may be present in a plurality of sites in a semiconductor integrated circuit. The number of word lines or bit lines in the redundant memory macro 2G is not limited to that in this embodiment.

In FIG. 23, the redundant memory macro 2G includes a redundant memory cell array 2C-2 and first word line connection circuits 2A-1, and is connected to one memory macro via four redundant bit lines BLA-1 to BLA-4 and is connected to the other memory macro via one bit line BLA-4.

This configuration makes it possible to disconnect the redundant word lines and the redundant bit lines completely from the word lines and the bit lines of a normal memory macro, so that the redundant memory macro can be shared among a plurality of memory macros, regardless of whether the operation timing of the word lines or the bit lines is the same or different, or even if the number of the bit lines to be redundant is different in the plurality of memory macros. Thus, one of the plurality of memory macros can be repaired. Consequently, the area efficiency and the repair efficiency can be improved.

Embodiment 8

Figure 24:
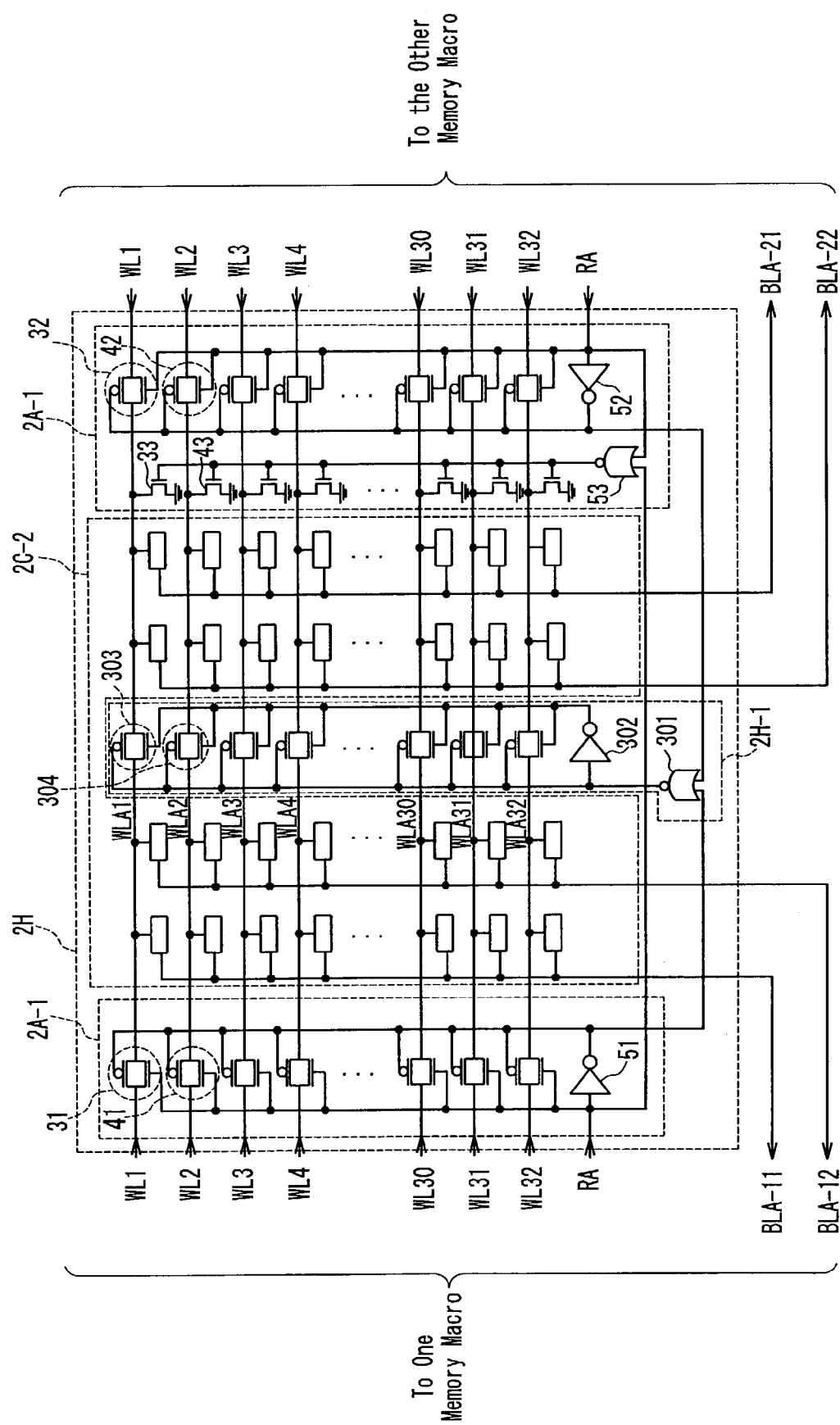
FIG. 24 is a circuit diagram showing a partial configuration of a redundant memory macro 2H of a semiconductor integrated circuit according to Embodiment 8 of the present invention.

FIG. 24 is a circuit diagram showing a partial configuration of a redundant memory macro 2H of a semiconductor integrated circuit according to Embodiment 8 of the present invention. In the semiconductor integrated circuit device of this embodiment a redundancy repair of this configuration may be present in a plurality of sites in a semiconductor integrated circuit. The number of word lines or bit lines in the redundant memory macro 2H is not limited to that in this embodiment.

In FIG. 24, the redundant memory macro 2H includes a redundant memory cell array 2C-2, first word line connection circuits 2A-1, and a third word line connection circuit 2H-1, and is connected to one memory macro via two redundant bit lines BLA-11 and BLA-12 and is connected to the other memory macro via two redundant bit lines BLA-21 and BLA-22. Only when repairing both of the memory macros, output signals from inverters 51 and 52 are turned to be in the logic "L" level, and in the third word line connection circuit 2H-1, an output signal of a NOR circuit 301 is turned to be the logic "H" level. In response to this signal of the logic "H" level and an output signal of the logic "L" level from an inverter 302, switching transistors 303 and 304 are turned off, so that the redundant word lines on the side of one memory macro are divided electrically from the redundant word lines on the side of the other memory macro.

This configuration makes it possible to divide the redundant word lines, so that the redundant memory macro can be shared among a plurality of memory macros, regardless of whether the operation of the word lines and the bit lines is the same or different. Thus, all of the plurality of memory macros can be repaired. Consequently, the area efficiency and the repair efficiency can be improved.

Embodiment 9

Figure 25:
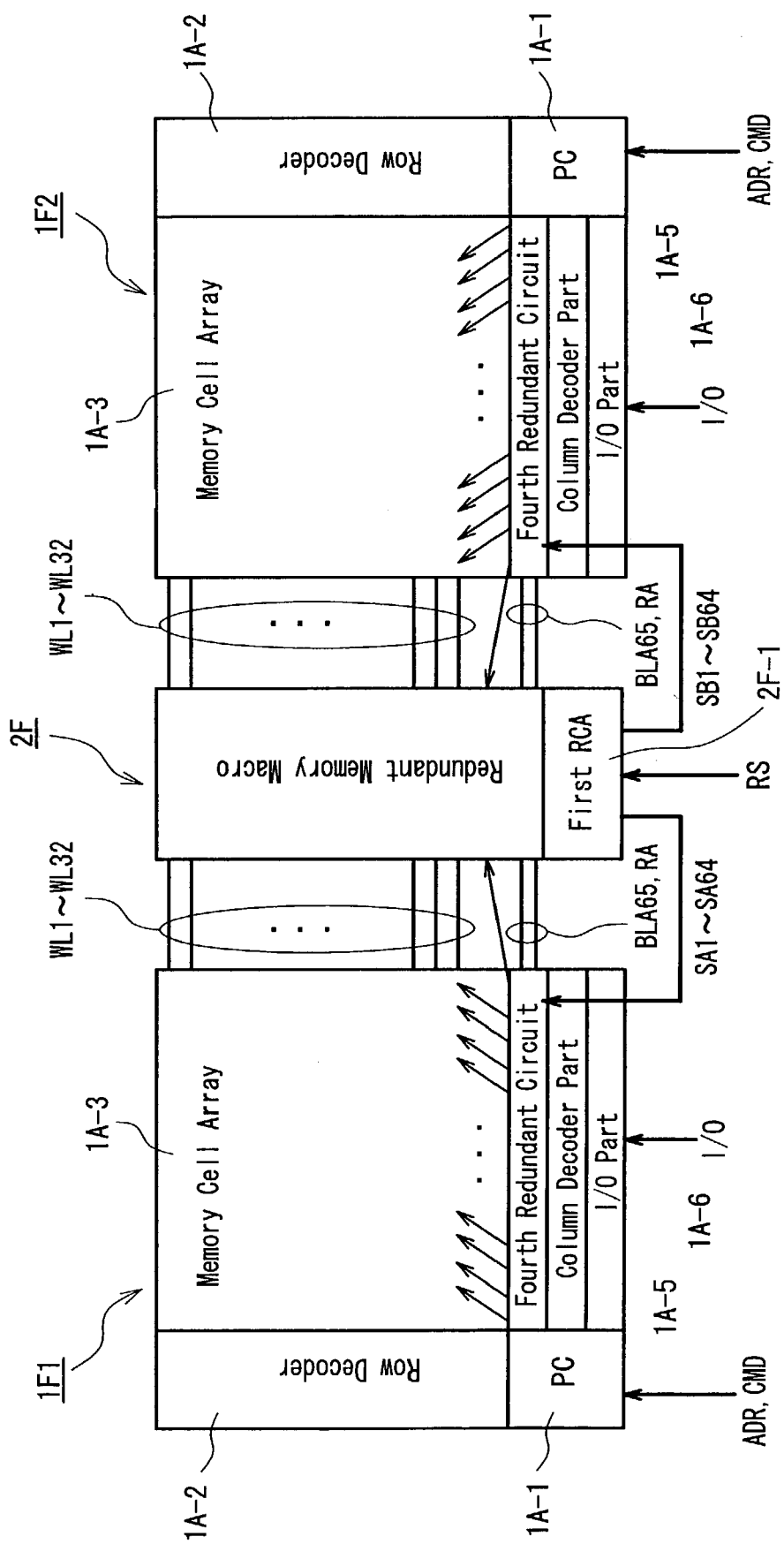
FIG. 25 is a block diagram showing an example of a configuration of a semiconductor integrated circuit according to Embodiment 9 of the present invention.

FIG. 25 is a block diagram showing an example of a configuration of a semiconductor integrated circuit according to Embodiment 7 of the present invention. In this embodiment, an example in which two memory macros are mounted is described, but the same is true for the cases in which three or more memory macros are mounted. A redundancy repair of this configuration may be present in a plurality of sites in a semiconductor integrated circuit. The numbers of word lines or bit lines and input/output data lines in memory macros 1F1 and 1F2 and a redundant memory macro 2F are not limited to those in this embodiment. The memory macros 1F1 and 1F2 are different from the memory macros 1A1 and 1A2 shown in FIG. 2 only in the redundant circuit and the other circuits are the same. The difference in the redundant circuit will be described with reference to FIG. 26.

In FIG. 25, the memory macros 1F1 and 1F2 as described above are connected to a first redundant control circuit of the redundant memory macro 2F via redundant control signal lines SA1 to SA64 and SB1 to SB64, respectively, unlike the memory macros 1A1 and 1A2.

Figure 26:
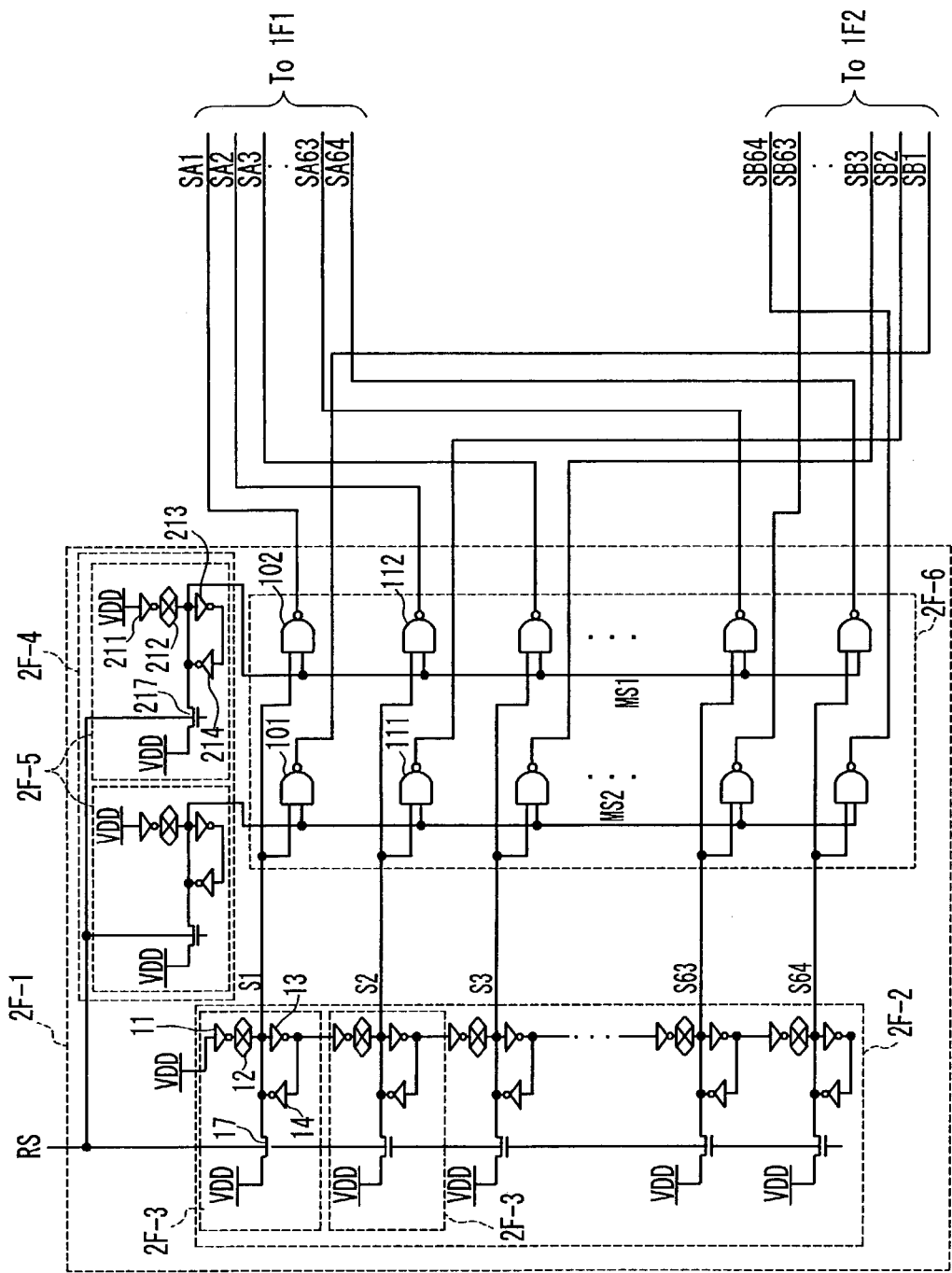
FIG. 26 is a circuit diagram showing a partial configuration of a first redundant control circuit 2F-1 in a redundant memory macro 2F of FIG. 25.

FIG. 26 is a circuit diagram showing a partial configuration of a first redundant control circuit (RCC) 2F-1 in the redundant memory macro 2F. The first redundant control circuit 2F-1 includes a redundant fuse part 2F-2 including 64 shift fuse parts 2F-3, a macro fuse part 2F-4 including two macro select fuse parts 2F-5 and a macro select circuit 2F-6.

Each shift fuse part 2F-3 in the redundant fuse part 2F-2 is connected to an external reset signal line RS, and is connected to the macro select circuit 2F-6 via 64 shift signal lines S1 to S64.

The macro select fuse part 2F-5 in the macro fuse part 2F-4 is connected to an external reset signal line RS and is connected to the macro select circuit 2F-6 via two macro select signal lines MS1 and MS2.

The macro select circuit 2F-6 includes 64 NAND circuits 102, 112, . . . that output signals to the memory macro 1F1 via the redundant control signal lines SA1 to SA64 and 64 NAND circuits 101, 111, . . . that output signals to the memory macro 1F2 via the redundant control signal lines SB1 to SB64.

The shift signal lines S1 to S64 from the 64 shift fuse parts 2F-3 are connected to one input terminal of the 64 NAND circuits 102, 112, . . . corresponding to the memory macro 1F1 and one input terminal of the 64 NAND circuits 101, 111, . . . corresponding to the memory macro 1F2, respectively. The macro select signal lines MS1 and MS2 from the two macro select fuse parts 2F-5 are connected to the other input terminal of the 64 NAND circuits 102, 112, . . . corresponding to the memory macro 1F1 and the other input terminal of the 64 NAND circuits 101, 111, . . . corresponding to the memory macro 1F2, respectively.

Figure 27:
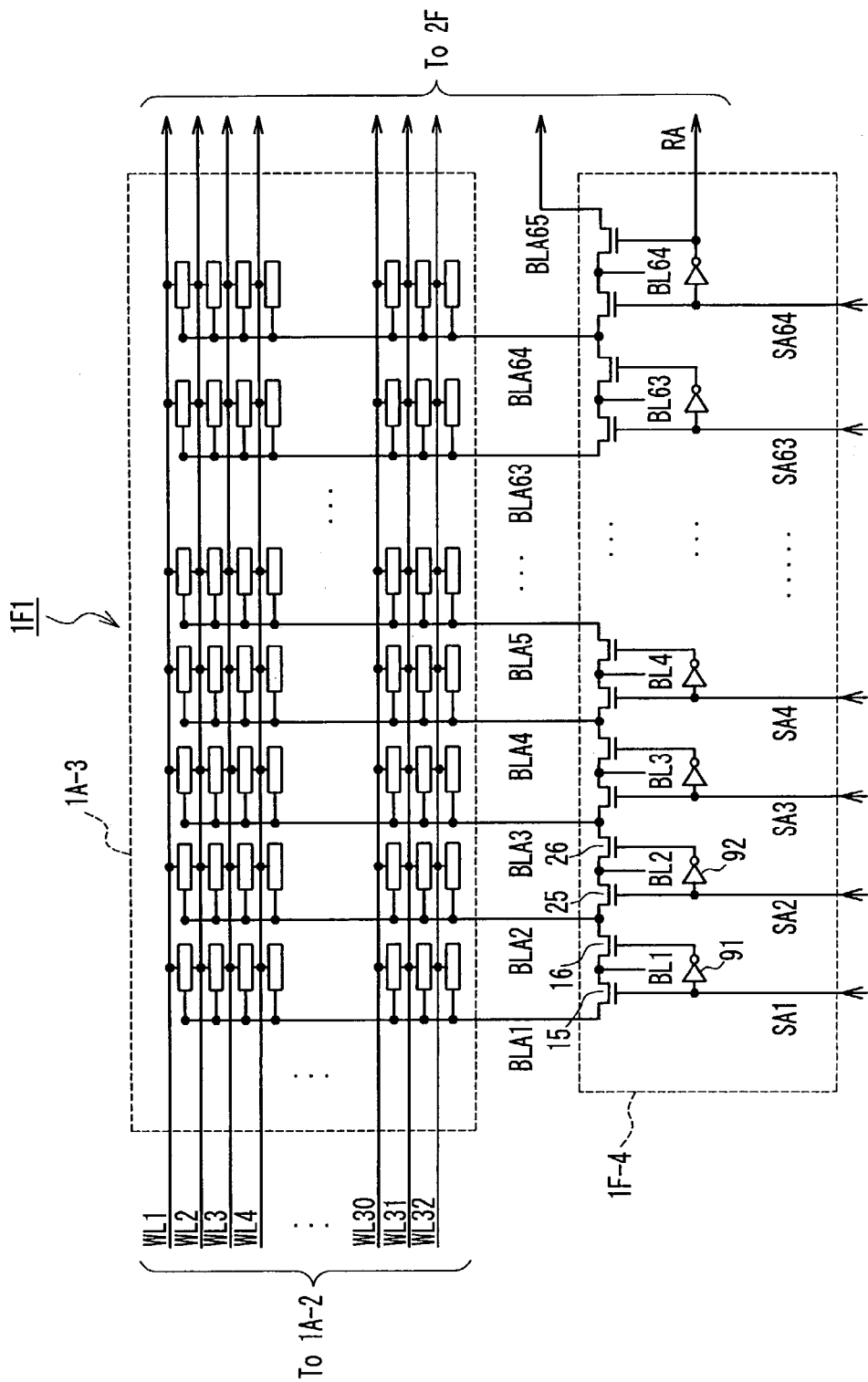
FIG. 27 is a circuit diagram showing a partial configuration of a fourth redundant circuit 1F-4 and a memory cell array 1A-3 in a memory macro 1F1 of FIG. 25.

FIG. 27 is a circuit diagram showing a configuration of a fourth redundant circuit 1F-4 and a memory cell array 1A-3 in the memory macro 1F1. FIG. 27 only shows a partial configuration of the memory macro 1F1, but the partial configuration of the memory macro 1F2 is the same as that of the memory macro 1F1 except that the redundant control signal lines are SB1 and SB64. In FIG. 27, the fourth redundant circuit 1F-4 is connected to the redundant memory macro 2F via the redundant control signal lines SA1 to SA64, a redundant bit line BLA65, and a redundant signal line RA, and the memory cell array 1A-3 is connected to the fourth redundant circuit 1F-4 via second bit lines BLA1 to BLA64.

Hereinafter, the operation of a semiconductor integrated circuit having this configuration will be described.

First, a case in which there is no defect in both the memory macros 1F1 and 1F2 and the redundant memory macro 2F is not used will be described.

First, a reset signal (RS) is input to the first redundant control circuit 2F-1 from an external circuit. At this time, when there is no defect anywhere in the memory macros 1F1 and 1F2, fuses are not broken, so that an output signal of logic "L" level is transmitted from an inverter 11 in the shift fuse part 2F-3 in FIG. 26, and an output signal of logic "H" level of an inverter 13 is transmitted to the following shift fuse part 2F-3, and this is latched by an inverter 14.

Furthermore, an output signal of logic "L" level is transmitted from an inverter 211 in the macro select fuse part 2F-5 and is latched by inverters 213 and 214.

Therefore, the 64 shift signal lines S1 to S64 connected to the macro select circuit 2F-6 and the two macro select signal lines MS1 and MS2 are all at the logic "L" level. Consequently, signals from the NAND circuits 101, 111, 102, 112, . . . in the macro select circuit 2F-6, all of which are at the logic "H" level, are outputs to the redundant control signal lines SA1 to SA64 and SB1 to SB64.

In the memory macros 1F1 and 1F2, in response to the logic "H" level of the redundant control signal lines SA1 to SA64 and SB1 to SB64, an NMOS transistor 15 in the fourth redundant circuit 1F-4 shown in FIG. 27 is turned on, and an inverter 91 outputs a logic "L" level, so that an NMOS transistor 16 is turned off. Thus, a bit line BL1 is connected to a second bit line BLA1, and thereafter BL2 is connected to BLA2, and finally BL64 is connected to BLA64.

Next, this embodiment will be described by taking as an example the case where the second bit line BLA1 of the memory macro 1F1 is defective and there is no defect in the memory macro 1F2.

When the second bit line BLA1 in the memory macro 1F1 is defective, the fuse 12 in the shift fuse part 2F-3 connected to the shift signal line S1 and a fuse 212 in the macro select fuse part 2F-5 connected to the macro select signal line MS1 are broken by a laser trimming device beforehand in the first redundant control circuit 2F-1 in the redundant memory macro 2F.

Then, a reset signal (RS) is input from an external circuit to the first redundant control circuit 2F-1 in the redundant memory macro 2F, but since the fuse 12 is broken, an output signal of the logic "L" level is not transmitted from the inverter 11. Therefore, the logic "H" level is input to the inverter 13 via an NMOS transistor 17 and is latched in an inverter 14. Thus, the shift signal line S1 is turned to the logic "H" level. Thereafter, the logic "H" level is transmitted sequentially to the shift signal lines S2 to S64.

Furthermore, since the fuse 212 is broken, an output signal of the logic "L" level is not transmitted from the inverter 211. Therefore, the logic "H" level is input to the inverter 213 via an NMOS transistor 217 and is latched in an inverter 214. Thus, the macro select signal line MS1 is turned to be in the logic "H" level. At this time, the fuse in the macro select fuse part 2F-5 that selects the memory macro 1F2 is not broken, so that the macro select signal line MS2 is turned to be in the logic "L" level.

In response to these signals, all the NAND circuits 102, 112, . . . connected to the macro select signal line MS1 in the macro select circuit 2F-6 output a logic "L" level to the redundant control signal lines SA1 to SA64. On the other hand, since the macro select signal line MS2 is in a logic "L" level, all the NAND circuits 101, 111, . . . connected to the macro select signal line MS2 output a logic "H" level to the redundant control signal lines SB1 to SB64.

Since the redundant control signal lines SA1 to SA64 are at the logic "L" level, in memory macro 1F1, an NMOS transistor 15 in the fourth redundant circuit 1F-4 is turned off and an inverter 91 outputs a logic "H" level, so that an NMOS transistor 16 is turned on. Thus, a bit lines BL1 is connected to a second bit line BLA2, and thereafter BL2 is connected to BLA3 and finally BL64 is connected to BLA65.

On the other hand, since the redundant control signal lines SB1 to SB64 are at the logic "H" level, in memory macro 1F2, an NMOS transistor 15 in the fourth redundant circuit 1F-4 is turned on and an inverter 91 outputs a logic "L" level, so that an NMOS transistor 16 is turned off. Thus, a bit lines BL1 is connected to a second bit line BLA1, and thereafter BL2 is connected to BLA2 and finally BL64 is connected to BLA64.

This configuration makes it possible to share fuses for redundancy repair among a plurality of memory macros. Thus, the number of fuses can be reduced and the area efficiency can be improved.

Embodiment 10

Figure 28:
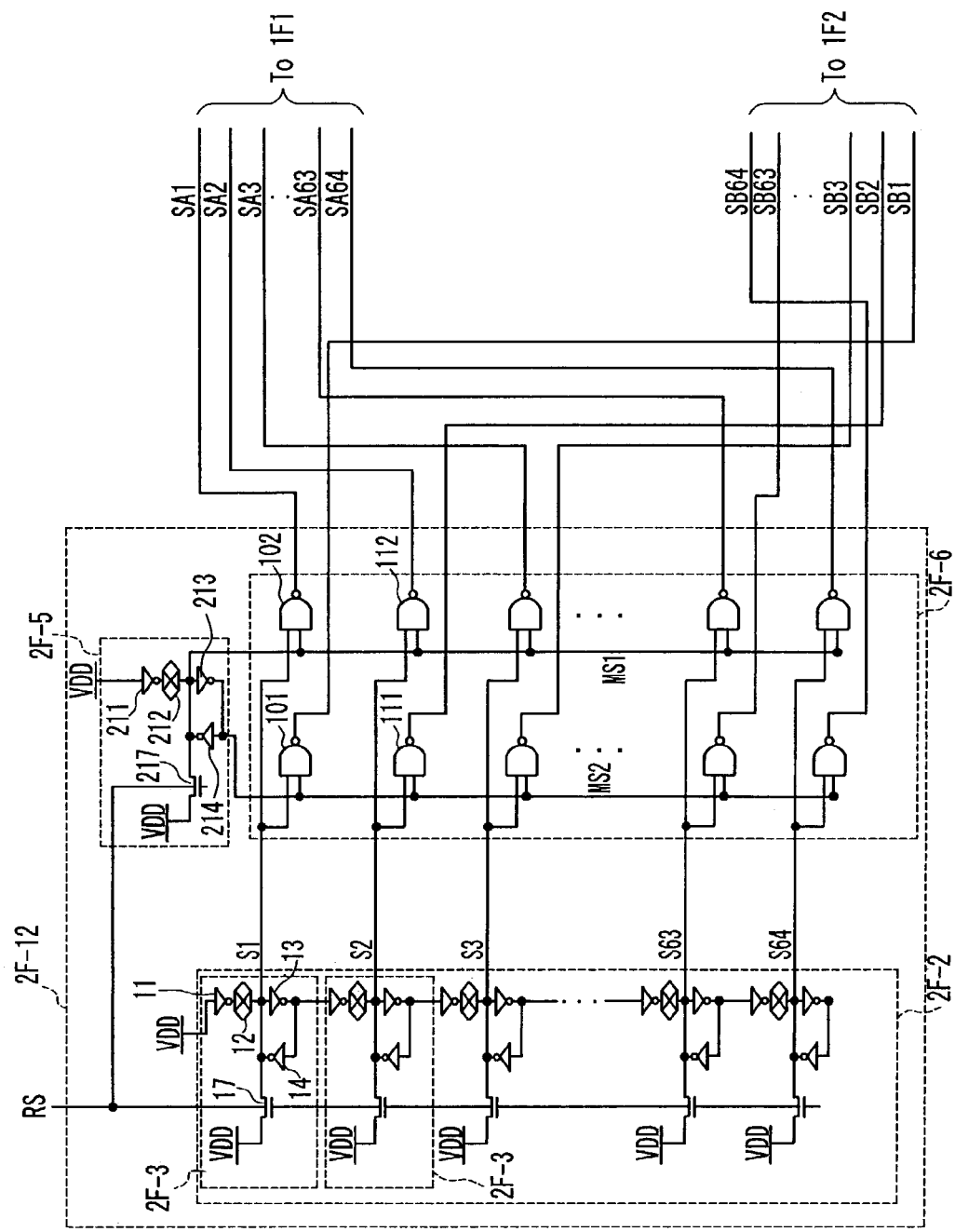
FIG. 28 is a circuit diagram showing a partial configuration of a second redundant control circuit 2F-12 in a redundant memory macro 2F in a semiconductor integrated circuit according to Embodiment 10 of the present invention.

FIG. 28 is a circuit diagram showing a partial configuration of a second redundant control circuit in a redundant memory macro in a semiconductor integrated circuit according to Embodiment 10 of the present invention. A second redundant control circuit 2F-12 shown in FIG. 28 is different from the first redundant control circuit 2F-1 shown in FIG. 26 in that only one macro select fuse part 2F-5 is provided with respect to the two memory macros 1F1 and 1F2. In this macro select fuse part 2F-5, an input signal of an inverter 213 is supplied to a macro select signal line MS1 of the macro select circuit 2F-6, and an output signal of an inverter 213 is supplied to a macro select signal line MS2.

Hereinafter, the operation of a semiconductor integrated circuit having such a configuration will be described.

In the case where there is no defect in both the memory macros 1F1 and 1F2 and the redundant memory macro 2F is not used, no fuse is broken, so that this is the same as in Embodiment 9, and therefore the description thereof is omitted.

Therefore, this embodiment will be described by taking as an example the case where the second bit line BLA1 of the memory macro 1F1 is defective and there is no defect in the memory macro 1F2.

When the second bit line BLA1 in the memory macro 1F1 is defective, the fuse 12 in the shift fuse part 2F-3 connected to the shift signal line S1 and a fuse 212 in the macro select fuse part 2F-5 are broken by a laser trimming device beforehand in the second redundant control circuit 2F-12 in the redundant memory macro 2F.

Then, a reset signal (RS) is input from an external circuit to the second redundant control circuit 2F-12 in the redundant memory macro 2F, but since the fuse 12 is broken, an output signal of the logic "L" level is not transmitted from the inverter 11. Therefore, a logic "H" level is input to the inverter 13 via an NMOS transistor 17 and is latched in an inverter 14. Thus, the shift signal line SI is in the logic "H" level. Thereafter, the logic "H" level also is transmitted sequentially to the shift signal lines S2 to S64.

Furthermore, since the fuse 212 is broken, an output signal of the logic "L" level is not transmitted from the inverter 211. Therefore, the logic "H" level is input to the inverter 213 via an NMOS transistor 217 and is latched in an inverter 214. Thus, the macro select signal line MS1 is in the logic "H" level. At this time, an output terminal of the inverter 213 is connected to the macro select signal line MS2, so that the macro select signal line MS2 is in the logic "L" level.

The subsequent operations are the same as those in Embodiment 9.

Next, this embodiment will be described by taking as an example the case where the second bit line BLA1 of the memory macro 1F2 is defective and there is no defect in the memory macro 1F1.

When the second bit line BLA1 in the memory macro 1F2 is defective, the fuse 12 in the shift fuse part 2F-3 connected to the shift signal line S1 is broken by a laser trimming device beforehand in the second redundant control circuit 2F-12 in the redundant memory macro 2F. At this time, a fuse 212 in the macro select fuse part 2F-5 is not broken.

Then, a reset signal (RS) is input from an external circuit to the second redundant control circuit 2F-12 in the redundant memory macro 2F, but since the fuse 12 is broken, an output signal of the logic "L" level is not transmitted from the inverter 11. Therefore, the logic "H" level is input to the inverter 13 via an NMOS transistor 17 and is latched in an inverter 14. Thus, the shift signal line S1 is turned to be in the logic "H" level. Thereafter, the logic "H" level also is transmitted sequentially to the shift signal lines S2 to S64.

Furthermore, since the fuse 212 is not broken, an output signal of the logic "L" level is transmitted from the inverter 211. Therefore, the logic "L" level is input to the inverter 213 and is latched in an inverter 214. Thus, the macro select signal line MS1 is in the logic "L" level. At this time, an output terminal of the inverter 213 is connected to the macro select signal line MS2, so that the macro select signal line MS2 is turned to be in the logic "H" level.

In response to these signals, all the NAND circuits 102, 112, . . . connected to the macro select signal line MS1 in the macro select circuit 2F-6 output a logic "H" level to the redundant control signal lines SA1 to SA64. On the other hand, since the macro select signal line MS2 is in a logic "H" level, all the NAND circuits 101, 111, . . . connected to the macro select signal line MS2 output a logic "L" level to the redundant control signal lines SB1 to SB64.

Since the redundant control signal lines SA1 to SA64 are in the logic "H" level, in memory macro 1F1, an NMOS transistor 15 in the fourth redundant circuit 1F-4 is turned on and an inverter 91 outputs a logic "L" level, so that an NMOS transistor 16 is turned off. Thus, a bit lines BL1 is connected to a second bit line BLA1, and thereafter BL2 is connected to BLA2 and finally BL64 is connected to BLA 64.

On the other hand, since the redundant control signal lines SB1 to SB64 are in the logic "L" level, in memory macro 1F2, an NMOS transistor 15 in the fourth redundant circuit 1F-4 is turned off and an inverter 91 outputs a logic "H" level, so that an NMOS transistor 16 is turned on. Thus, a bit line BL1 is connected to a second bit line BLA2, and thereafter BL2 is connected to BLA3 and finally BL64 is connected to BLA 65.

This configuration makes it possible to share fuses for redundancy repair among a plurality of memory macros and further reduce the number of macro select fuses. Thus, the number of fuses can be reduced and the area efficiency can be improved.

In this embodiment, two memory macros share one macro select fuse, but with respect to three memory macros, the present invention can be achieved in the following manner: two macro select fuses are shared, and in the macro select fuse part, a signal to be input to the macro select signal line is decoded so as to be supplied thereto.

Embodiment 11

Figure 29:
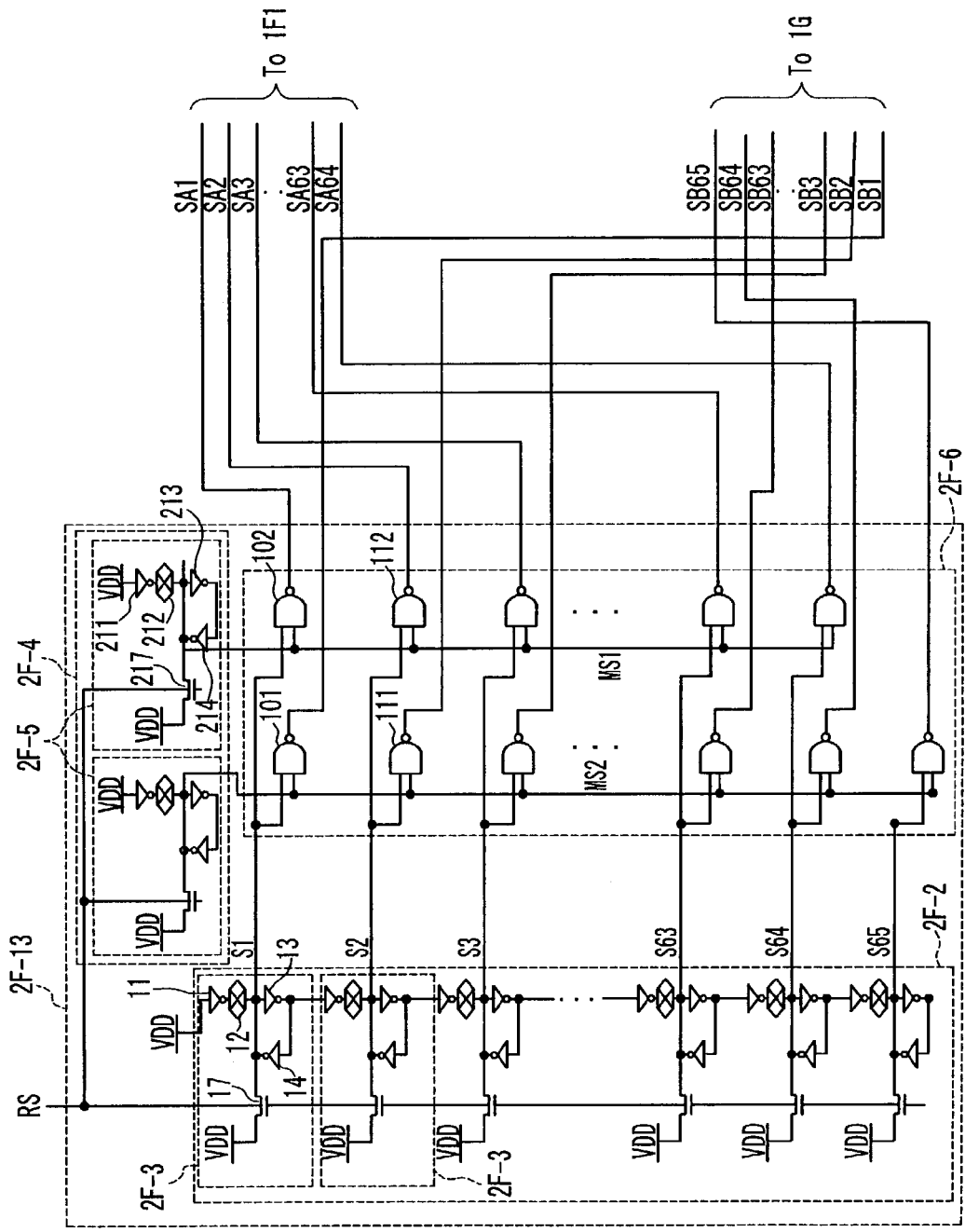
FIG. 29 is a circuit diagram showing a partial configuration of a third redundant control circuit 2F-13 in a redundant memory macro 2F in a semiconductor integrated circuit according to Embodiment 11 of the present invention.

FIG. 29 is a circuit diagram showing a partial configuration of a third redundant control circuit in a redundant memory macro in a semiconductor integrated circuit according to Embodiment 11 of the present invention. In the semiconductor integrated circuit of this embodiment, a plurality of memory macros having different configurations such as a memory macro 1F1 having 64 bit lines and a memory macro 1G having 65 bit lines are mounted. In this embodiment, an example in which one memory macro 1F1 and one memory macro 1G are mounted is described, but the same is true for the cases in which three or more memory macros are mounted. A redundancy repair of this configuration may be present in a plurality of sites in a semiconductor integrated circuit. The numbers of word lines or bit lines and input/output data lines in memory macros 1F1 and 1G and a redundant memory macro 2F are not limited to those in this embodiment.

In FIG. 29, the third redundant control circuit 2F-13 includes a redundant fuse part 2F-2 including 65 shift fuse parts 2F-3, a macro fuse part 2F-4 including two macro select fuse parts 2F-5 and a macro select circuit 2F-6. Each shift fuse part 2F-3 in the redundant fuse part 2F-2 is connected to an external reset signal line RS, and is connected to the macro select circuit 2F-6 via 65 shift signal lines S1 to S65.

The macro select fuse part 2F-5 in the macro fuse part 2F-4 also is connected to an external reset signal line RS and is connected to the macro select circuit 2F-6 via two macro select signal lines MS1 and MS2.

The macro select circuit 2F-6 includes 64 NAND circuits 102, 112, . . . that output signals to the memory macro 1F1 via the redundant control signal lines SA1 to SA64 and 65 NAND circuits 101, 111, . . . that output signals to the memory macro 1G via the redundant control signal lines SB1 to SB65.

The shift signal lines S1 to S64 from the 64 shift fuse parts 2F-3 are connected to one input terminal of the 64 NAND circuits 102, 112, . . . corresponding to the memory macro 1F1 and one input terminal of the 65 NAND circuits 101, 111, . . . corresponding to the memory macro 1G, respectively. The macro select signal lines MS1 and MS2 from the two macro select fuse parts 2F-5 are connected to the other input terminal of the 64 NAND circuits 102, 112, . . . corresponding to the memory macro 1F1 and the other input terminal of the 65 NAND circuits 101, 111, . . . corresponding to the memory macro 1G, respectively.

Figure 30:
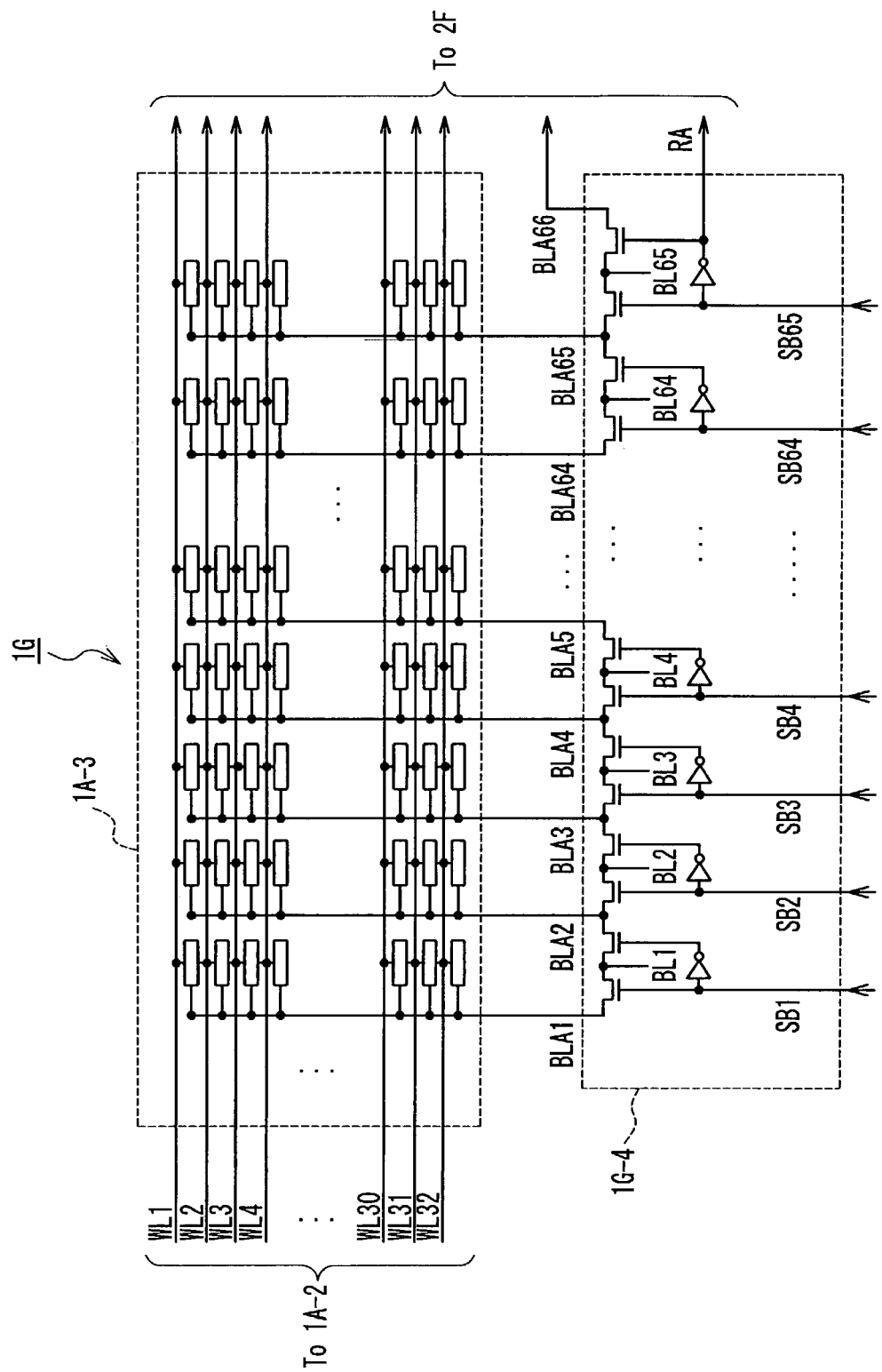
FIG. 30 is a circuit diagram showing a partial configuration of a fourth redundant circuit 1G-4 and a memory cell array 1A-3 in a memory macro 1G of FIG. 29.

FIG. 30 is a circuit diagram showing a configuration of a fourth redundant circuit 1G-4 and the memory cell array 1A-3 in the memory macro 1G. In FIG. 30, the fourth redundant circuit 1G-4 is connected to the redundant memory macro 2F via the redundant control signal lines SB1 to SB65, a redundant bit line BLA66, and a redundant signal line RA, and the memory cell array 1A-3 is connected to the fourth redundant circuit 1G-4 via second bit lines BLA1 to BLA65.

This embodiment has the same configuration as that of Embodiment 9, except the number of the shift fuse parts 2F-3 in the redundant fuse part 2F-2, and the number of the NAND circuits in the macro select circuit 2F-6 are set in accordance with the memory macro 1G, which has the largest number of bit lines (e.g., 65 bit lines), so that the operation thereof is not described further.

This configuration makes it possible to share fuses for redundancy repair among a plurality of memory macros having different numbers of bit lines. Thus, the number of fuses can be reduced and the area efficiency can be improved.

Embodiment 12

Figure 31:
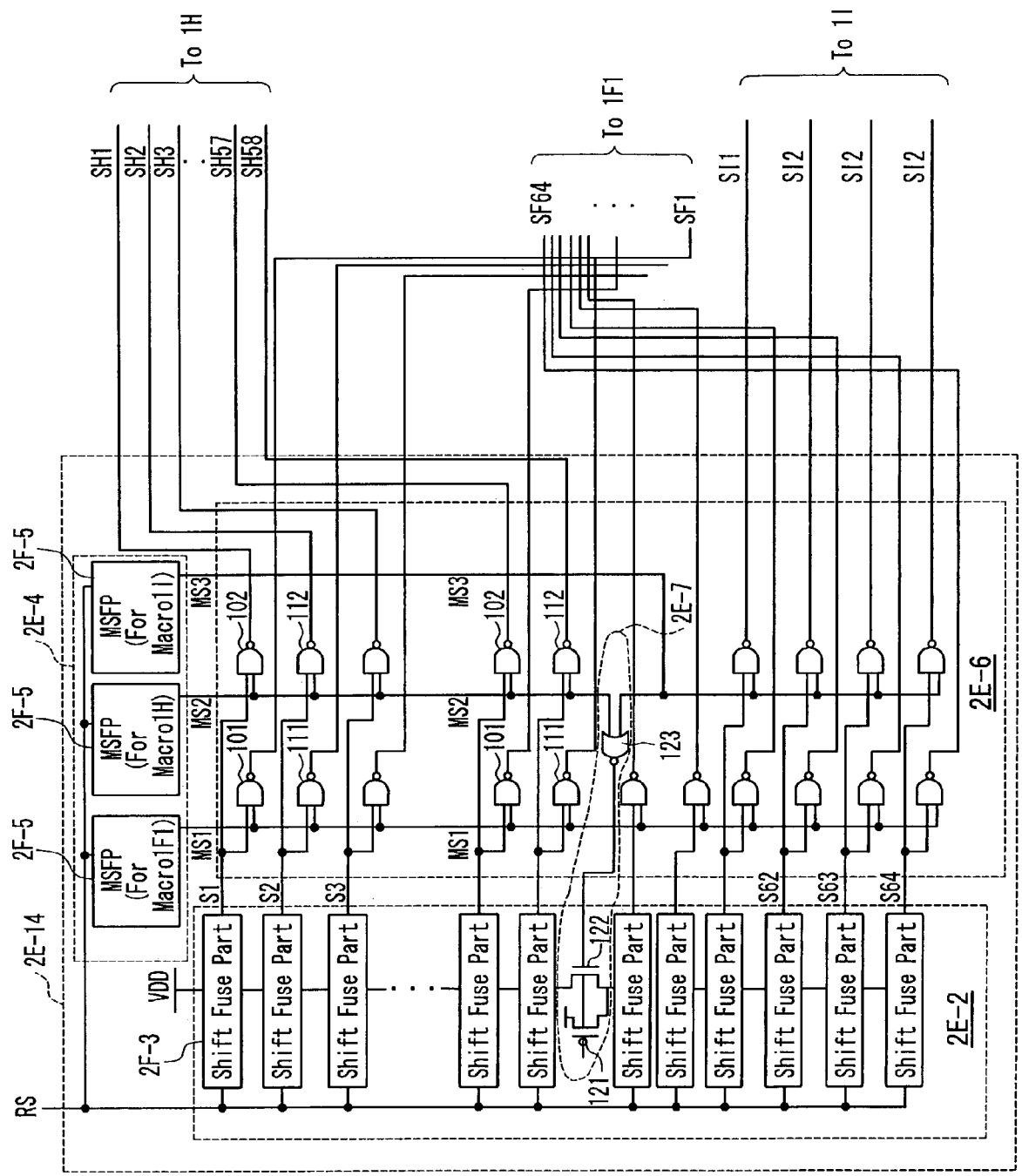
FIG. 31 is a circuit diagram showing a partial configuration of a fourth redundant control circuit 2F-14 in a redundant memory macro 2E in a semiconductor integrated circuit according to Embodiment 12 of the present invention.

FIG. 31 is a circuit diagram showing a partial configuration of a fourth redundant control circuit in a redundant memory macro in a semiconductor integrated circuit according to Embodiment 12 of the present invention. In the semiconductor integrated circuit of this embodiment, a plurality of memory macros having different configurations such as a memory macro 1F1 having 64 bit lines, a memory macro 1H having 58 bit lines and a memory macro 1I having four bit lines are mounted. In this embodiment, an example in which one memory macro 1F1, one memory macro 1H and one memory macro 1I are mounted is described, but the same is true for the cases in which four or more memory macros are mounted. A redundancy repair of this configuration may be present in a plurality of sites in a semiconductor integrated circuit. The numbers of word lines or bit lines and input/output data lines in memory macros 1F1, 1H and 1I and a redundant memory macro 2E are not limited to those in this embodiment.

In FIG. 31, the fourth redundant control circuit 2E-14 in the redundant memory macro 2E includes a redundant fuse part 2E-2 including 64 shift fuse parts 2F-3, a macro fuse part 2E-4 including three macro select fuse parts (MSFP) 2F-5, a macro select circuit 2E-6 and a fuse connection circuit 2E-7.

Each shift fuse part 2F-3 in the redundant fuse part 2E-2 is connected to an external reset signal line RS, and is connected to the macro select circuit 2E-6 via 64 shift signal lines S1 to S64.

The macro select fuse parts 2F-5 in the macro fuse part 2E-4 also are connected to an external reset signal line RS and are connected to the macro select circuit 2E-6 via three macro select signal lines MS1, MS2 and MS3.

The macro select circuit 2F-6 includes 64 NAND circuits 101, 111, . . . that output signals to the memory macro 1F1 via the redundant control signal lines SF1 to SF64, 58 NAND circuits 102, 112, . . . that output signals to the memory macro 1H via the redundant control signal lines SH1 to SH58, and four NAND circuits that output signals to the memory macro 1I via the redundant control signal lines SI1 to S14.

The shift signal lines S1 to S64 from the 64 shift fuse parts 2F-3 are connected to one input terminal of the 64 NAND circuits 101, 111, . . . corresponding to the memory macro 1F1, one input terminal of the 58 NAND circuits 102, 112, . . . corresponding to the memory macro 1H and one input terminal of the four NAND circuits corresponding to the memory macro 1I, respectively. The macro select signal lines MS1, MS2 and MS3 from the three macro select fuse parts 2F-5 are connected to the other input terminal of the 64 NAND circuits 101, 111, . . . , corresponding to the memory macro 1F1, the other input terminal of the 58 NAND circuits 102, 112, . . . , corresponding to the memory macro 1H and the other input terminal of the four NAND circuits corresponding to the memory macro 1I, respectively. The macro select signal line MS2 and the macro select signal line MS3 are connected to the fuse connection circuit 2E-7.

Figure 32:
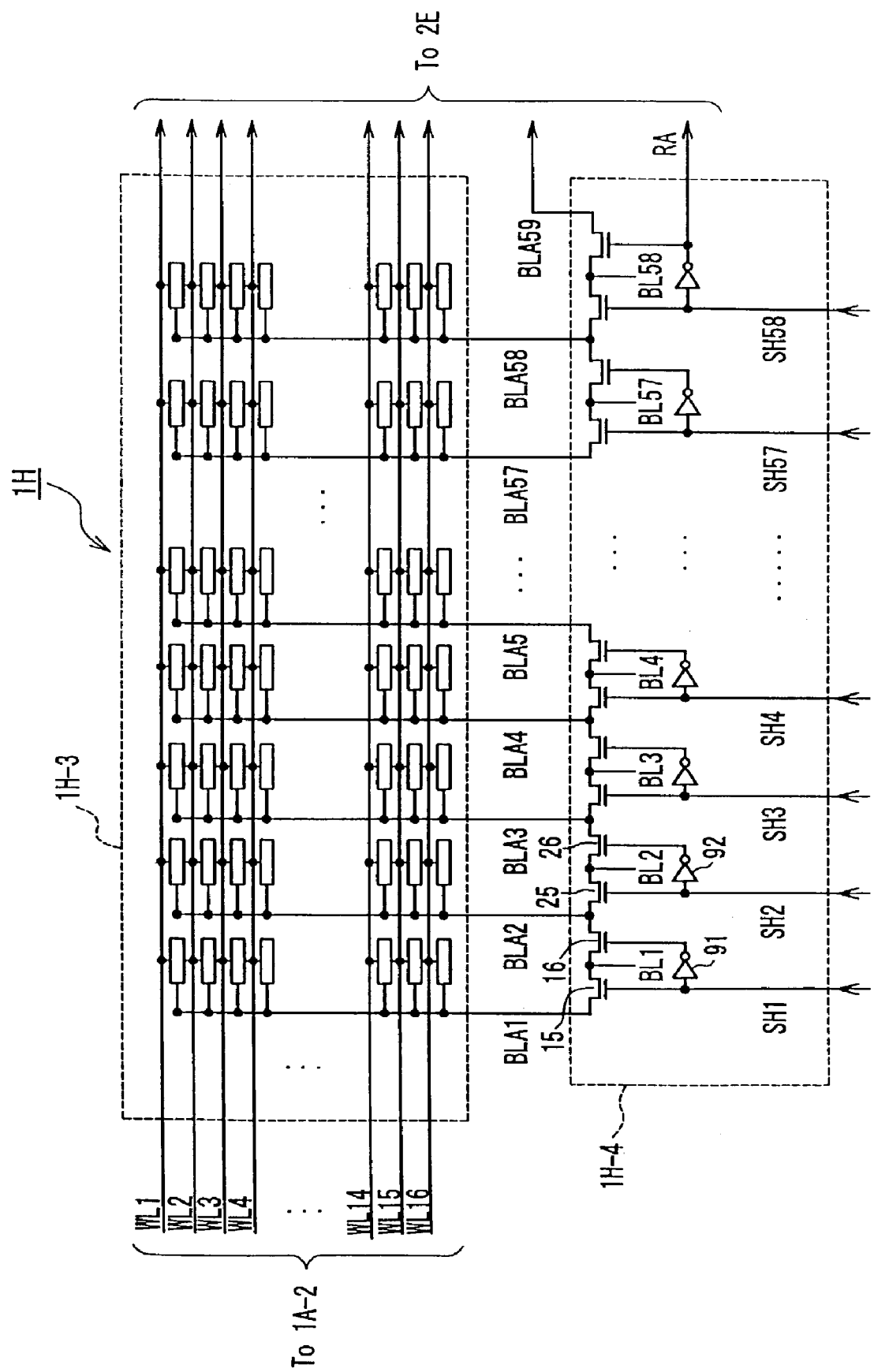
FIG. 32 is a circuit diagram showing a partial configuration of a fourth redundant circuit 1H-4 and a memory cell array 1H-3 in a memory macro 1H of FIG. 31.

FIG. 32 is a circuit diagram showing a partial configuration of a fourth redundant circuit 1H-4 and a memory cell array 1H-3 in the memory macro 1H. In FIG. 32, the fourth redundant circuit 1H-4 is connected to the redundant memory macro 2E via the redundant control signal lines SH1 to SH58, a redundant bit line BLA59, and a redundant signal line RA, and the memory cell array 1H-3 is connected to the fourth redundant circuit 1H-4 via second bit lines BLA1 to BLA58.

Figure 33:
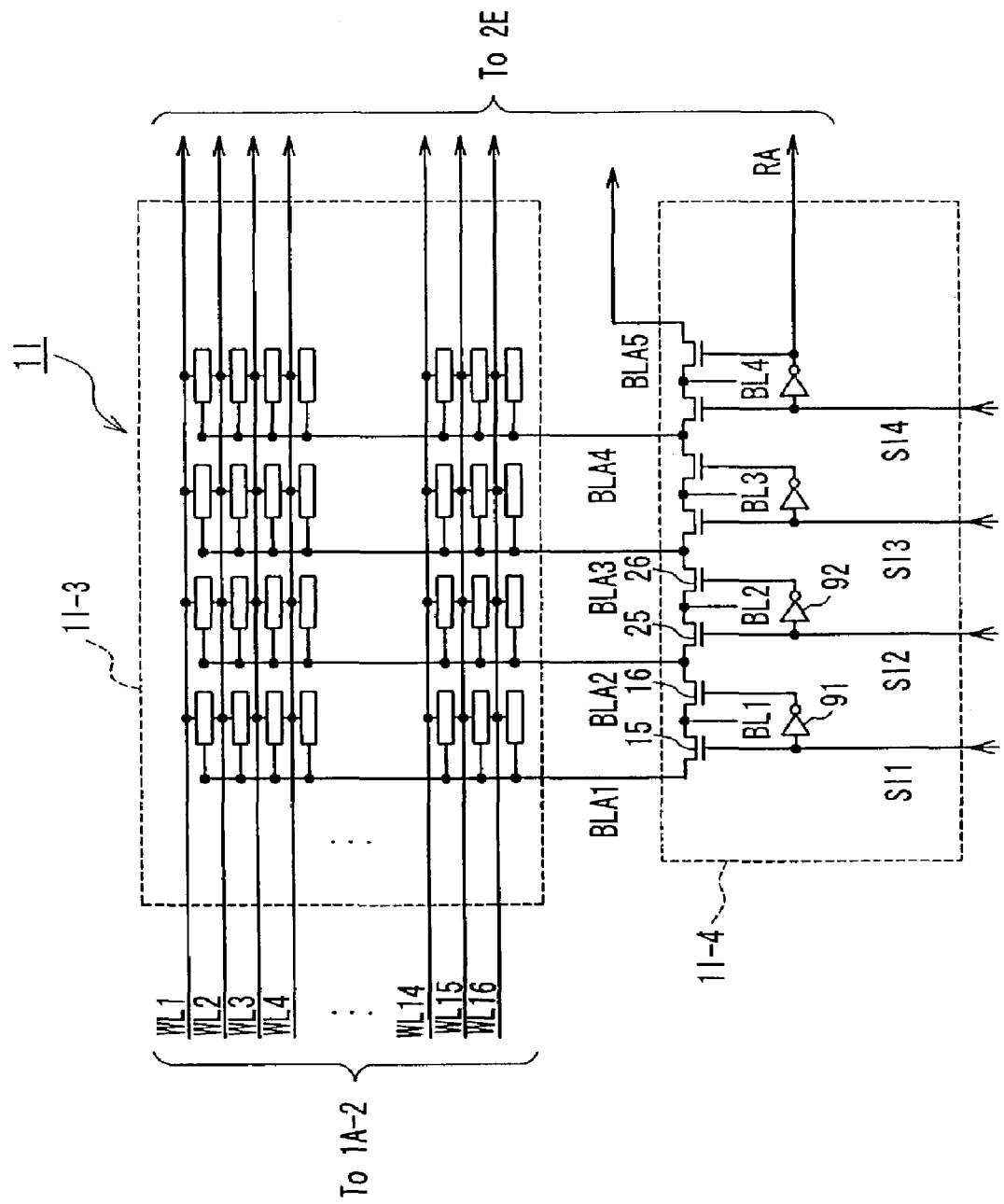
FIG. 33 is a circuit diagram showing a partial configuration of a fourth redundant circuit 1I-4 and a memory cell array 1I-3 in a memory macro 1I of FIG. 31.

FIG. 33 is a circuit diagram showing a partial configuration of a fourth redundant circuit 1I-4 and a memory cell array 1I-3 in the memory macro 1I. In FIG. 33, the fourth redundant circuit 1I-4 is connected to the redundant memory macro 2E via the redundant control signal lines SI1 to SI4, a redundant bit line BLA5, and a redundant signal line RA, and the memory cell array 1I-3 is connected to the fourth redundant circuit 1I-4 via second bit lines BLA1 to BLA4.

The memory macro 1F1 has 32 word lines. The memory macro 1H has 16 word lines and the memory macro 1I has 16 word lines.

Hereinafter, the operation of a semiconductor integrated circuit having this configuration will be described.

First, a case in which there is no defect in any of the memory macros 1F1, 1H and 1I and the redundant memory macro 2E is not used will be described.

First, a reset signal (RS) is input to the fourth redundant control circuit 2E-14 from an external circuit. At this time, when there is no defect anywhere in the memory macros 1F1, 1H and 1I, fuses are not broken, so that an output signal of logic "L" level is transmitted from an inverter 11 (see FIG. 26) in the shift fuse part 2F-3 in the fourth redundant control circuit 2E-14, and an output signal of logic "H" level of an inverter 13 is transmitted to the following shift fuse part 2F-3, and this is latched by an inverter 14.

Furthermore, an output signal of logic "L" level is transmitted from an inverter 211 in the macro select fuse part 2F-5 and is latched by inverters 213 and 214.

Therefore, the 64 shift signal lines S1 to S64 connected to the macro select circuit 2F-6 and the three macro select signal lines MS1, MS2 and MS3 are all turned to the logic "L" level. Consequently, signals from the NAND circuits 101, 111, 102, 112, . . . in the macro select circuit 2F-6, all of which are in the logic "H" level, are outputs to the redundant control signal lines SF1 to SF64, SH1 to SH58 and SI1 to SI4.

In response to the logic "L" level of the redundant control signal lines SF1 to SF64, SH1 to SH58 and SI1 to SI4, NMOS transistors 15 in the fourth redundant circuit 1F-4 in the memory macro 1F1, the fourth redundant circuit 1H-4 in the memory macro 1H and the fourth redundant circuit 1I-4 in the memory macro 1I are turned on, and inverters 91 output a logic "L" level, so that NMOS transistors 16 are turned off. Thus, a bit line BL1 is connected to a second bit line BLA1, and thereafter BL2 is connected to BLA2, and finally BL64 is connected to BLA64.

Next, this embodiment will be described by taking as an example the case where the second bit line BLA1 of the memory macro 1F1 is defective and there is no defect in the memory macros 1H and 1I.

When the second bit line BLA1 in the memory macro 1F1 is defective, the fuse 12 in the shift fuse part 2F-3 connected to the shift signal line S1 and a fuse 212 in the macro select fuse part 2F-5 (for the memory macro 1F1) connected to the macro select signal line MS1 are broken by a laser trimming device beforehand in the fourth redundant control circuit 2E-14 in the redundant memory macro 2E.

Then, a reset signal (RS) is input from an external circuit to the fourth redundant control circuit 2E-14, but since the fuse 12 is broken, an output signal of the logic "L" level is not transmitted from the inverter 11. Therefore, the logic "H" level is input to the inverter 13 via an NMOS transistor 17 and is latched in an inverter 14. Thus, the shift signal line S1 is in the logic "H" level. Thereafter, the logic "H" level is transmitted sequentially to the shift signal lines S2 to S64.

Furthermore, since the fuse 212 is broken, an output signal of the logic "L" level is not transmitted from the inverter 211. Therefore, the logic "H" level is input to the inverter 213 via an NMOS transistor 217 and is latched in an inverter 214. Thus, the macro select signal line MS1 is turned to be in the logic "H" level. At this time, the fuses in the macro select fuse parts 2F-5 for the memory macro 1H and 1I are not broken, so that the macro select signal lines MS2 and MS3 are turned to be in the logic "L" level.

In response to these signals, all the NAND circuits 101, 111, . . . connected to the macro select signal line MS1 in the macro select circuit 2F-6 output a logic "L" level. In other words, the NAND circuits that are connected to the shift fuse parts following the shift fuse part 2F-3 including the broken fuse due to defect repair of the NAND circuits connected to the macro select signal line MS1 in the macro select circuit 2F-6 output a logic "L" level.

On the other hand, since the macro select signal lines MS2 and MS3 are in a logic "L" level, all the NAND circuits connected to the macro select signal lines MS2 and MS3 output a logic "H" level.

In response to the logic "L" level of the redundant control signal lines SF1 to SF64, an NMOS transistor 15 in the fourth redundant circuit 1F-4 in the memory macro 1F1 is turned off and an inverter 91 outputs a logic "H" level, so that an NMOS transistor 16 is turned on. Thus, a bit lines BL1 is connected to a second bit line BLA2, and thereafter BL2 is connected to BLA3 and finally BL64 is connected to the redundant bit line BLA65.

In response to the logic "H" level of the redundant control signal lines SH1 to SH58, an NMOS transistor 15 in the fourth redundant circuit 1H-4 in memory macro 1H is turned on and an inverter 91 outputs a logic "L" level, so that an NMOS transistor 16 is turned off. Thus, bit line BL1 in the memory macro 1H is connected to a second bit line BLA1, and thereafter BL2 is connected to BLA2 and finally BL58 is connected to BLA58.

In response to the logic "H" level of the redundant control signal lines SI1 to SI4, an NMOS transistor 15 in the fourth redundant circuit 1I-4 in memory macro 1I1 is turned on and an inverter 91 outputs a logic "L" level, so that an NMOS transistor 16 is turned off. Thus, a bit lines BL1 in the memory macro 1I is connected to a second bit line BLA1, and thereafter BL2 is connected to BLA2 and finally BL4 is connected to BLA4.

In the fuse connection circuit 2E-7, in response to the logic "L" level of the macro select signal lines MS2 and MS3, a NOR circuit 123 outputs a logic "H" level so as to turn a NMOS transistor 122 on and turn a PMOS transistor 121 off. Thus, all of the 64 shift fuse parts 2F-3 in the redundant fuse part 2E-2 are connected.

When repairing one or both of the memory macros 1H and 1I, in response to at least one of the logic "H" levels of the macro select signal lines MS2 and MS3, the NOR circuit 123 outputs a logic "L" level so as to turn the NMOS transistor 122 off and turn the PMOS transistor 121 on. Thus, the 64 shift fuse parts 2F-3 in the redundant fuse part 2E-2 are divided electrically, and a signal to be input to the shift fuse parts 2F-3 for the memory macro 1I is reset to the logic "H" level.

This configuration makes it possible to share fuses for redundancy repair among a plurality of memory macros having different configurations and repair a plurality of memory macros of the plurality of memory macros having different configurations. Thus, the number of fuses can be reduced and the area efficiency can be improved.

As described above, the present invention can provide a semiconductor integrated circuit having excellent area efficiency and repair efficiency, a reduced number of fuses and a low cost by mounting a plurality of memory macros having different specifications or configurations and a redundant memory macro and sharing the redundant memory macro among the plurality of memory macros having different specifications or configurations.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor integrated circuit comprising:
a plurality of memory macros and a redundant memory macro for repairing the plurality of memory macros,
each of the plurality of memory macros comprising:
  a memory cell array connected to word lines and bit lines;
  a row decoder coupled to the memory cell array through the word lines; and
  a redundant circuit that has means for replacing a defective bit line of the memory cell array by an adjacent normal bit line or a redundant bit line and outputs defect information to a redundant signal line;
the redundant memory macro comprising:
  a redundant memory cell array connected to redundant word lines, provided internally to the redundant memory macro, and the redundant bit line;
  a first word line connection circuit that connects the word lines in a first memory macro of the plurality of memory macros to the redundant word lines in response to the defect information on the redundant signal line of the fist memory macro; and
  a second word line connection circuit that connects the word lines in a second memory macro of the plurality of memory macros to the redundant word lines in response to the defect information on the redundant signal line of the second memory macro,
wherein the redundant memory macro is connected to the first and the second memory macro via a first and a second set of signal lines, each set of signal lines including the corresponding memory macro word lines, redundant bit line, and redundant signal line, and at least one of the plurality of memory macros has a different number of word lines from the number of word lines of the other memory macros, and a word line that is not used in the redundant memory macro is connected to a ground potential.

2. The semiconductor integrated circuit according to claim 1, wherein the plurality of memory macros have different operation timing from each other.

3. The semiconductor integrated circuit according to claim 1, wherein the plurality of memory macros include both a synchronous memory macro and an asynchronous memory macro.

4. The semiconductor integrated circuit according to claim 1, wherein each of the plurality of memory macros is connected to the word lines and includes a row decoder for selecting either one of the word lines in response to an internal row address signal generated from an externally input address signal.

5. The semiconductor integrated circuit according to claim 1, wherein the redundant memory macro repairs any one of the plurality of memory macros.

6. The semiconductor integrated circuit according to claim 1, wherein the redundant memory macro repairs some of the plurality of memory macros together.

7. The semiconductor integrated circuit according to claim 1, wherein
the plurality of memory macros have a different number of word lines from each other, and a word line that is not used in the redundant memory macro is fixed to a ground potential, and
the redundant memory macro includes a redundant bit line connection circuit that connects or disconnects a redundant bit line connected to some memory macros which the word lines of the redundant memory macro are divided for and assigned to, based on the defect information of the redundant signal line so as to repair the some memory macros together.

8. The semiconductor integrated circuit according to claim 1, wherein
at least one of the plurality of memory macros has a different number of bit lines from the number of bit lines of the other memory macros, and
the redundant memory macro has a same number of redundant bit lines as that of a memory macro having a largest number of bit lines in a redundancy unit of the plurality of memory macros, and the number of redundant bit lines to be connected is changed depending on the memory macro.

9. The semiconductor integrated circuit according to claim 1, wherein
the redundant memory macro includes a second word line connection circuit that disconnects or connects the redundant word lines and divides or integrates the redundant memory cell array based on the defect information of the redundant signal line so as to repair all the memory macros that are connected.

10. A semiconductor integrated circuit comprising:
a plurality of memory macros and a redundant memory macro for repairing the plurality of memory macros,
each of the plurality of memory macros comprising:
  a memory cell array connected to word lines and bit lines;
  a row decoder coupled to the memory cell array through the word lines;
  a column decoder part that has a plurality of column decoders, each of which is connected to the memory cell array for every predetermined number of bit lines, selects a specific bit line of the predetermined number of bit lines based on a signal of an internal column address line generated from an externally input address signal and links input/output data to the selected bit line; and a redundant/input and output circuit tat couples input data to the column decoder part as the input/output data, based on a state of a write signal line, or couples output data to the column decoder part as the input/output data, based on a state of a read-out signal line, has means for replacing an input/output data line corresponding to a defective bit line of the memory cell array by an adjacent input/output data line or a redundant input/output data line, and outputs defect information to a redundant signal line, the redundant memory macro comprising:

a redundant memory cell array connected to redundant word lines, provided internally to the redundant memory macro, and a predetermined number of redundant bit lines;

a column decoder that selects a specific redundant bit line of the predetermined number of redundant bit lines based on a signal of a redundant column address line, and links input or output data of the redundant input /output data line to the selected redundant bit line based on a state of a redundant write signal line and a redundant read-out signal line;

a command connection circuit that connects an internal column address line, a write signal line, and a read-out signal line corresponding to a memory macro to be repaired to the redundant column address line, the redundant write signal line and the redundant read-out signal liner, respectively, and disconnects an internal column address line, a write signal line, and a read-out signal line corresponding to a normal memory macro from the redundant column address line, the redundant write signal line and the redundant read-out signal line, respectively, in response to the defect information of the redundant signal line;

a first word line connection circuit that connects the word lines in a first memory macro of the plurality of memory macros to the redundant word lines in response to the defect information on the redundant signal line of the first memory macro; and a second word line connection circuit that connects the word lines in a second memory macro of the plurality of memory macros to the redundant word lines in response to the defect information on the redundant signal line of the second memory macro, wherein the redundant memory macro is connected to the first and the second memory macro via a first and a second set of signal lines, each set of signal lines including the corresponding memory macro word lines, redundant bit line, and redundant signal line, and at least one of the plurality of memory macros has a different number of word lines from the number of word lines of the other memory macros. and a word line that is not used in the redundant memory macro is connected to a ground potential.

11. The semiconductor integrated circuit according to claim 10, wherein the plurality of memory macros have different operation timing from each other.

12. The semiconductor integrated circuit according to claim 10, wherein the plurality of memory macros include both a synchronous memory macro and an asynchronous memory macro.

13. The semiconductor integrated circuit according to claim 10, wherein each of the plurality of memory macros is connected to the word lines and includes a row decoder for selecting either one of the word lines in response to an internal row address signal generated from an externally input address signal.

14. The semiconductor integrated circuit according to claim 10, wherein the redundant memory macro repairs any one of the plurality of memory macros.

15. The semiconductor integrated circuit according to claim 10, wherein the redundant memory macro repairs some of the plurality of memory macros together.

16. The semiconductor integrated circuit according to claim 10, wherein the plurality of memory macros have a different number of word lines from each other, and a word line that is not used in the redundant memory macro is fixed to a ground potential and the redundant memory macro includes a redundant bit line connection circuit that connects or disconnects a redundant bit line connected to some memory macros which the word lines of the redundant memory macro are divided for and assigned to, based on the defect information of the redundant signal line so as to repair the some memory macros together.

17. The semiconductor integrated circuit according to claim 10, wherein at least one the plurality of memory macros has a different number of bit lines from the number of bit lines of the other memory macros, and the redundant memory macro has a same number of redundant bit lines as that of a memory macro having a largest number of bit lines in a redundancy unit of the plurality of memory macros, and the number of redundant bit lines to be connected is changed depending on the memory macro.

18. The semiconductor integrated circuit according to claim 10, wherein the redundant memory macro includes a second word line connection circuit that disconnects or connects the redundant word lines and divides or integrates the redundant memory cell array based on the defect information of the redundant signal line so as to repair all the memory macros that are connected.

* * * * *